United States Patent [19]

Tsuji et al.

[11] Patent Number: 5,424,552
[45] Date of Patent: Jun. 13, 1995

[54] PROJECTION EXPOSING APPARATUS

[75] Inventors: Toshihiko Tsuji, Kawasaki; Tetsuo Taniguchi, Yokohama; Yuji Imai, Tokyo; Mizutani Hideo, Yokohama, all of Japan

[73] Assignee: Nikon Corporation, Tokyo, Japan

[21] Appl. No.: 115,517

[22] Filed: Sep. 2, 1993

Related U.S. Application Data

[63] Continuation-in-part of Ser. No. 987,022, Dec. 7, 1992, abandoned, which is a continuation-in-part of Ser. No. 909,031, Jul. 6, 1992, abandoned.

[30] Foreign Application Priority Data

Jul. 9, 1991 [JP] Japan ................. 3-194930
Aug. 5, 1991 [JP] Japan ................. 3-195315
Dec. 10, 1991 [JP] Japan ................. 3-350069
Sep. 4, 1992 [JP] Japan ................. 4-237162

[51] Int. Cl.$^6$ ............................. G01N 21/86
[52] U.S. Cl. .......................... 250/548; 356/401
[58] Field of Search ............ 250/548, 561, 557; 356/399–401; 355/53–56

[56] References Cited

U.S. PATENT DOCUMENTS

| | | | |
|---|---|---|---|
| 4,558,949 | 12/1985 | Uehara et al. ................. | 250/561 |
| 4,629,313 | 12/1986 | Tanimoto ..................... | 355/54 |
| 4,650,983 | 3/1987 | Suwa ........................ | 250/204 |
| 4,666,273 | 5/1987 | Shimizu et al. ............... | 355/55 |
| 4,952,815 | 8/1990 | Nishi ........................ | 250/548 |
| 5,117,254 | 5/1992 | Kawashima et al. ............ | 355/55 |

FOREIGN PATENT DOCUMENTS

| | | |
|---|---|---|
| 57-212406 | 12/1982 | Japan . |
| 62-50811 | 10/1987 | Japan . |
| 63-291417 | 11/1988 | Japan . |
| 1-41962 | 9/1989 | Japan . |

*Primary Examiner*—David C. Nelms
*Assistant Examiner*—Stephone B. Allen
*Attorney, Agent, or Firm*—Shapiro and Shapiro

[57] ABSTRACT

A projection exposing apparatus for detecting a state of focus at two or more places in exposure region of a projection optical system by a focus state detection device. In accordance with the result of the detection of the focus state at the two or more places, the image forming characteristics of the projection optical system are measured by an image forming characteristics measuring device. A first pattern extending in the sagittal direction and a second pattern extending in the meridional direction are formed so that the focus state is measured by light beams transmitted these patterns and therefore the astigmatism, eccentricity or the spherical aberration is obtained so as to be corrected.

32 Claims, 24 Drawing Sheets

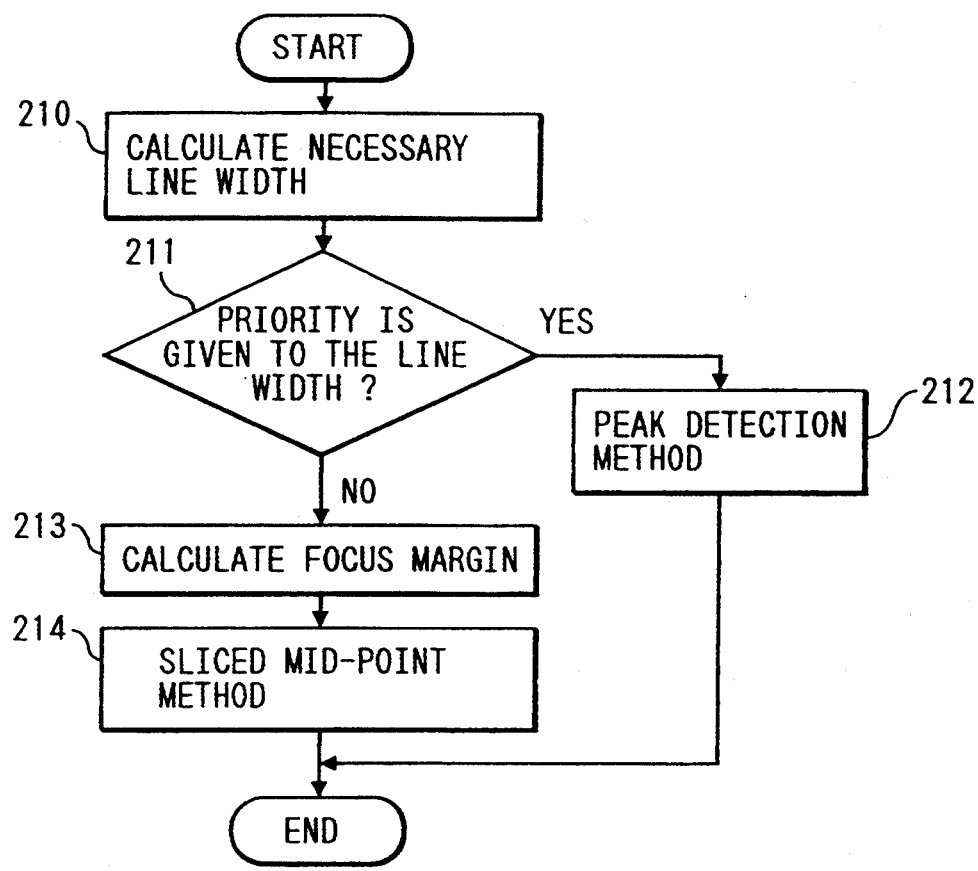

FIG. 33
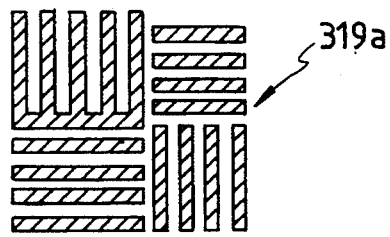
FIG. 34A
FIG. 34B
FIG. 34C
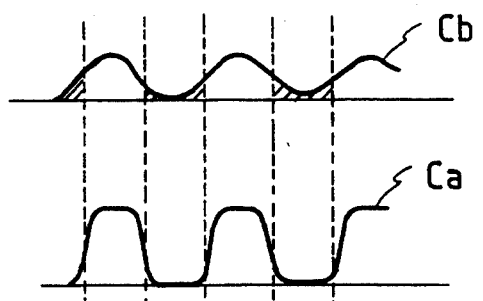
FIG. 35
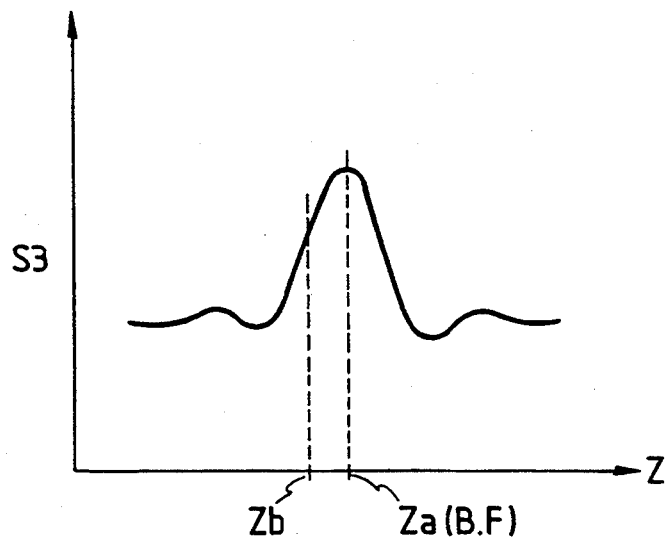

PROJECTION EXPOSING APPARATUS

This application is a Continuation-In-Part of U.S. Ser. No. 987,022, filed Dec. 7, 1992, (now abandoned), which is a Continuation-In-Part of U.S. Ser. No. 909,031, filed Jul. 6, 1992, (abandoned).

BACKGROUND OF THE INVENTION

1. Field of the Invention

The present invention relates to a projection exposing apparatus, and, more particularly to a projection exposing apparatus for manufacturing semiconductor integrated circuits or large-size liquid crystal substrates of a type having a mechanism for measuring the imaging characteristics of the projection optical system thereof.

2. Related Background Art

Technologies for correcting the projection optical system by measuring the imaging characteristics of the projection optical system in order to cause the formed mask pattern to be optimum have been disclosed in U.S. Pat. No. 4,629,313, Japanese Patent Laid-Open No. 63-306626 and U.S. Pat. No. 4,952,815.

The technology disclosed in U.S. Pat. No. 4,629,313 is arranged to use an apparatus comprising a test reticle having fine linear elements and a light receiving device disposed on the stage and receiving light passed through the test reticle through the fine reticle so that the characteristics of the projection optical system, for example, the inclination of the image surface or the curvature of field is obtained in accordance with change in an output signal from the light receiving device generated at the time of raising/lowering the stage along the Z-axis (the optical axial directional axis of the projection optical system). Thus, the imaging characteristics of the projection optical system are corrected in accordance with the result of the aforesaid measurement.

Each of the technologies disclosed in Japanese Patent Laid-Open No. 63-306626 and U.S. Pat. No. 4,952,815 is arranged to use an apparatus comprising a reference member having a reference mark and disposed on the stage and a test reticle having a special reference mark. By using the thus arranged structure, the reference member is irradiated with light from the lower surface and light beams, which have passed through the reference marks of the reference member and the test reticle, are received so that the imaging characteristics of the projection optical system are measured. The change in the imaging characteristics of the projection optical system taken place due to the rise of the temperature and the like caused from the absorption of exposing light is estimated so that the correction of the projection optical system is performed while estimating the change in the imaging characteristics which will be taken place at the time of the exposing operation in accordance with the result of the aforesaid estimation. With each of the aforesaid apparatus, the change in the imaging characteristics of the projection optical system, such as the inclination of the image surface or the curvature of field, taken place due to the thermal energy for use in the exposing operation can be corrected in real time.

However, the focal point position-detection by a through-the-lens method must use a reticle having a specific mark (a test reticle or an actual reticle which has a specific mark on the peripheral portion of the exposure region thereof). Therefore, the through put inevitably deteriorates because the test reticle is used at each measurement so as to measure the image forming characteristics and the image forming characteristics are corrected. What is worse, when the test reticle is used, the focus position at each pattern of the actual reticle cannot be measured immediately before the exposure. Therefore, the image forming characteristics of the projection optical system cannot be accurately detected immediately before the actual exposure.

Furthermore, the conventional apparatus encounters a problem in that the image forming characteristics cannot be measured in a state where the actual reticle is set thereto. Therefore, the change in the image forming characteristics of the projection optical system due to the change in the atmospheric pressure or the temperature during the exposure operation cannot be always accurately corrected. Therefore, in a case of the future 64M DRAM which must realize a line width of 0.3 to 0.4 $\mu$m, a satisfactory focusing accuracy cannot be realized by the correction of the image forming characteristics by the conventional estimation control method. In addition, the through put deteriorates because the test reticles must be set at each exchange of the wafer in order to correct the image forming characteristics such as the curvature of field or the inclination of the image surface so as to correct the projection optical system.

In addition, a fact has been known that the astigmatism, the eccentricity or the spherical aberration affect the image forming characteristics of the projection optical system as well as the affections of the aforesaid curvature of field and the inclination of the image surface. However, since the conventional apparatus does not measure the astigmatism, the eccentricity or the spherical aberration, there is a fear that a desired focusing characteristics cannot be obtained if the width of the lie is considerably thinned. Incidently, the astigmatism is the difference between the focal point position between the medional direction and the sagittal direction and which is caused from the astigmatism.

In a case where the image forming characteristics of the projection optical system are detected by using the actual reticle in place of the test reticle, the focus state can be measured by using the mark formed in the periphery of the exposure region. However, the focal point detection cannot be performed in the central portion of the exposure region. Therefore, the curvature of field, the inclination of the image surface or the astigmatism cannot be measured.

A method in which test printing is performed by using the test reticle before the commencement of the exposure and the image forming characteristics are corrected has been employed. However, the change in the image forming characteristics cannot be tackled and the through put deteriorates if the test printing is performed for each wafer.

Also, a focusing mechanism (auto-focus mechanism) for indirectly setting the current exposure shot region of a photosensitive substrate within a range of the focal depth of the imaging plane of a projection optical system is known. In this indirect method, a measurement means for measuring the height of a stage with respect to the projection optical system is separately arranged, and the origin of the measurement means is aligned with an in-focus point obtained in advance using the above-mentioned direct method. Then, the height of the exposure surface of the photosensitive substrate is detected using the measurement means, and the exposure surface is indirectly guided to the in-focus point. For example, Japanese Patent Publication No. 1-41962 or U.S. Pat.

No. 4,650,983 discloses, as an example of the measurement means for measuring the height of the stage, a mechanism for measuring the height of an exposure surface immediately below a projection optical system using an optical system of an oblique light incidence type fixed outside the projection optical system.

As a special example of the auto-focus mechanism, for example, Japanese Laid-Open Patent Application No. 57-212406 discloses a method for directly projecting an image of a special mark formed on a mask pattern surface onto the exposure surface of a photosensitive substrate, and detecting the projected image via a projection optical system and the mark, thereby directly discriminating an in-focus point.

Under such circumstances, recently, in the case of semiconductor memory devices requiring particularly high machining precision, a projection optical system using an i line of a wavelength of 365 nm, and having a focal depth of 1 μm or less is used. In this case, precision as high as 0.1 μm or less is normally required as an alignment precision of the in-focus point. For example, in a special projection exposure method utilizing an interference phenomenon of exposure light disclosed in Japanese Patent Publication No. 62-50811, a precision as very high as 0.05 μm or less is required.

However, when the in-focus point is to be detected using the above-mentioned indirect method, the origin of the measurement means is deviated from the actual in-focus point of the projection optical system due to a change in imaging characteristics of the projection optical system caused by an environmental change, the type of a mask (reticle) to be used, aging, or the like, and it often becomes difficult to obtain such high precision. More specifically, in, e.g., the early step of the exposure process, even when the origin is aligned as a false in-focus point of the measurement means for measuring the height of the stage is controlled to fall within the range of the focal depth of the in-focus point obtained by the direct method (disclosed in the above-mentioned U.S. Pat. No. 4,629,313 or U.S. Pat. No. 5,117,254), if the imaging characteristics of the projection optical system change due to a drift of the ambient atmospheric pressure or temperature of the projection optical system during a continuous use of a projection exposing apparatus, the origin may undesirably fall outside the range of the focal depth of the imaging plane of the projection optical system.

In this case, if calibrations of the origin of the measurement means are performed by the direct method every time a photosensitive substrate is replaced, the origin correction time is prolonged, and the throughput is decreased.

In this connection, a predictive control correction method for predicting a variation in imaging characteristics of the projection optical system due to, e.g., a temperature rise caused by absorption of exposure light, and correcting the origin of the measurement means on the basis of the prediction result may be proposed. However, even in such a correction operation based on predictive control, a sufficient focusing precision cannot be expected when the required line width approaches 0.1 μm like in, e.g., a 64-Mbit DRAM of the next generation. Recently, a projection exposing apparatus, such as an apparatus relating to manufacturing of semiconductors, must have an excellent image forming performance. Hitherto, an apparatus of the foregoing type has a projection optical system, the various aberrations of which have been precisely corrected, and which is mounted thereon. The check of the quantity of the aberration of the projection optical system has been usually performed by making use of a special mask. The foregoing special mask has an exclusive pattern for checking the aberration, the exclusive pattern being written thereon. The exclusive pattern is exposed to an experimental substrate, and then developed, the exposed pattern being then observed with a microscope or the like. As a result, the quantity of the aberration is checked. For example, checking of a spherical aberration is performed by obtaining a best focus position of different patterns having a plurality of line widths. Specifically, a stage is sequentially located in the direction of the optical axis, and the patterns having the plural line widths are exposed while sequentially moving, in the direction of the optical axis, an experimental substrate applied with a photosensitive agent, the exposed pattern being then developed. As a result, the patterns are formed on the substrate, the patterns having plural line widths which correspond to the distance from the projecting optical system in the direction of the optical axis. The line width of each of the patterns formed on the substrate and having the plural line widths is measured by making use of an electron microscope or the like. The actual dimensions of the measured line widths of the patterns and the distance from the optical axis of the projection optical system are plotted. If the middle point (an intermediate point between the maximum position of the substrate position at which a predetermined line width is maintained and the minimum position of the same) of the positions of the substrate at which a predetermined line width is maintained is determined to be the best focus, the best focus position of each line width is determined in accordance with the curve of plotted data. If a spherical aberration has taken place here, the best focus position of each line width can be displaced. The astigmatism can be checked by obtaining the difference in the best focus positions of the patterns formed in the different directions. Then, the comatic aberration can be checked by, for example, a method in which the difference between the line widths at the two ends of marks of plural, continuous and equal line widths.

By the foregoing methods, the respective aberrations are obtained to optimize the image forming characteristic of the projection optical system. For example, the intervals or the like of lens elements in the projection optical system are adjusted as to make finally each aberration to be lower than an allowable value. However, each aberration is not always constant but the same can be varied due to change in the temperature, change in the atmospheric pressure and a rise in the temperature of the projection optical system due to a fact that the projection optical system absorbs illumination light. In particular, the change of the temperature of the projection optical system occurring due to the absorption of illumination light causes the elements in the projection optical system to have a temperature distribution. As a result, an aberration change that cannot be ignored sometimes takes place. In the foregoing case, it is possible to check the quantity of aberration during the exposure operation by the foregoing method.

Accordingly, a method has been suggested which has an arrangement that the quantity of accumulation of exposure energy in the projection optical system is calculated, if the accumulation quantity is larger than a predetermined standard value, the exposure operation is temporarily stopped, and the exposure energy is not applied to the portion, the aberration of which has deteriorated. Specifically, the relationship between the quantity of aberration to be generated and the heating value to be accumulated in the projection optical system and the heat absorption characteristics of the projection optical system are previously obtained. At the time of an actual exposure operation, a numerical model of the previously obtained heat absorption characteristics, the mask permeability and a signal for opening/closing the shutter are used to calculate sequentially the heating value accumulated in the projection optical system as to perform calculations for the purpose of obtaining the quantity of the aberration generated. By temporarily stopping the exposure operation if the aberration quantity is larger than an allowable value, the heating value accumulated in the projection optical system is decayed, and also the aberration quantity is made smaller than the allowable value. Therefore, the exposure operation can be again performed. An exposure method of the foregoing type has been disclosed in, for example, Japanese Patent Application Laid-open No. 63-291417.

The foregoing conventional technology is able to obtain the aberration quantity as an estimated value and, accordingly, an actual quantity of the generated aberration cannot be obtained. In recent years, there has been suggested a technology for improving the resolving power by employing an annular illumination or an inclined illumination as disclosed in U.S. Ser. No. 791,138 in which the inclined light beams are applied from a plurality of directions. Further, a phase-shift mask as disclosed in Japanese Patent Publication No. 62-50811 has been disclosed. If the foregoing technology is employed, the distribution of the intensities of the illumination light beams in the projection optical system varies. Even if the illumination energy is the same, the quantity of the generated aberration becomes different depending upon the illumination conditions or a reticle. Therefore, it is difficult to predict the quantity of aberration to be generated. As a result, there arises a problem in that the conventional method of predicting the aberration quantity cannot be adapted to a desired exposure operation.

SUMMARY OF THE INVENTION

Accordingly, an object of the present invention is to measure the image forming characteristics such as the curvature of field, the inclination of the image surface and the mean focal point and the like of the projection optical system before the commencement of the exposure while maintaining excellent through put so as to correct the image forming characteristics of the projection optical system.

Another object of the present invention is to provide a projection exposing apparatus capable of preventing influences of the astigmatism, eccentricity or the spherical aberration, which has not been corrected in the conventional technology, on the image forming characteristics.

Still another object of the present invention is to provide a projection exposing apparatus, which can easily and quickly execute calibration of the origin of measurement means when a focusing operation is performed by the above-mentioned indirect method.

In order to achieve the aforesaid object, according to one aspect of the invention, there is provided a projection exposing apparatus for projecting and exposing a pattern formed on a pattern surface of a mask to the surface of a photosensitive substrate via a projection optical system, the projection exposing apparatus comprising: first illumination means for irradiating the mask with exposing light; stage means for holding the photosensitive substrate and capable of moving the photosensitive substrate in a direction of the optical axis of the projection optical system and in a direction perpendicular to the direction of the optical axis; a reference member disposed on the stage means while holding a conjugate positional relationship with the surface of the mask pattern with respect to the projection optical system; a light transmissible pattern formed on the surface of the reference member; second illumination means for irradiating the light transmissible pattern from the stage means side and causing light transmitted the light transmissible pattern to be incident on the mask via the projection optical system; photoelectric detection means for receiving light emitted from the second illumination means and reflected by the mask via the projection optical system and the light transmissible pattern; focus state detection means for detecting a focus state in response to a photoelectric signal transmitted from the photoelectric detection means when the stage means is moved in the direction of the optical axis of the projection optical system; and image forming characteristic measuring means for detecting the focus state by the focus state detection means at two or more positions in an exposure region of the projection optical system so as to measure image forming characteristics of the projection optical system in accordance with the results of the detections of the focus state at the two or more positions.

According to another aspect of the invention, there is provided a projection exposing apparatus for projecting and exposing a pattern formed on a pattern surface of the mask to the surface of a photosensitive substrate via a projection optical system, the projection exposing apparatus comprising: first illumination means for irradiating the mask with exposing light; stage means for holding the photosensitive substrate and capable of moving the photosensitive substrate in a direction of the optical axis of the projection optical system and in a direction perpendicular to the direction of the optical axis of the projection optical system; a reference member disposed on the stage means while holding a conjugate positional relationship with the surface of the mask pattern with respect to the projection optical system; a light transmissible pattern formed on the surface of the reference member and having a first lattice pattern having a periodicity in a sagittal direction and a second lattice pattern having a periodicity in a meridional direction in an exposure region of the projection optical system; second illumination means for irradiating the light transmissible pattern from the stage means side and causing light transmitted the light transmissible pattern to be incident on the mask via the projection optical system; photoelectric detection means for receiving light emitted from the second illumination means and reflected by the mask via the projection optical system and the light transmissible pattern; focus state detection means for detecting a focus state in response to a photoelectric signal transmitted from the photoelectric detection means when the stage means is moved in the direction of the optical axis of the projection optical system; and image forming characteristic measuring means for detecting the focus state by the focus state detection means in accordance with illumination light which passes through the first lattice pattern and detects the focus state by the focus state detection means in accordance with illumination light which passes through the second lattice pattern so as to measure image forming characteristics of the projection optical system in accordance with results of detections of the two focus states.

According to another aspect of the invention, there is provided a projection exposing apparatus for projecting and exposing a pattern formed on a pattern surface of a mask to the surface of a photosensitive substrate via projection optical system, the projection exposing apparatus comprising: first illumination means for irradiating the mask with exposing light; stage means for holding the photosensitive substrate and capable of moving the photosensitive substrate in a direction of the optical axis of the projection optical system and in a direction perpendicular to the direction of the optical axis of the projection optical axis; a reference member disposed on the stage means while holding a conjugate positional relationship with the surface of the mask pattern with respect to the projection optical system; two or more light transmissible patterns formed on the surface of the reference member; second illumination means for irradiating the light transmissible pattern from the stage means side with the exposing light or light having a wavelength substantially same as that of the exposing light and causing light transmitted a plurality of the light transmissible patterns to be incident on the mask via the projection optical system; photoelectric detection means for receiving light emitted from the second illumination means, reflected by the mask, and again transmitted the two or more light transmissible patterns via the projection optical system via the projection optical system so as to transmit a photoelectric signal which corresponds to each quantity of received light; focus state detection means for detecting a focus state at each position of the two or more light transmissible pattern in response to the photoelectric signal transmitted from the photoelectric detection means when the stage means is moved in the direction of the optical axis of the projection optical system; and image forming characteristic measuring means for measuring image forming characteristics of the projection optical system in accordance with each result of the detections of the focus state detected by the focus state detection means.

In accordance with the thus established principle, specific patterns (apertures) are formed, for example, at the central portion and four peripheral corners on the reference member which corresponds to an exposure field (the image field). Then, the reference member is moved to a portion below the projection optical system in such a manner that the center of the reference member substantially aligns to the optical axis of the projection optical system. Then, the Reference member is scanned for a predetermined distance in the direction of the optical axis of the projection optical system while measuring the interval between the projection optical system and the reference member by, for example, the diagonal incident type AF detection system. At this time, a signal transmitted from a photoelectric converter for individually transmitting signals corresponding to the light quantity obtained from respective specific patterns and the signal transmitted from the AF detection system are simultaneously sampled at a predetermined interval (for example, 0.02 μm or 10 msec). As a result, the signal which has been A/D converted is stored in a memory. Then, the level of the signal transmitted from the AF detection system when the signal transmitted from the photoelectric converter becomes the peak value is obtained. The aforesaid process is performed for each of the specific pattern, so that the image forming characteristics such as the curvature of field and the inclination of the image surface of the projection optical system can be obtained. When the level of the signals obtainable from the AF detection system at the time when the photoelectric signal obtained from each specific pattern shows the peak value is averaged, the mean focal point position can be obtained. Then, the image forming characteristics are corrected in accordance with the result.

As described above, according to the present invention, the mean image surface position, the curvature of field, the inclination of the image surface and the astigmatism can be obtained by only one scanning operation of the reference member in the direction of the optical axis of the projection optical system in a state where the actual mask pattern is set while eliminating the necessity of using the specific mark for the reticle. Therefore, the image forming characteristics of the projection optical system can be measured at high speed. Furthermore, the image forming characteristics correction means so corrects the change in the image forming characteristics, so that excellent image forming characteristics can be maintained.

Other and further objects, features and advantages of the invention will be appear more fully from the following description.

According to another aspect of the present invention, an exposing apparatus for transferring a mask pattern onto a photosensitive substrate on a stage via a projection optical system, comprises a reference pattern arranged in substantially the same plane as a photosensitive surface of the photosensitive substrate, illumination means for illuminating the reference pattern with illumination light having a wavelength equal to or near the wavelength of the exposure light from the under surface of the reference pattern, focus state detection means for receiving light, which is transmitted through the reference pattern, is radiated onto a pattern surface of a mask via the projection optical system, is reflected by the pattern surface, and returns via the projection optical system and the reference pattern, and outputting a first detection signal S1 representing a focus state of the reference pattern, position detection means for obtaining a second detection signal S2, which changes according to the position of the projection optical system in an optical axis direction, using light fixed with respect to the projection optical system, focusing means for aligning the stage in the optical axis direction of the projection optical system so that the second detection signal S2 has a predetermined pseudo in-focus level, and calibration means for adjusting an offset of the second detection signal S2 or the false in-focus level on the basis of the first detection signal S1 obtained when the stage is moved in the optical axis direction of the projection optical system.

Another object of the present invention is to provide an apparatus capable of measuring an actual aberration quantity and adaptable to change in the image forming characteristics.

According to another aspect of the present invention, there is provided a projection exposing apparatus for projecting and exposing a pattern formed on a mask to the surface of a photosensitive substrate with exposing light through a projection optical system, said projection exposing apparatus comprising: stage means for holding said photosensitive substrate and capable of moving said photosensitive substrate in a direction of the optical axis of said projection optical system and in a direction perpendicular to said direction of said optical axis; a reference number disposed on said stage means and adapted on the basis of a position conjugate to the surface of said mask pattern with respect to said projection optical system; a light transmissible pattern formed on the surface of said reference member; illumination means for irradiating said light transmissible pattern from said stage means side and causing light transmitted said light transmissible pattern to be incident on said mask through said projection optical system; photoelectric detection means for receiving light emitted from said illumination means and reflected by said mask through said projection optical system and said light transmissible pattern, and outputting photoelectric signal according to the position of said stage in said direction of said optical axis, and aberration quantity detection means for obtaining the aberration quantity of said projection optical system in accordance with information about the waveform of said photoelectric signal.

The foregoing structure enables the quantity of aberration to be obtained by using the waveform of the photoelectric signal supplied from the photoelectric detection means. Therefore, the necessities of performing the exposure to an experimental substrate, the development and the measurement can be eliminated. Further, an exclusive pattern to be formed on the mask can be omitted. As a result, the change of the aberration quantity can be sequentially known at an actual measurement. Hence, a problem that a defective product is manufactured because the exposure is performed though the aberration is generated can be overcome.

That is, since the actual aberration quantity can be measured, the exposure can be performed in a state where the aberration has been corrected. Further, the exposure operation can be performed in accordance with the aberration.

Since the actual aberration quantity can be measured, exposure corresponding to the generated aberration can be performed even if the aberration quantity to be generated cannot be predicted such as a case of the phase shift reticle or the plural and inclined illumination or the like.

BRIEF DESCRIPTION OF THE DRAWINGS

FIG. 30 is a flow chart showing an operation executed when a peak detection method and a sliced mid-point method are selectively used.

FIG. 33 is a view showing an aperture pattern formed in a standard-pattern plate of the apparatus shown in FIG. 32;

FIGS. 34A, 34B and 34C illustrate a principle of obtaining the focus position by making use of the aperture pattern shown in FIG. 33;

FIG. 35 is a graph showing the relationship between an output signal supplied from a photoelectric conversion device 326 and Z-position of the aperture pattern;

DESCRIPTION OF THE PREFERRED EMBODIMENTS

Figure 1:
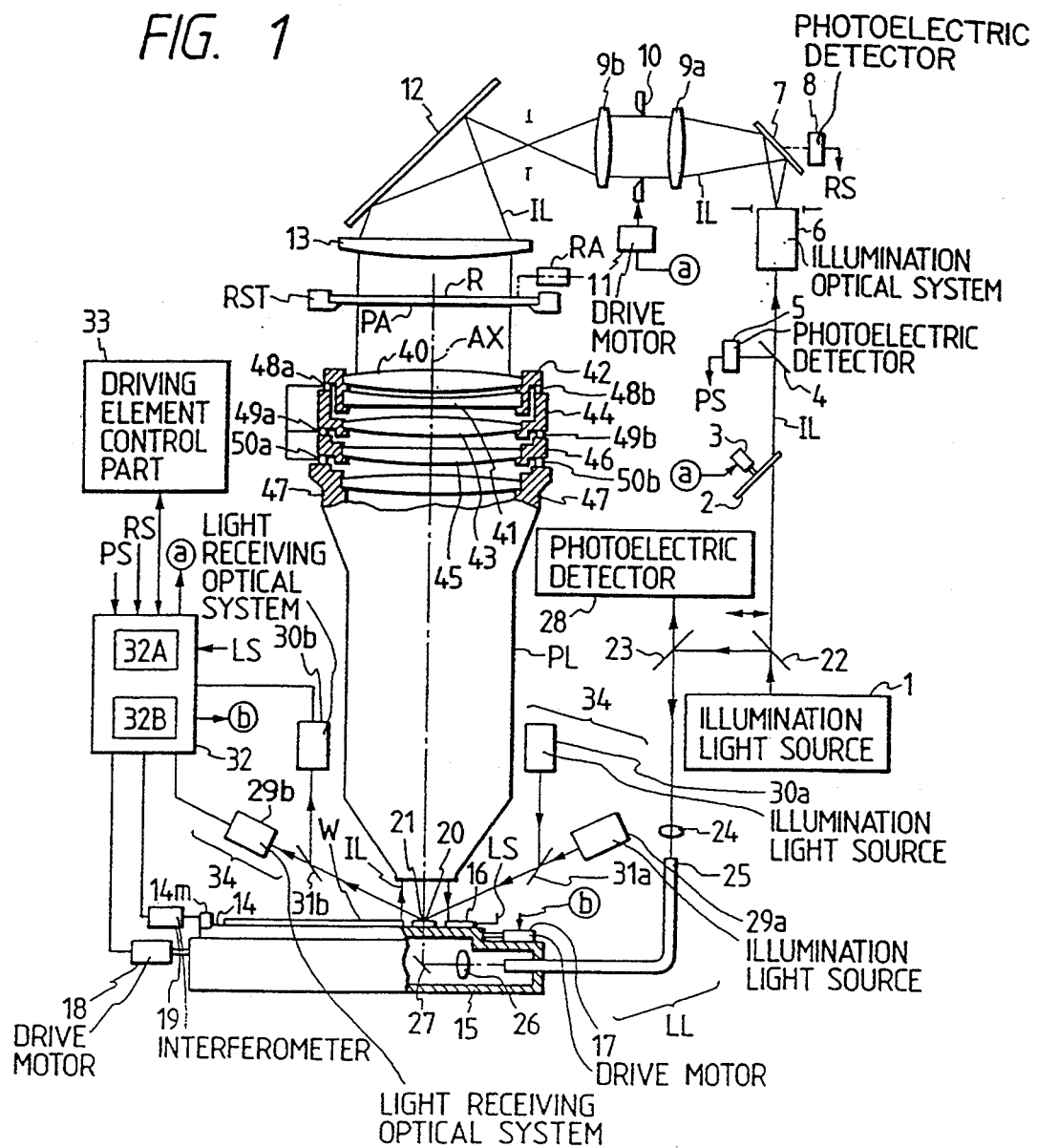
FIG. 1 is a plan view which illustrates the overall structure of a first embodiment of a projection apparatus according to the present invention.

Preferred embodiments of the present invention will now be described. FIG. 1 illustrates a plan view which illustrates the schematic structure of an embodiment of a projection exposing apparatus according to the present invention. Referring to FIG. 1, an exposing illumination light source 1 comprising an extra-high pressure mercury lamp or an eximar laser beam source generates illumination light IL such as g-rays, i-rays or ultraviolet pulse light (for example, KrF eximar laser) having a wave length (exposing wave length) whereby the resist layer can be sensitized. The illumination light IL passes through a shutter 2 for opening/shutting the optical path through which the illumination light IL passes and a semi-transmissible mirror 4 which transmits a major portion (90% or more) of the illumination light IL to. Then, the illumination light IL reaches an illumination optical system 6 including an optical integrator (fly eye lens) or the like. In a normal state (at the exposing operation), a mirror 22 is retracted from the optical path at this time and is moved on the optical axis by a motor or air pressure only when the imaging characteristics of a projection optical system PL are measured as described later.

The shutter 2 is so operated by a driving portion 3 that the transmission and shutting the illumination light IL. A portion of the illumination light IL reflected by the semi-transmissive mirror 4 is incident on a photoelectric detector (a power monitor) 5 such as a PIN photodiode. The power monitor 5 photoelectrically detects the illumination light IL so as to transmit information about light (the intensity) PS to a main control system 32. The light information PS is used as the basic data when the quantity of change in the imaging characteristics of the projection optical system PL during the exposing operation is obtained by the main control system 32 in a manner to be described later.

The illumination light IL is subjected to the beam uniforming operation and spectrum lowering/reducing operation in the illumination optical system 6, and then the illumination light IL is so reflected by a mirror 7 to reach relay lenses 9a, 9b and a variable blind 10. The illumination light IL, which has passed through the variable blind 10, is vertically downwards reflected by a mirror 12 so that the illumination light IL reaches a main condenser lens 13. Thus, a pattern region PA of a reticle R is irradiated with the illumination light IL with a uniform illuminance. Since the surface of the variable blind 10 has an image forming relationship with the reticle R, the illumination field of the reticle R can be arbitrarily selected by changing the position and the shape of the aperture by opening/closing the movable blade which constitute the variable blind 10. This embodiment is so arranged that light reflected by wafer W when the wafer W is irradiated with the illumination light IL passes through the mirror 7 and the illumination light IL is incident on a photoelectric detector (a reflected light quantity monitor) 8. The reflected light quantity monitor 8 photoelectrically detects the reflected light so as to transmit the light information (intensity) RS. The light information is then incident on the main control system 32. Incidently, the light information RS is used as the basic data when the quantity of change in the imaging characteristics of the projection optical system PL during the exposing operation is obtained in a manner to be described later.

The reticle R is mounted on a reticle stage RST which can be two-dimensionally moved on a plane perpendicular to optical axis AX of the projection optical system PL. The reticle stage RST is moved in order to locate the reticle R in such a manner that the central point of the pattern region PA of the reticle R aligns to the optical axis AX of the projection optical system PL. The initial position setting of the reticle R is performed by slightly moving the reticle stage RST in response to a mark detection signal supplied from a reticle alignment system RA for photoelectrically detecting an alignment mark (omitted from illustration) located in the periphery of the reticle R. Incidently, the reticle R is exchanged arbitrarily by a reticle exchanger (omitted from illustration). In particular, the exchange is frequently performed in a case where a multiplicity of kinds of products are manufactured by a small quantity.

The illumination light IL, which has passed through the pattern region PA, is incident on the projection optical system PL arranged to be telecentric on the two sides thereof. The projection optical system PL projects (forms) an image of a circuit pattern on a certain shot region on the wafer W having the resist layer formed thereon in such a manner that the projected image superposes on the shot region. The wafer W is placed on a levelling stage (omitted from illustration) which is disposed on a Z-stage 14 which can be slightly moved in the direction of the optical axis (in the direction Z) by a drive motor 17. The Z-stage 14 is placed on an XY stage 15 which can be two-dimensionally moved by a step-and-repeat method. When the transference and exposure of the reticle R to the one shot region on the wafer W has been completed, the XY stage 15 is moved until the next shot region on the wafer W aligns to the exposure region of the projection optical system PL. The two-dimensional position of the XY stage is always detected by interference meters 19 at a resolution of, for example, about 0.01 $\mu$m. Therefore, movement mirrors 14m for reflecting laser beams emitted from the interference meters 19 are secured at the two end portions of the Z-stage 14. As described above, a pair of the interference meters 19 and the movement mirrors 14m is composed so as to detection the X-directional and Y-directional positions.

Furthermore, an illumination quantity monitor 16 is disposed on the Z-stage 14. The illumination quantity monitor 16 is composed of, for example, a photoelectric detector having a light receiving surface, the area of which is substantially the same as that of the image field of the projection optical system PL or the projection region of the reticle pattern. The illumination quantity monitor 16 is so disposed on the Z-state 14 that the light receiving surface substantially aligns to the surface of the wafer W. Information LS about the illumination quantity of the shot region obtained from the illumination quantity monitor 16 is supplied to the main control system 32 so as to be the basic data for use when the quantity of change in the imaging characteristics of the projection optical system PL during the exposing operation is obtained in a manner to be described later.

Figure 2A:
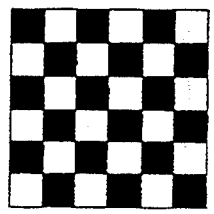
FIGS. 2A and 2B illustrate aperture patterns according to the first embodiment of the present invention.
Figure 2B:
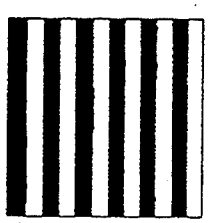
Figure 3:
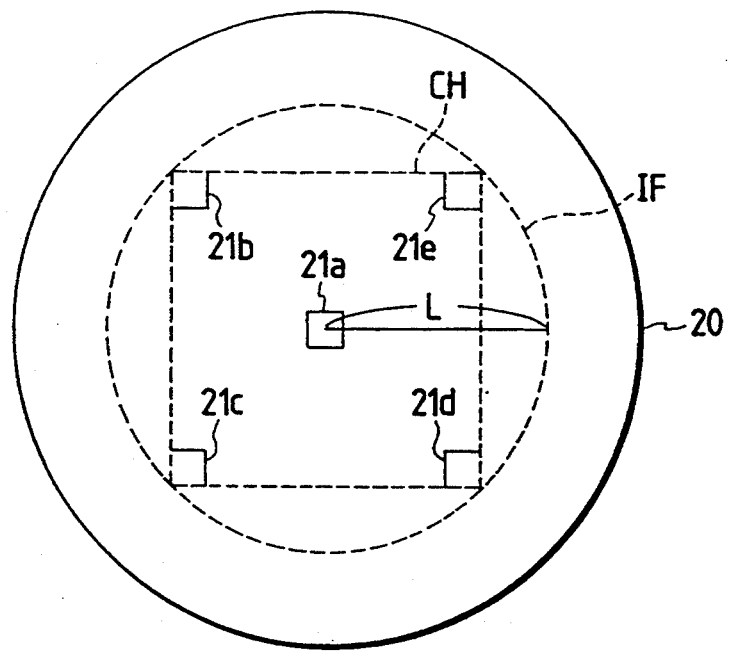
FIG. 3 illustrates positions of the apertures on a reference member which correspond to the exposure region according to the first embodiment of the present invention.

Furthermore, a reference member 20 is disposed on the Z-stage 14, the reference member 20 being used when the imaging characteristics of the projection optical system PL, for example, the position of the focal point, the curvature of field, the inclination of the image surface and the astigmatism. FIG. 3 illustrates the reference member 20. Referring to FIG. 3, a circle, the diameter of which is L, shows the maximum exposure region (image field) IF of the projection optical system PL, while a square inscribed in the circle shows maximum square chip region CH when the exposure to the wafer is actually performed. As shown in FIG. 3, apertures 21a to 21e are formed at positions which correspond to the central portion of the image field IF on the surface of the reference member 20 and four peripheral positions of the same. The apertures 21a to 21e has a diced pattern arranged, for example, as shown in FIG. 2A or a lattice pattern arranged, for example, as shown in FIG. 2B. Incidentally, the surface of the reference member 20 and that of the wafer W substantially coincide with each other. The shape of the pattern (the pattern of the aperture) formed in the aperture 21 must be so selected that the projected image of the pattern does not completely superpose on the circuit pattern on the reticle R. The reason for this lies in that, if the projected image of the aperture pattern completely superposes on the circuit pattern, the position at which the maximal or the minimal value of the change (to be described later) in the quantity of light transmitted through the aperture 21 and reflected by the reticle R is obtained is not always the focus position.

By employing the diced pattern arranged as shown in FIG. 2A as the aperture pattern, the influence of the aforesaid circuit pattern can be reduced and as well as the influence of the astigmatism of the projection optical system can be eliminated. The lattice pattern arranged as shown in FIG. 2B is also effective to prevent the influence of the circuit pattern if the side of this pattern is inclined by about 10° to 30° from the side of the circuit pattern. The reason for this lies in that the circuit patterns for use to manufacture the semiconductors are mainly formed into a pattern composed of longitudinal and lateral components arranged perpendicularly (0° and 90°). Furthermore, it is preferable that the shape of the aperture pattern be formed into a plurality of parallel lines which do not run parallel to any one of the lines of the circuit pattern. In order to as well as eliminate the influence of the astigmatism of the projection optical system, it is preferable that the two groups of the parallel lines run parallel to each other. Furthermore, it is preferable that the ratio of the area of the light shielding portion of the aperture pattern and that of the transmissive portion be 1:1 in order to obtain the best SN ratio. In the description to be made hereinafter, the apertures 21a to 21e are collectively called "apertures 21".

Usually, three apertures 21 must be formed in a case where a plain face such as the inclination of the image surface is obtained, while four apertures 21 composed of the central point added to the aforesaid three points must be formed in a case where the curvature of field is obtained. However, five apertures 21 are formed according to this embodiment in order to cope with, for example, a case where the projection optical system is asymmetric or a case where eccentricity is present. By forming a plurality of the apertures 21 to perform the measurement at larger number of points, further large quantity of information such as the waviness of the image surface can be obtained. However, the more the apertures 21 becomes, the more the through put becomes complicated. Therefore, the four peripheral apertures are located in the region of the reference member 20 which corresponds to the maximum chip region CH in such a manner that the required five apertures are selected which are composed of the four apertures (21c to 21e) positioned farthest from the central position of the reference member 20 and the central point (21a) of the image field. That is, the maximum value of the curvature of field is enabled to be measured, and as well as a satisfactory through put is realized while maintaining the reliability in detecting the incline of the image surface and the focal plane. Furthermore, by minimizing the number of the apertures 21, the apparatus can be simplified. According to this embodiment, apertures 21c to 21e are formed at the four corners of the maximum chip region CH on the reference member 20 while taking the fact into consideration that the optical aberration such as the curvature of field usually becomes maximum between the optical axis AX of the projection optical system PL and the outermost portion of the image field IF.

As shown in FIG. 1, the apertures 21 shown in FIG. 1 are irradiated with light by a measuring illumination system LL from the downward direction (from the stage portion). The measuring illumination system LL is composed of a mirror 22 arranged to be inserted into the optical path of the illumination light IL by a drive device (omitted from illustration), a half mirror 23, a lens 24, an optical fiber 25, a lens 26, and a mirror 27, so that the illumination light IL is introduced into an wafer stage 15. The illumination light IL emitted through the aperture 21 reaches the reticle R via the projection optical system PL, and it is reflected by the reverse side (the side on which the pattern is formed). Then, light is returned to the aperture 21 via the projection optical system PL. The reflected light passes through the aperture 21 before it is incident on a photoelectric detector 28 composed of a photomultiplier or an SPD, so that it is photoelectrically converted into an electric signal to be transmitted. Although the illustration is omitted, the five apertures 21a to 21e are individually irradiated with the measuring illumination system LL, while the photoelectric detector 28 receives the respective reflected light beams. An arrangement may be employed in which the entire surface of the reverse side of the aperture 21 is irradiated with light and as well as the photoelectric detector 28 receives each of light beams reflected by the five apertures 21a to 21e.

Another arrangement may be employed in which the entire surface of the reverse side of the reference member is irradiated, a variable stop is disposed between the reference member 20 and the end surface of the fiber 25 so that the variable stop is operated at the time of detecting the position of the focal point at each of the aperture patterns and therefore only the desired aperture is irradiated with the illumination light IL. Another embodiment may be employed in which the variable stop is omitted, the entire surface of the reverse side of the reference member is irradiated with light, a signal transmitted from the photoelectric detector 28 is electrically masked, and therefore only the signal which corresponds to reflected light from a desired aperture is processed. That is, only one pair composed of the illumination system and the light receiving system is prepared and the aperture portion is moved in a time sequential manner so that the measurement is performed. As a result of the thus made arrangement, the apparatus can be simplified because only one pair composed of the illumination system and the photoelectric detector is sufficient to perform the desired measurement.

Although the illumination light IL is introduced from the light source 1 to the reference member 20 via the mirror 22, the reference member 20 may be irradiated with light in another way so arranged that a light source for emitting light of a wavelength which is substantially the same as the illumination light IL emitted from the light source 1 is independently disposed.

Referring to FIG. 1, reference numeral 34 represents a diagonal-incident type detection optical system of a type disclosed in, for example, U.S. Pat. No. 4,558,949. The diagonal-incident type detection optical system is constituted by combining a focal point detection system 29 for detecting the focus state of the wafer W and the projection optical system PL by detecting the vertical position (the Z directional position) of the surface of the wafer with respect to the best image-forming surface of the projection optical system PL and a horizontal position detection system for detecting the inclination of the surface of the wafer W with respect to the designed image forming surface on the wafer W in a predetermined region.

The focal point detection system 29 and the horizontal position detection system 30 are composed of light sources 29a and 30a for emitting illumination light to be incident on the surface of the wafer W diagonally with respect to the optical axis AX, light receiving optical systems 29b and 30b for receiving light reflected by the surface of the wafer W, and a half mirror 31b. The illumination light emitted from the light source 29a is an image-forming beam for forming the image of a pinhole or a slit, while illumination light emitted from the light source 30a is parallel beams. In the structure according to this embodiment, the designed best image-forming surface is made while using the zero point to be the reference by adjusting the angle of a parallel flat glass (plane parallel) previously included in the light receiving optical system 29b so as to calibrate the focal point detection system 29 and as well as the calibration of the horizontal position detection system is so performed that the parallel beams emitted from the light source 30a are converged at the central position of a four-piece light receiving device (omitted from illustration) included in the light receiving optical system 30b when the surface of the wafer W aligns to the image forming surface.

Then, a correction means for correcting the image forming state will now be described. This embodiment is so arranged that lens elements of the projection optical system PL are driven so that the image forming characteristics (the magnification of the projection, the distortion, the curvature of field, and the astigmatism and the like) are corrected. A portion of the optical elements can be moved in order to adjust the imaging characteristics of the projection optical system PL. As shown in FIG. 1, lens elements lens elements 40 and 41 of a first group are secured by a supporting member 42, a lens element 43 of a second group is secured by a supporting member 44, and a lens element 45 of a third group is secured by a supporting member 46. Furthermore, lens elements disposed below the lens element 45 are secured by a lens parallel portion 47 of the projection optical system PL.

Figure 4:
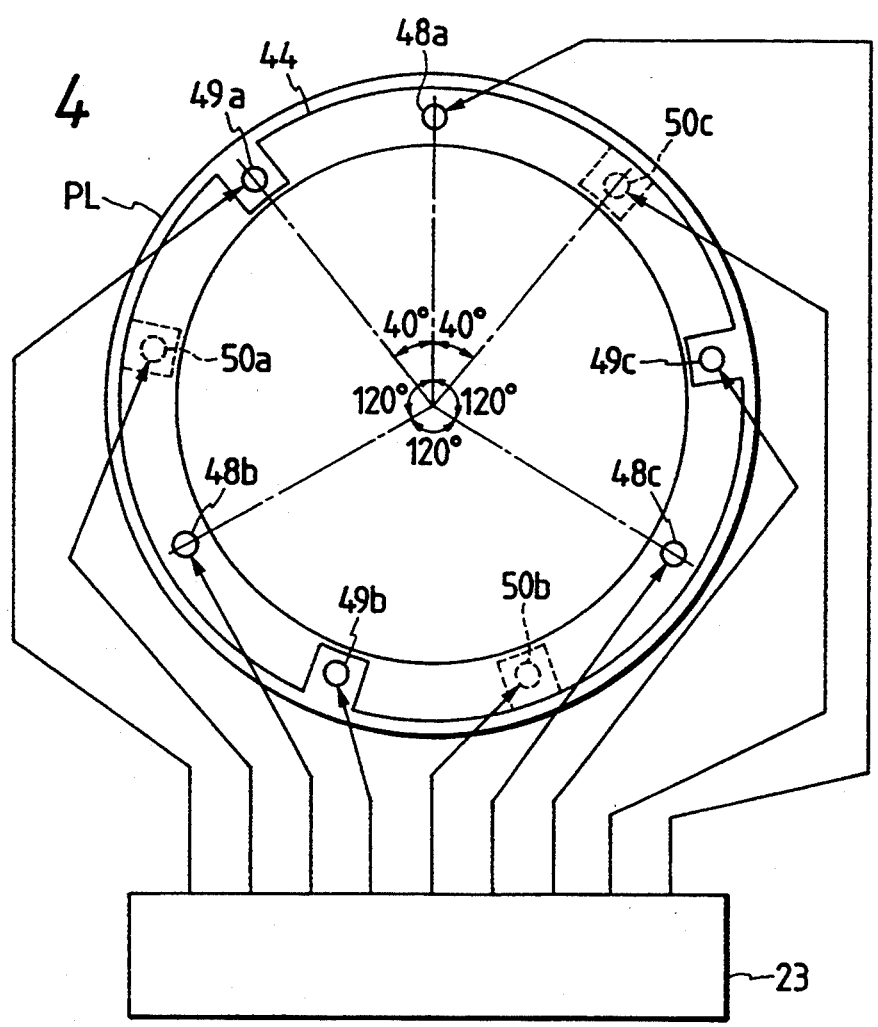
FIG. 4 is a top view which illustrates a projection optical system PL.

FIG. 4 is a view which illustrates the projection optical system PL from an upper portion (from the portion adjacent to the reticle R). Driving elements 48a to 48c are equally disposed at angular intervals of 120° and are arranged to be independently controlled by a driving element control portion 23. Similarly, driving elements 49a to 49c and 50a to 50c are equally spaced at angular intervals of 120°. The driving elements 48a, 49a and 50a are disposed away from each other by an angular degree of 40°, and similarly 48b, 49b and 50b, and 48c, 49c and 50c are disposed away from each other by the same angular degree The driving elements comprise, for example, electrostrictive element or magnetostrictive elements and arranged to be displaced by a predetermined quantity which corresponds to the voltage or the magnetic field supplied thereto. Furthermore, a position detector such as a capacity type displacement sensor or a differential transformer or the like (omitted from illustration) is disposed adjacent to the driving elements. As a result, the position of the driving element which corresponds to the voltage or the magnetic field applied to the same can be monitored, so that they can be driven accurately.

The term "optical axis AX" of the projection optical system PL used in this embodiment is meant the optical axis of the lens element secured to the lens barrel portion 47. Incidentally, the supporting member 6 is connected to the lens barrel portion 47 of the projection optical system PL by the telescopic driving elements 50a, 50b and 50c (see FIG. 4). Furthermore, the supporting member 44 is connected to the supporting member 46 by the telescopic driving elements 49a, 49b and 49c (see FIG. 4). In addition, the supporting member 42 is connected to the supporting member 44 by the telescopic driving elements 48a, 48b and 48c (see FIG. 4). In this embodiment, the aforesaid driving elements are controlled by a driving element control portion 33 so that the lens elements (40, 41), 43 and 45 disposed adjacent to the reticle R are individually moved. The aforesaid elements each of which has the magnification, the distortion, the curvature of field, the inclination of the image surface, the focal position and the astigmatism and the like which considerably affect the characteristics and which can be easily controlled are selected. Furthermore, this embodiment is so arranged that the movable lens elements are disposed to form three groups. Therefore, the movable range of the lens elements can be widened while preventing the change in the other aberrations and as well as the structure according to this embodiment is able to cope with a variety of distortions of the shape (trapezoidal, rhomboid, barrel-type, bobbin type distortions), curvature of field and astigmatism. Therefore, even if the temperature of the projection optical system PL is undesirably raised due to the absorption of the exposing light and therefore the image forming characteristics are changed, the arrangement of the present invention is able to realize the desired effect. Incidentally, the lens element must be moved in a range in which the influence of the projection optical system PL upon the other aberrations (for example, the astigmatism, the spherical aberration and the like), which cannot be corrected by the arrangement of this embodiment, can be neglected. As an alternative to this, a method may be employed which is arranged in such a manner that the mutual distance between the lens elements is adjusted as described above, so that the other aberrations (the magnification, the distortion and the like) are corrected while controlling the curvature of field.

As a result of the structure thus arranged, the three peripheral positions of the three groups of the lens elements (40, 41), 43 and 45 can be independently moved by a quantity which corresponds to the command of movement issued from the main control system 32 along the optical axis AX of the projection optical system PL. As a result, the three groups of the lens elements (40, 41), 43 and 45 can be individually moved in parallel to each other along the optical axis AX and as well as they can be inclined arbitrarily with respect to a plane perpendicular to the optical axis AX. Incidentally, the aforesaid lens elements are inclined while making the optical axis AX as an imaginary reference of the inclination, and the lens elements (40, 41), 43 and 45 can be moved in a plane which is substantially perpendicular to the optical axis AX.

The main control system 32 has a focus position detection portion 32A and image forming characteristics detection portion 32B to be described later so as to obtain the image forming characteristics of the projection optical system PL such as the curvature of field, the inclination of the image surface, and the means focal position and the like. The main control system 32 receives information about light from the power monitor 5, the reflection monitor 8 and the irradiation quantity monitor 16 so as to calculate the quantity of the change in the image forming characteristics of the projection optical system PL during the exposure operation and as well as the main control system 32 controls the overall operation of the driving element control portion 33.

Then, the method of measuring the image forming characteristics, such as the curvature of field, the inclination of the image surface and the astigmatism, of the projection optical system PL according to this embodiment will now be described. The XY-stage 15 is so moved by a motor 18 that the center of the aperture 21a on the reference member 20 is positioned on the optical axis AX of the projection optical system while monitoring the position of the XY-stage by the interference meter 19 in a state where the reticle R is placed on the reticle stage RST. Simultaneously, the motor 17 is rotated so as to lower or raise the Z-stage 14 by a quantity which is several times the estimated quantity of the displacement of the focal point (the quantity of the change in the image forming characteristics) from a position which is considered to be the best position of the focal point (the best image-forming surface) of the projection optical system PL. It may be lowered or raised by a degree by about two times (2·DOF) the focal depth (±DOF).

Figure 5:
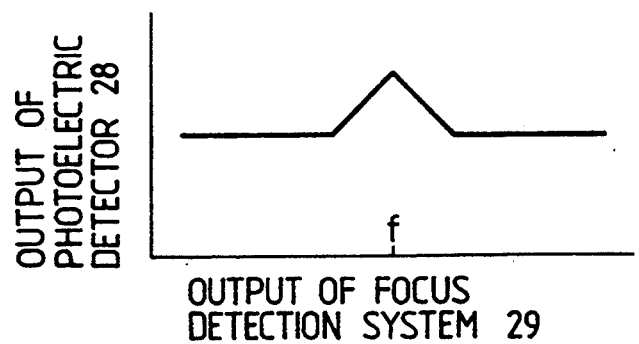
FIG. 5 is a graph which illustrates the relationship between the output from a focal point detection system 29 and that from a photoelectric detector 28.

Simultaneously, the mirror 22 is introduced into the optical path so as to introduce the illumination light IL into the aperture 21. As a result, the reverse side (the surface on which the pattern is formed) of the reticle R is irradiated with light via the specific pattern of the aperture 21 and the projection optical system PL. The illumination light reflected by the surface of the reticle R again passes through the projection optical system PL and the aperture 21. Then, it is incident on the photoelectric detector 28 via the mirror 27, the lens 26, the optical fiber 25, the lens 24 and the half mirror 23. Then, the Z-stage 14 is upwards (or downwards) subjected to scanning by about two times an estimated quantity (for example, 2·DOF) of the change in the focal point. At this time, the main control system 32 simultaneously samples the output from the photoelectric detector 28 and that from the focal point detection system 29, for example, for a unit quantity (for example, 0.02 μm) of movement of the Z-stage 14 so as to A/D convert the outputs. As a result, a relationship of a type as shown in FIG. 5 is obtained. Incidentally, the axis of ordinate of the graph shown in FIG. 5 stands for the level of a photoelectric signal transmitted from the photoelectric detector 28 in accordance with with the light quantity of the reflected light which has passed through any one of the apertures 21a to 21e, while axis of abscissa stands for the level of the output from the focal point detection system 29 which corresponds to the position of the Z-stage 14. The sampling of the output from the photoelectric detector 28 and that from the focal point detection system 29 may be performed at a predetermined time interval (for example, every 10 msec). The reason why the relationship shown in FIG. 5 can be explained as follows: If the aperture 21 is positioned in a defocus region of the projection optical system PL with respect to the reverse side of the reticle R, that is, if they do not hold the conjugation relationship, the illumination light emitted from the aperture 21 forms an image obtained by defocusing the opening pattern (for example, the diced pattern) on the reverse side of the reticle R via the projection optical system PL. The illumination light reflected by the reverse side of the reticle R form the image of the aperture pattern which has been further defocused when it again passes through the projection optical system PL and is incident on the opening 21. Hence, when the reflected light passes through the aperture pattern, the defocused portion is shield by the light shielding portion of the aperture pattern and it does not transmit the transmissive portion of the aperture pattern. Therefore, the quantity of the spectral is reduced.

On the other hand, if the aperture 21 is positioned in a conjugate relationship with the reverse side of the reticle R with respect to the projection optical system PL, that is, on the focal point surface of the projection optical system PL, the illumination light passed through the aperture 21 forms a sharp image on the reverse side of the reticle R. Therefore, substantially no light reflected by the reverse side of the reticle R reaches the light-shielding portion of the aperture pattern (blocked by the light shielding portion) when it is incident on the aperture pattern (the major portion of the reflected light passes through the transmissive portion of the aperture pattern). Therefore, the quantity of light received by the photoelectric detector 28 increases as compared with the quantity of light received at the time of the defocusing operation. Hence, the output value obtained by the focal point detection system 29 at the peak output of the photoelectric detector 28 corresponds to the best focal point (the best focus position) of the projection optical system PL. Incidently, the reticle R may be a transparent reticle or a reticle structured by forming the light shielding portion on the entire surface of the circuit pattern region when the best focal point position is obtained. Furthermore, a fact whether or not the best focal point position is being measured regardless of the circuit pattern may be periodically confirmed by using the aforesaid reticle R. In a case of the transparent reticle having no circuit pattern, the surface of the glass located on the reverse side of the reticle serves as the reflecting surface having a reflectance of about 4%. However, it can be easily detected if the detection sensitivity is raised.

Figure 6:
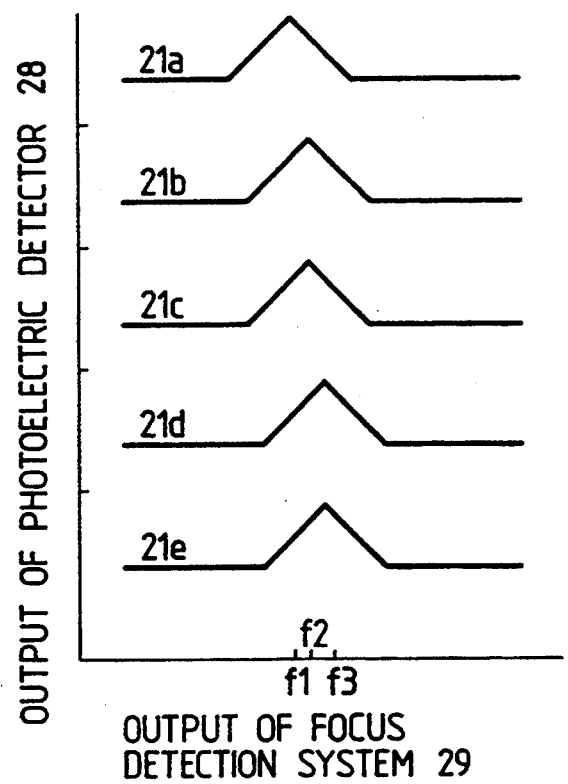
FIG. 6 is a graph which illustrates the relationship shown in FIG. 5 between 5 pairs of apertures shown in FIG. 3.

The best focal point position is detected by the focus position detection portion 32A in the main control system 32. The focus position detection portion 32A obtains the peak value from the output from the photoelectric detector 28 as described above, and as well as obtains the focal point position from the output value of the focal point detection system 29. The aforesaid process is performed for each of the apertures 21a to 21e (total of five times) so that the best focal point position for each of the apertures 21a to 21e can be obtained from the output value from the focal point detection system 29 as shown in FIG. 6. Incidently, f1 to f3 stand for the output from the focal point detector 29 when the output value from the photoelectric detector is the peak value. Since this embodiment is so arranged that the five apertures 21a to 21e are formed in the reference member 20 and the reflected light passing through each of the apertures 21a to 21e can be independently received, the scanning of the Z-stage 14 in the direction Z can be completed by only one time in the aforesaid measuring operation. Therefore, the measurement can be performed while exhibiting a high through put.

Figure 7:
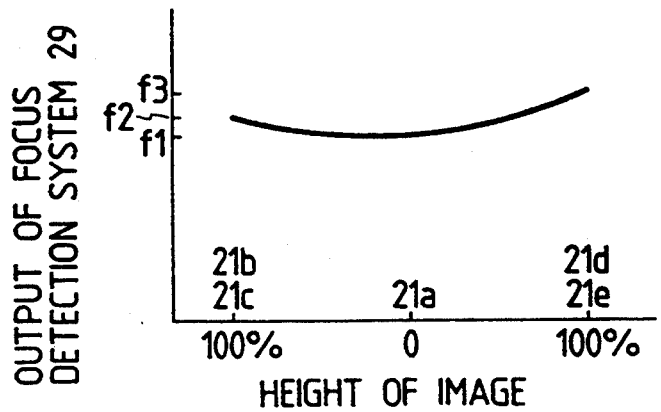
FIG. 7 is a graph which illustrate the output from the focal point detection system 29 with respect to the height of an image.
Figure 8:
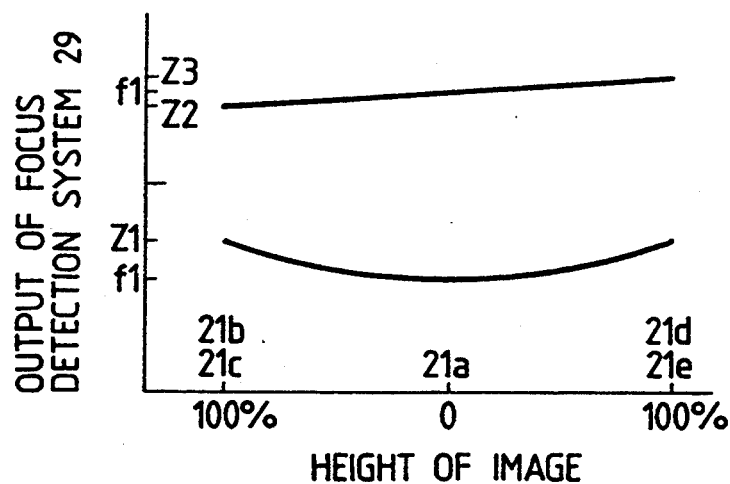
FIG. 8 is a graph which illustrates the output from the focal point detection system 29 with respect to the height of the image and from which the image surface inclination component and the field curvature component are extracted from the graph shown in FIG. 7.

When the relationship of the output values from the focal point detection system 29 with respect to the heights of the image (the distances from the optical axis AX to the periphery of the exposure region) is obtained in accordance with the result shown in FIG. 6, results shown in a graph of FIG. 7 are obtained. A graph shown in FIG. 8 shows the results of separating data about the inclination of the image surface and data about the curvature of field from the graph shown in FIG. 7. The axis of ordinate of each of FIG. 7 and 8 stands for the output from the focal point detection system 29, while axis of abscissa stands for the height of the image. Symbol $Z_1$ is the highest focal point position in a case where the component of the inclination of the image surface is omitted from the data value shown in FIG. 7, $Z_2$ is the lowest focal point position in a case where the component of the curvature of field is omitted from the data value shown in FIG. 7, and $Z_3$ is the highest focal point position in a case where the component of the curvature of field is omitted from the data value shown in FIG. 7.

Then, image surface inclination $\Delta Z$ is obtained from data shown in FIG. 7 about the apertures 21a to 21e except for the central aperture 21a. First, Z2 and Z3 serving as the basic data for obtaining the inclination of the image surface are determined by the following equations:

$$Z_3 = f_1 + (f_3 - f_2)/2$$

$$Z_2 = f_3 + (f_3 - f_2)/2$$

By using $Z_2$ and $Z_3$, the image surface inclination $\Delta Z$ can be obtained from the following equation:

$$\Delta Z = Z_3 - Z_2 = f_3 - f_2$$

The obtained image surface inclination $\Delta Z$ is expressed by a straight line shown in FIG. 8.

Then, the image surface inclination $\Delta Z$ is corrected by a calculation so as to obtain field curvature $\Delta r$ by adding the output from the central aperture to the outputs from the apertures at the four corners. The Z1 holds the following relationship:

$$Z_1 = (f_2 + f_3)/2$$

Therefore, the field curvature $\Delta r$ becomes as follows:

$$\Delta r = Z_1 - f_1$$

which is expressed by a curve shown in FIG. 8. Furthermore, means focal position $f_A$ can be obtained from the following equation:

$$f_A = f_1 + \Delta r/2$$

The calculations for obtaining the image surface inclination $\Delta Z$, the field curvature $\Delta r$ and the mean focal point position $f_A$ are performed by the image forming characteristic detection portion 32B in the main control system 32.

Then, the method of correcting the image surface inclination, the field curvature and the mean focal point position will now be described. It is basically performed in such a manner that the three groups of the lens elements (40, 41), 43 and 45 of the projection optical system are inclined in the direction of the optical axis or a direction perpendicular to the optical axis or the same is inclined while making an axis perpendicular to the optical axis to be the axis of rotation, so that a desired image forming state is realized (in order to simplify the description, the operation for correcting the image surface inclination, the field curvature and the mean focal point position will now be described, but the projecting magnification, the distortion and the like can be corrected)

<Correction of Curvature of Field>

Figure 9:
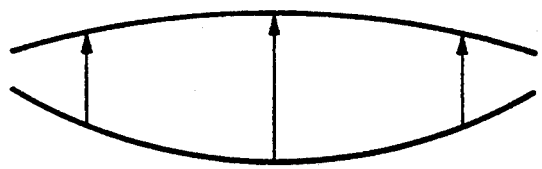
FIG. 9 illustrates removal of the curvature of field.

The change in the curvature of field due to, for example, the movement of the lens elements (40, 41) will now be described with reference to FIG. 9. The change in the curvature field shown in FIG. 9 is an example and is not a general change. In actual, the way of the change varies depending upon the structure of the lens elements. In this embodiment, the curvature field is changed as shown in FIG. 9 by moving the lens element 40 or 41 in the direction of the optical axis. The curvature of field can be changed by moving the lens elements (40, 41) and 42 perpendicular to the optical axis depending upon the way of the structure of the lenses. The aforesaid relationship between the quantity of the movements of the lens elements (40, 41), 43 and 45 and the quantity of the change in the curvature field is previously memorized by a memory in the main control system 32.

Although there arises a possibility of a deterioration in the magnification, the distortion or the other aberration (for example, the comatic aberration or the astigmatism) due to the movement of the lens element for correcting the curvature of field, a desired correction of the curvature of field can be performed while correcting the aberration. As an alternative to this, a method disclosed in U.S. Pat. No. 4,666,273 may be employed to correct the aberration or the like in such a way that the pressure of air present between the lens elements is changed to change the image forming characteristics of the projection optical system PL. Although it can be considered that the image surface is undesirably vertically moved when the lens elements (40, 41), 43 and 45 are moved, the influence of this can be prevented since the wafer W can be set to the best image surface by giving the output value from the focal point detection system 29 offset in accordance with the quantity of the change.

<Correction of Inclination of Image Surface>

The inclination of the image surface is corrected by a method so arranged that the focus difference (the inclination of the image surface) at the four corners of the exposure field obtained from the aforesaid image forming characteristics detection portion 32B is electrically or optically added as the offset to the horizontal position detection system 30. As an alternative to this, the calibration of the horizontal position detection system 30 may be performed so as to make the offset zero in the aforesaid state. That is, the levelling stage is driven to incline the wafer W while detecting the horizontal position of the wafer surface by the horizontal position detection system 30 give the offset, so that the inclination of the image surface is corrected.

<Correction of the Position of the Focal Point>

The position of the focal point is controlled in such a manner that the mean focal point position fA is obtained and the motor 17 is rotated in accordance with the result of fA SO as to make the Z-stage 14 always align to the image surface of the wafer W. It is preferable that calibration be performed at this time in such a manner that the referential zero point of the focal point detection system 29 becomes the mean focal point position fA. By controlling the Z-stage 14 as described above, the surface of the wafer W holds an optically conjugate relationship with the reverse side of the reticle R, so that an excellent image can be formed. Although the mean value is simply obtained, calibration of the focal point detection system 29 to the surface whereby the maximum deviation between the image forming surface and the surface of the wafer W can be minimized may be performed. By performing the exposure on the surface whereby the maximum deviation is minimized or at the mean focal point position, an excellent exposure can be performed as compared with the conventional structure even if the curvature of field has not been corrected satisfactorily. In a case where the linearity obtainable range (that is, the detectable range) of the focal detection system 29 is too narrow, a position sensor such as an encoder is provided for the motor 17. In accordance with the value of the position sensor, the Z-stage 14 is scanned so that the relationship between the output signals from the photoelectric detector 28 and the focal point positions (the position of the Z-stage 14) is obtained while making the axis of ordinate stand for the output from the photoelectric detector and the axis of abscissa stand for the value of the encoder. Then, the correspondence between the focal point position (the value of the encoder) and the output from the focal point detection system 29 is made while driving a halving glass in the focal point detection system 29 by a driving system (omitted from illustration). Finally, the output from the photoelectric detector 28 with respect to the focal point detection system 29 is obtained.

Figure 10:
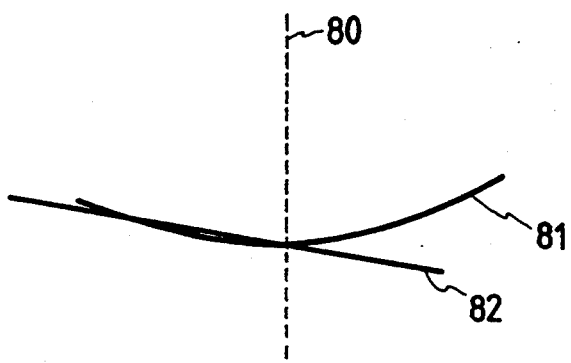
FIG. 10 illustrates a case where only a half portion of the exposure region is used.

In a case where only the half portion of the exposure region is exposed and as well as the curvature of field becomes characteristics as designated by a curvature 81 shown in FIG. 10, it can be considered feasible to employ a method in which the variable blind 10 is used to expose the left side of a central line 80 to light and the levelling stage is so moved that the wafer W is brought to a surface designated by a straight line 82 in such a manner that the wafer W aligns to the image surface. That is, the levelling stage is moved in such a manner that the surface of the wafer W and the image surface become optimum in only the left half portion, and then the post-exposure is performed. As a result, excellent image forming characteristics can be obtained even if curvature of field takes place.

Also each of the inclination of the image surface and the mean focal point position can be corrected by a method in which the relationship between the quantity of the movements of the lens elements (40, 41), 43 and 45, the inclination of the image surface, the quantity of the change in the focal point position is previously memorized in the memory of the main control system 32 and the lens elements (40, 41), 43 and 45 are driven. In this case, the lens elements (40, 41) and 42 may be driven in accordance with a mean image-forming surface obtained in accordance with the curvature of field, the inclination of the image surface and the means focal point position measured by the aperture 21. As a result of this, the exposure can be commenced in a state where the image forming characteristics has been previously corrected.

The sequential order of correcting the projection optical system PL is arranged as described above. However, there is a possibility that the image surface is vertically moved due to the movement of the lens elements (40, 41) and 43 or 45. The influence of the vertical movement can be prevented by giving an electrical or optical focal point the detection system 29 in accordance with the quantity of the change because the wafer W can be set to the best image forming surface. If the projection optical system PL is telecentric on both sides, it can be corrected by vertically moving the reticle.

The measurement of the image forming characteristics of the projection optical system according to this embodiment may be performed at a predetermined time or for a predetermined number of the wafer pieces to be processed.

A second embodiment of the present invention will now be described.

The second embodiment is so arranged that the astigmatism and the like can be measured in addition to the above-mentioned curvature of field, the inclination of the image surface and the like.

The astigmatism cannot be measured by the aperture patterns formed in the apertures 21a to 21d shown in FIG. 3.

Figure 11A:
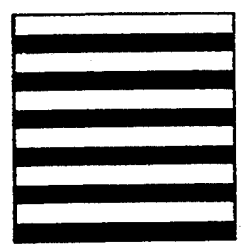
FIGS. 11A and 11B illustrate the aperture pattern according to a second embodiment of the present invention.
Figure 11B:
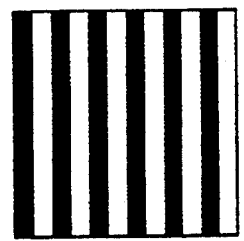
Figure 12:
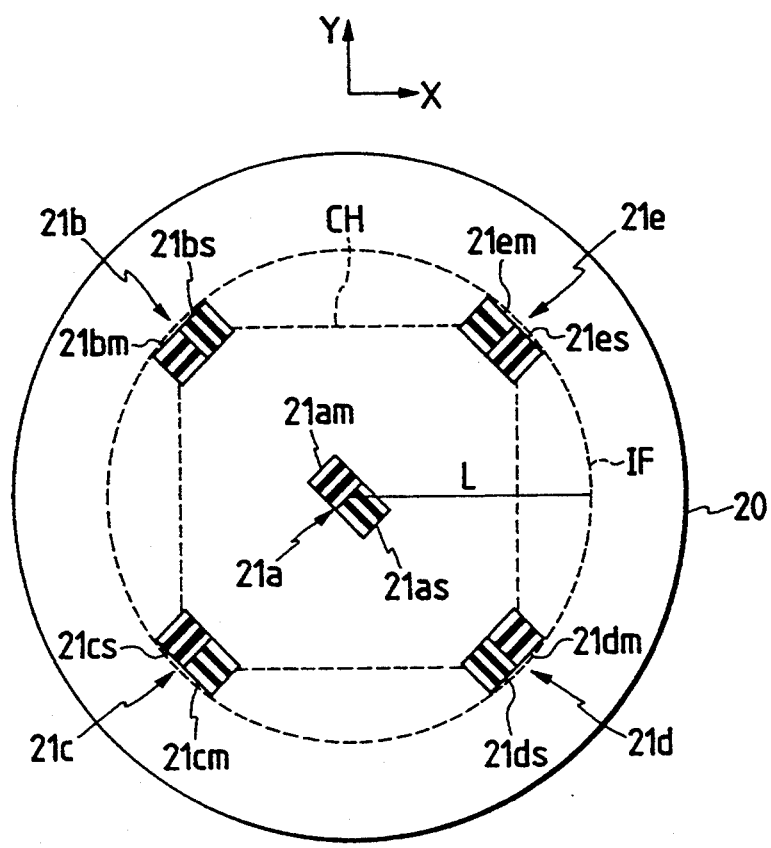
FIG. 12 illustrates the positions of the apertures on the reference member in the exposure region according to the second embodiment of the present invention.

Accordingly, the reference member 20, as shown in FIG. 12, has five pairs of aperture patterns 21am, 21as to 21em and 21es each of which is composed of a lattice pattern shown in FIG. 11A and that shown in FIG. 11B at five positions composed of a central point of the exposure region (the image field IF) of the projection optical system PL and four peripheral points. Referring to FIG. 12, circular region IF having radius of L designate the maximum exposure region of the projection optical system PL and a square inscribed with this circle designated the maximum chip region to which the wafer can be exposed in actual.

Referring to FIGS. 11A and 11B, black regions designated light shielding portions, while white regions designate the light transmissive portions. Referring to FIG. 12, the aperture patterns 21am to 21em having the appendix m are used to measure the image forming characteristics of the projection optical system PL in the meridional direction (lattice patterns having a periodicity in the meridional direction), while the aperture patterns 21as to 21es having the appendix s are used to measure the image forming characteristics of the projection optical system PL in the sagittal direction (lattice patterns having a periodicity in the sagittal direction). The lattice patterns have an inclination of 45° to 135° with respect to the X-axis. The meridional direction is called a direction M and the sagital direction is called a direction S hereinafter.

If five or more apertures 21 are formed, a further information items about the image forming characteristics (for example, the curvature of field) can be obtained. In this embodiment, the through put is improved and the measuring optical system is simplified by forming one aperture 21a on the optical axis portion whereby a best advantage can be obtained in the image forming operation and four apertures 21b to 21e in the peripheral portion of a region in which the height of the image is 100% in the exposure region, which is actually used, and in which the image forming characteristics becomes most disadvantageous. Hereinafter, the pair of the aperture patterns 21am, 21as to 21em and 21es are called "apertures 21" collectively.

The other arrangements are the same as those according to the first embodiment and the similar elements are given the same reference numerals.

Also according to this embodiment, the lens elements are moved in a range in which the influence therefrom on the other aberrations (for example, the spherical aberration) which cannot be corrected by the structure according to this embodiment can be neglected. As an alternative to this, a method may be employed which is so arranged that the mutural interval-between the lens elements are adjusted so that the other aberrations (the magnification, the distortion, and the curvature of field) are corrected while controlling the astigmatism.

As for also the focus detection, output value f obtained by the focal point detection system 29 at the peak output from the photodetector 28 becomes the optimum focal point position (the best focus position) of the projection optical system PL. The focus state detection portion 32A of the main control system 32 obtains the peak value from the output from the photodetector 28 and obtains the focal point position from the output value from the focal point detection system 29 at this time. The aforesaid process is performed for the apertures 21am to 21es by 10 times in all, resulting the focal point positions of the patterns 21am to 21es to be obtained as the output values from the focal point detection system 29 as shown in FIG. 6.

Since this embodiment is so arranged that the five pairs of the aperture patterns 21a to 21e are formed in the reference member 20 and as well as light reflected by the aperture patterns 21am, 21as to 21em and 21es can be individually received, the scanning of the Z-stage 14 in the direction Z can be completed by one time in the aforesaid measuring operation.

Figure 13:
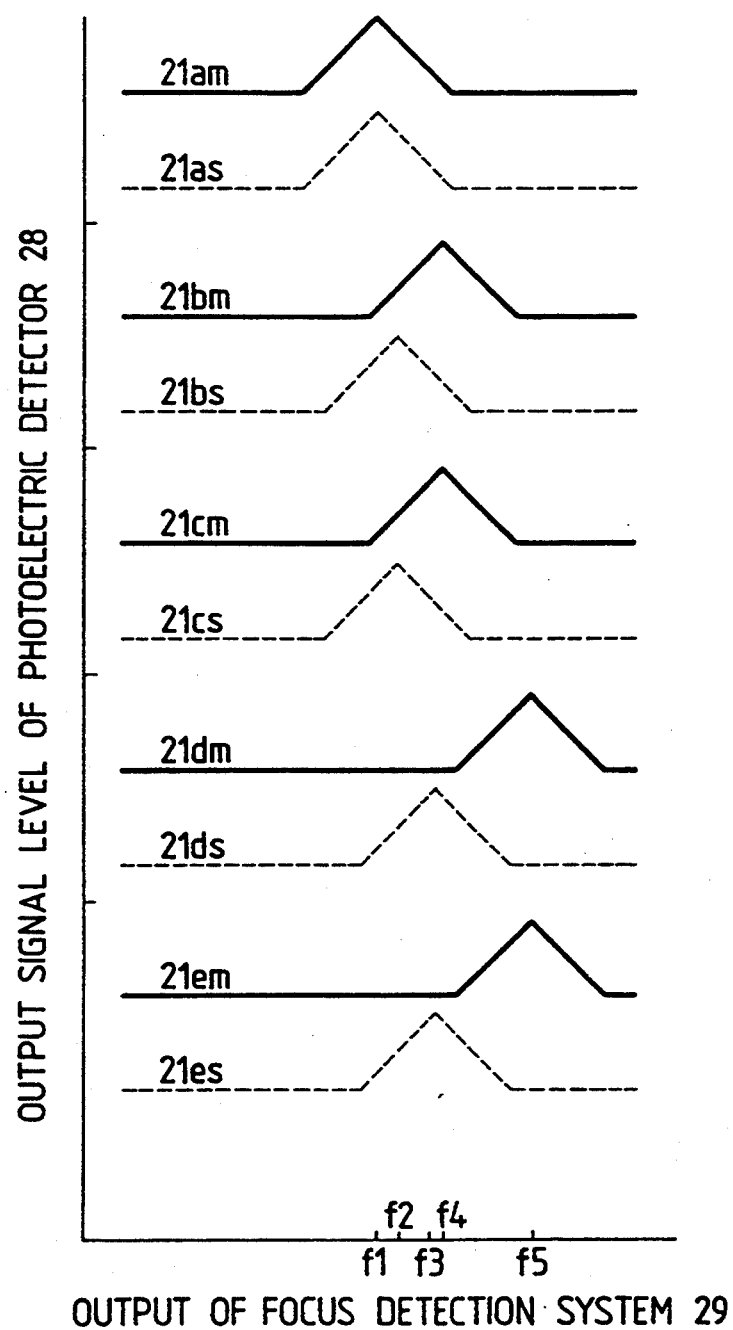
FIG. 13 illustrates the relationship shown in FIG. 5 between the five pairs of the apertures shown in FIG. 12.
Figure 14:
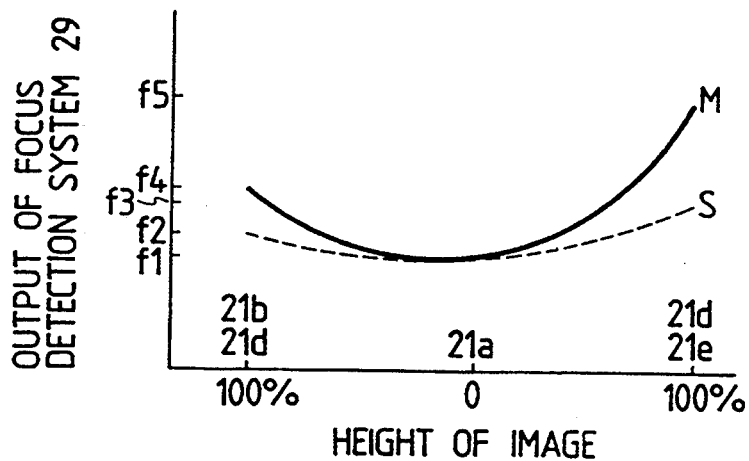
FIG. 14 is a graph which illustrates the output from the focal point detection system 29 with respect to the height of the image and which includes the curvature of field and the inclination of the image surface.

The relationship between the height of the image (the distance from the optical axis AX to the periphery of the exposure region) and the output from the focal detection system 29 in obtained in accordance with the result shown in FIG. 13, resulting in a graph shown in FIG. 14. Referring to FIG. 14, symbol M represents the image forming characteristics in the meridional direction and symbol S represents the image forming characteristics in the sagital direction. The image forming characteristics shown in FIG. 14 are that realized by superposing the inclination of the image surface and the curvature of field. Referring to FIG. 14, the output values from the focal detection system 29 when the height of the image is 100% in the direction M respectively are f5 and f4, while the output values from the focal detection system 29 when the height of the image is 100% in the direction S respectively are f3 and f2. Symbol Z1 is the lowest focal point position of image M from which the curvature of field is removed, symbol Z3 is the lowest focal point position of image S from which the curvature of field is removed, symbol Z2 is the lowest focal point position of image surface from which the curvature of field is removed, symbol Z4 is the highest focal point position of image S from which the curvature of field is removed, symbol Z6 is the highest focal point position of image M from which the curvature of field is removed, symbol Z5 is the highest focal point position of image surface from which the curvature of field is removed, symbol Z7 is the highest focal point position of image S from which the inclination of the image surface is removed, symbol Z9 is the highest focal point position of image M from which the inclination of the image surface is removed, and symbol Z8 is the highest focal point position of image surface from which the inclination of the image surface is removed.

Referring to FIG. 14, Z1 to Z6 are obtained from a graph about the apertures 21bm, 21bs to 21em and 21es except for the central apertures 21am and 21as by the following equations:

$$Z1 = f1 - (f5 - f4)/2$$

$$Z3 = f1 - (f3 - f2)/2$$

$$Z4 = f1 + (f3 - f2)/2$$

$$Z6 = f1 + (f5 - f4)/2$$

$$Z2 = (Z1 + Z3)/2$$

$$Z5 = (Z4 + Z6)/2$$

Figure 15:
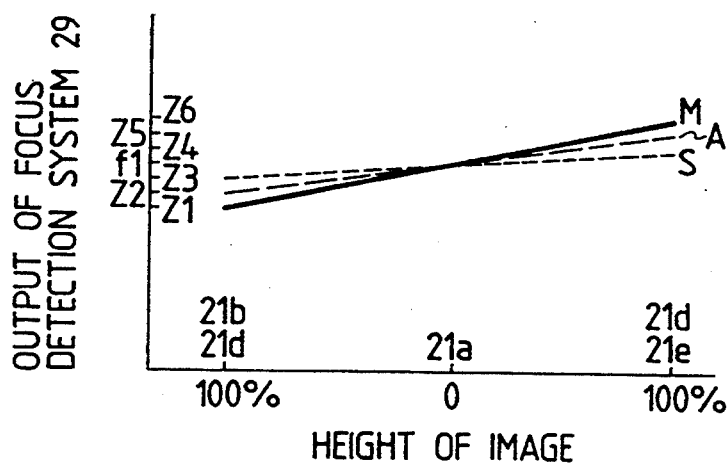
FIG. 15 is a graph which illustrates the output from the focal point detection system 29 with respect to the height of the image and from which the image surface inclination component is extracted from the graph shown in FIG. 7.

Then, data Z1 and Z6 of the image height of 100% as the image inclination characteristics in the direction M are connected, data Z4 and Z3 of the image height of 100% as the image inclination characteristics in the S directions are connected, and Z5 and Z2 are connected as the mean value characteristics, resulting in characteristics of the inclination of the image surface shown in FIG. 15 to be obtain. Referring to FIG. 15, symbol A represents the overall inclination of the image surface which can be obtained as the average value in the directions M and S and its image surface inclination $\Delta Z$ becomes as follows:

$$\Delta Z = Z5 - Z2$$

The image surface inclination in the direction M becomes as follows:

$$\Delta Zm = Z6 - Z1$$

The image surface inclination in the direction S becomes as follows:

$$\Delta Zs = Z4 - Z3$$

Figure 16:
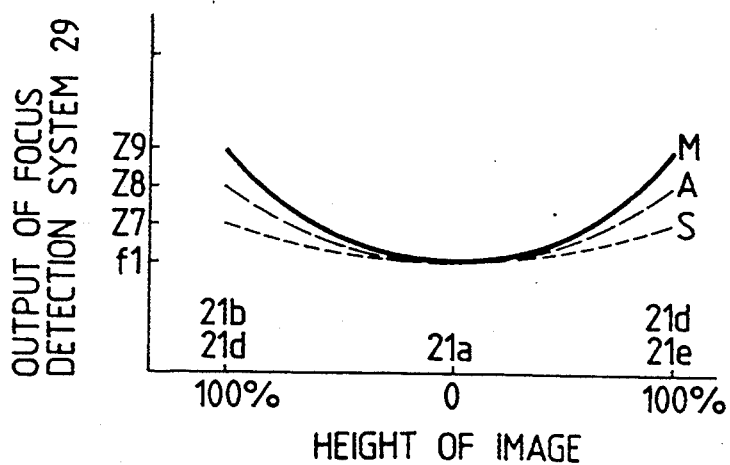
FIG. 16 is a graph which illustrates the output from the focal point detection system 29 with respect to the height of the image and from which the field curvature component is extracted from the graph shown in FIG. 7.

The graph shown in FIG. 14 is corrected with the inclination of the image surface obtained in FIG. 15 and the outputs from the focal point detection system 29 which correspond to the central apertures 21am and 21as are added to the outputs from the focal point detection system 29 which correspond to the apertures 21bm, 21bs to 21em and 21es at the four corners, so that the curvature of field is obtained. As a result, data shown in a graph shown in FIG. 16 can be obtained. Referring to FIG. 16, the following relationships are held:

$$Z7 = (f2 + f3)/2$$

$$Z9 = (f4 + f5)/2$$

$$Z8 = (f7 + f9)/2$$

Field curvature $\Delta rm$ in the direction M becomes:

$$\Delta rm = Z9 - f1$$

Furthermore, field curvature $\Delta rs$ in the direction S becomes:

$$\Delta rs = Z7 - f1$$

Therefore, the overall field curvature $\Delta rA$ can be obtained as the mean value of $\Delta rs$ and $\Delta rm$ as designated by symbol A shown in FIG. 16 as follows:

$$\Delta rA = (\Delta rm + \Delta rs)/2 = Z8 - f1$$

Figure 17:
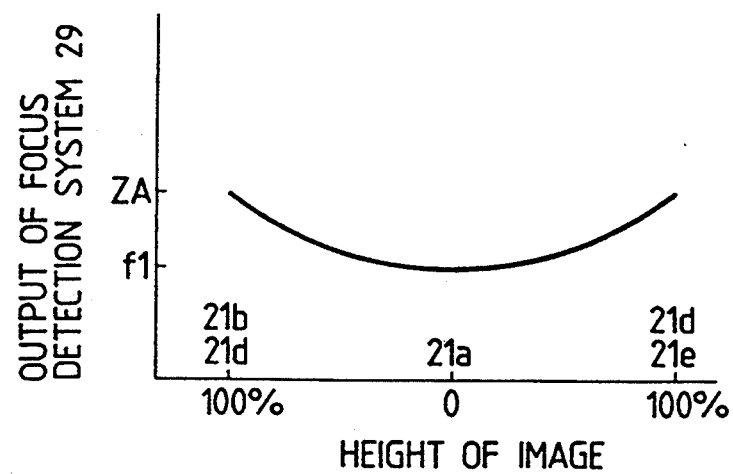
FIG. 17 is a graph which illustrates the output from the focal point detection system 29 with respect to the height of the image and from which only the astigmatism component is extracted from the graph shown in FIG. 9.

Since the astigmatism is the difference between the curvature of field in the direction M and the curvature of field in the direction S, it can be expressed by a graph shown in FIG. 17.

The calculations of the aforesaid inclination of the image surface, the curvature of field and the astigmatism are performed in the image forming characteristic measuring portion 32B of the main control system 32.

As can be understood from FIG. 16, the mean focal point position $f_A$ (omitted from illustration) is expressed by the following equation:

$$fA = f1 + \Delta rA/2 = f1 + (Z8 - f1)/2$$

Therefore, when the Z-stage 14 is so controlled that the output from the focal point detection system 29 coincides with fA, the surface of the wafer holds an optically conjugate relationship with the reverse side of the reticle R, resulting an excellent image to be formed. As a result, even if the curvature of field and the astigmatism cannot be corrected satisfactorily, a further improved image can be formed as compared with that obtainable from the conventional structure. Incidently, it is preferable that calibration be so performed that the zero reference of the focal point detection system 29 becomes the aforesaid mean focal point position fA. Furthermore, calibration of the focal point detection system 29 to the surface whereby the maximum deviation between the image forming surface and the surface of the wafer can be minimized may be performed.

The method of correcting the inclination of the image surface and the mean focal point position is performed similarly to that according to the first embodiment.

Although this embodiment is arranged in such a manner that the aperture patterns 21am, 21as to 21em and 21es of the reference member 20 are individually irradiated with light and as well as the reflected light beams from these aperture patterns are individually received, another arrangement may be employed in which: the entire surface of the reverse side of the reference member 20 can be irradiated with light; and a variable stop is disposed between the reference member 20 and the fiber 25, wherein the variable stop is operated when the focal point position at each aperture pattern is detected so as to irradiate only the desired aperture pattern with light. In this case, only one pair composed of the fiber 25 and the photodetector 28 is required, resulting in an advantage to be obtained in that the structure of the measuring illumination system LL can be simplified. <Procedure of Correcting Curvature of Field and Astigmatism>

The procedure of correcting the curvature of field and the astigmatism will now be described. Basically, the three groups of the lens elements (40, 41), 43 and 45 of the projection optical system PL are inclined as described above in the direction of the optical axis or by a method in which the axis perpendicular to the optical axis is made to be the center of the rotation, so that a desired stage in which the image is formed can be obtained. In order to simplify the description, the correction of the curvature of field and the astigmatism will be described hereinafter. However, the projection magnification and the distortion can be corrected.

Figure 18A:
FIG. 18A is a graph which illustrates removal of the field curvature.
Figure 18B:
FIG. 18B is a graph which illustrates removal of the astigmatism.

First, change in the curvature of field and the that in the astigmatism taken place due to the movement of the lens elements (40, 41) will be described with reference to FIGS. 18A and 18B. Incidently, FIGS. 18A and 18B show an example which is not a general example because the way of the change varies depending upon the structure of the lens elements. When the lens elements (40, 41) according to this embodiment are moved in the direction of the optical axis, the curvature of field is changed as shown in FIG. 18A and the astigmatism is changed as shown in FIG. 18B. Since the optical system is so arranged that the astigmatism increases when the curvature of field is reduced, it is preferable that the total difference (the difference in the focal point (image forming) position in a shot (in an exposure region) including all of the curvature of field, the inclination of the image surface aid the astigmatism) be paid attention and lens elements (40, 41) are operated in such a manner that the curvature of field and the astigmatism respectively become the optimum values. Incidently, another structure may be employed in which the astigmatism is decreased when the curvature of field is reduced by increasing the number of the lenses to be moved or by changing the curvature or the refraction factor of the lens.

When the lens elements are moved for the purpose of correcting the curvature of field and the astigmatism, there is a possibility that the magnification, the distortion and the other aberration (for example, the comatic aberration) deteriorate. However, since a plurality of lens elements can be moved, the curvature of field and the astigmatism can be corrected as desired while correcting the aforesaid aberrations.

Then, the operation of this embodiment will now be described. As for the astigmatism, the aperture patterns and the measuring procedure according to the second embodiment are employed and the other image forming characteristics are common to the first and the second embodiments.

(1) First, the curvature of field, the inclination of the image surface and the mean focal point position at the initial state of the projection optical system PL may be optimized by the aforesaid procedure at the setting upon the system. Specifically, the aforesaid method is employed in which the Z-stage 14 is scanned so as to obtain the image forming characteristics in response to a signal which corresponds to light reflected by the aperture 21. Then, the lens elements (40, 41), 43, 45, the levelling stage, and the Z-stage are moved or the offset is given to the focal point detection system 29 or the reticle is vertically moved, as described above, so that the correction is so performed that the optimum image forming state and the focus position can be obtained.

(2) The focal point position, the curvature of field, the inclination of the image surface and the astigmatism can be changed as compared with those when the system has been set due to environmental changes such as that in the atmospheric pressure or the temperature, the absorption of illumination light of the projection optical system PL, the warp taken place by the dead weight of the reticle R, or the deformation of the reticle R due to the absorption of illumination light. However, in a case where the aforesaid changes take place relatively slowly, or in a case where the quantity of the changes in the focal point position, the curvature of field, the inclination of the image surface and the astigmatism at a periodical measuring interval (for example, at ten times of the exchange of the wafer, at each exchange of the same or at every several shot) can be neglected, the correction may be performed similarly to (1) in such a manner that each of the aforesaid image forming characteristics can be optimized by operating the lens elements (40, 41), 43 and 45 or the levelling stage by a method in which the Z-stage 14 is periodically scanned at, for example, the exchange of the wafer and the image forming characteristics are measured in response to a signal obtainable from the photoelectric detector 28.

(3) In the case where the change in the aforesaid image forming characteristics (the focal point position, the curvature of field, the inclination of the image surface and the astigmatism) of the projection optical system PL is taken place at high speed due to the change in the environment and the absorption of illumination light, the conventional correction according to the estimation control and the correction by performing the measurement by the using the aperture 21 are simultaneously performed, so that the change in the image forming characteristics can be tackled. Thus, a desired image forming characteristics can. be obtained. The term "estimation control" used hereinbefore is a method disclosed in, for example, U.S. Pat. No. 4,952,815 in which the image forming characteristics changed due to the heating value received by the projection optical system PL from the exposing light are previously measured and memorized by the memory and the image forming characteristics at the time of the actual exposure are corrected similarly to (1) according to the value stored in the memory.

The change in the image forming state of the projection optical system PL is detected by measuring the heating value by using the information about the fact the shutter 2 is opened or closed, outputs PS, RS and LS from the power monitor 5, the reflectance monitor 8, and the irradiation quantity monitor 16. Furthermore, the Z-stage 14 is scanned at a time interval in which the change in the image forming characteristics can be sufficiently measured so that the image forming characteristics are obtained in accordance with the output signal from the photoelectric detector 28. Then, the variable of the state of the image forming characteristics is stored in the memory of the main control system.

The heating value is calculated in accordance with the output value LS from the irradiation quantity monitor 16 for detecting the irradiation energy for each exposing condition and the time in which the shutter 2 is opened. If the reflectance of the base of the projection optical system PL is zero, the necessity lies in that only the transmissive light of the projection optical system PL is considered. However, if the reflectance is not zero, the (transmitted light+reflected light) contributes to the thermal energy because the heating value accumulated in the projection optical system PL varies depending upon the reflectance of the base of the projection optical system PL. Therefore, the output value from the reflectance monitor 8 is also used in this case. Furthermore, the power monitor 5 always monitors the time sequential change such as the fluctuation or the like of the light source during the exposure operation. Therefore, the change in the output value LS from the power monitor 5 is taken into consideration, so that the heating value to be accumulated in the projection optical system PL is determined.

At the time of the exposure operation, the light information RS and LS respectively supplied from the reflection quantity monitor 8 and the irradiation quantity monitor 16, information about a fact whether or not the shutter 2 is opened and the change characteristics stored in the aforesaid memory are used to calculate the quantity of the change in the image forming characteristics due to the heat absorption of the projection optical system PL. In a case where the image forming stage of the projection optical system PL is changed due to the other factor, for example the change in the atmospheric pressure, the aforesaid quantity of change is also added in accordance with data (for example, data about the change in the image forming characteristics with respect to the change in the atmospheric pressure) which has been previously measured and stored. The barometer can be disposed in the projection optical system PL. The optimum quantity of the correction of each of the curvature of field, the inclination of the image surface and the astigmatism is calculated in accordance with the aforesaid result of the addition. Then, the lens elements (40, 41), 43 and 45 are driven by the driving element 48 to 50 so that the correction is performed.

The focusing operation is performed by driving the Z-stage 14 and by vertically moving the wafer W while detecting the focal point position. The inclination of the image surface is corrected by inclining the wafer W by driving the levelling stage while detecting the horizontal position of the surface of the wafer W by the horizontal position detection system 30 given the offset.

As described above, if the quantity of the change in the image forming characteristics of the projection optical system PL exceeds a predetermined value due to the environmental change during an exposure of one sheet of wafer, the lens elements (40, 41), 43 and 45 are driven by the estimation control. On the other hand,. the signal transmitted from the photoelectric detector 28 is detected while similarly scanning the Z-stage 14 at every exchange of the wafer or at a predetermined number of sheets of the wafer (for example, at every exchange of the reticle or at every exchange of 10 sheets of the wafer). Furthermore, the focal point, curvature of field, inclination of image surface and astigmatism are calculated in accordance with the result of the detection. In accordance with the focal point, curvature of field, inclination of image surface and astigmatism obtained from the photoelectric detector 28, the focal point, curvature of field, inclination of image surface and astigmatism for the estimation control are corrected, resulting the estimation control to be periodically calibrated. As a result, the image forming characteristics of the projection optical system PL can be improved.

The calibration is performed by calculating the error between the estimation control and the measured result and by correcting the value of the estimation control to the measured value or by correcting the equation for the estimation control.

In a case where the estimation control is simultaneously performed, it is preferable that a sheet-number setting means (a counter or the like) for setting a the number of the sheets of the wafer at which the measurement of the image forming characteristics of the projection optical system PL is performed. In general, the difference (the error in the result of the calculation) between the image forming characteristics calculated by the calculation in the estimation control and the actual image forming characteristics obtainable in the aforesaid measurement is small until a predetermined number of the sheets of the wafer are exposed to light after the commencement of the exposure. Therefore, a large number of the sheets of the wafer may be set to the sheet-number setting means. In this embodiment, the number is set to 10. As a result, the aforesaid measurement is performed at every completion of the exposure of 10 sheet of the wafer.

In a case where the sheet-number setting means is used as described above, the 10 sheets of the wafer are exposed to light while correcting the image forming characteristics by the estimation control after the image forming characteristics has been measured and corrected before the commencement of the exposing operation. When the aforesaid exposure is completed, the aforesaid measurement is again performed. The result of the measurement and the image forming characteristics calculated in the estimation control are subjected to a comparison. If the aforesaid difference is larger than a predetermined allowable value (a value determined by the focal depth of the projection optical system PL and the control accuracy of the image forming characteristics), the image forming characteristics are corrected in accordance with the result of the aforesaid measurement, and as well as the number of sheets set to the sheet number setting means is changed (for example, changed to 8 sheets). The measurement and the correction may be performed at every wafer.

If the aforesaid difference is smaller than the allowable value, the number of sheets set to the sheet number setting means is changed experimentally or from experience. That is, the number of the sheets of the wafer at which the aforesaid difference becomes larger than the allowable value is discriminated so as to change the number of the sheets to be set is changed to, for example, 2 sheets. When the exposure of the two sheets of the wafer has been completed, the aforesaid measurement is performed so as to correct the image forming characteristics and about 8 sheets is set to the sheet number setting means. The reason for this lies in that the aforesaid difference becomes larger until a predetermined time passes from the commencement of the exposing operation. Then, the aforesaid operation is repeated and the number of the sheets to be set to the sheet number setting means is fixed at the time when the actual image forming characteristics have been substantially stabled. As a result, all of the residual wafer are exposed to light in accordance with the result of the measurement performed at every predetermined number of sheets and the estimation control. By employing the aforesaid sequence, the number of times of the measurement operations can be decreased and therefore the through put can be improved. Furthermore, another method may be employed in which, in accordance with the actually measured data, the state variable is obtained so as to be subjected to a comparison with the state variable in the estimation control, so that the number of the sheets to be exposed to light at which the aforesaid difference becomes larger than the allowable value is discriminated and the number of sheets is automatically changed to a smaller value (for example, for each wafer). As a result, the number of the sheets can be changed while preventing a fact that the aforesaid difference exceeds the allowable value. If the image forming state is stabled, the exposure can be performed by only the estimation control while preventing the fact that thee aforesaid difference exceeds the allowable value. Therefore, the through put can be improved.

Furthermore, another arrangement may be employed in which an environment sensor for monitoring the change in the environment (for example, the pressure, the temperature and the humidity and the like) is provided, and if the environment sensor detects an abnormal fact whereby the image forming characteristics of the projection optical system PL can be considerable changed, the exposure operation is immediately stopped at the time of the detection, and the measurement is performed by using the aperture 21 so that the lens elements are driven in order to correct the image forming characteristics of the projection optical system PL. As an alternative to this, the exposure may be immediately stopped at the moment the quantity of the change in the image forming characteristics exceeds the allowable value and the measurement and the correction of the image forming characteristics may be performed as described above. In a case where the change in the image forming characteristics is taken place quickly, a method capable of easily performing the correction will now be considered. The method is arranged in such a manner that the aforesaid estimation control is not performed, the measurement is performed by using the apertures 21 at every exchange of the wafer, and the estimation is performed by a method of a primary interpolation or the secondary interpolation in accordance with the result of the previous or the measurements second time before. By employing this method, a considerable effect can be obtained.

If the reference member 20 is inclined, the inclination of the XY-stage is previously measured by a diagonal incident type AF while changing the XY-stage, and the degree of the error generated due to the inclination is corrected in accordance with the result of the measurement at the time of the measurement by using the aperture 21. The inclination of the reference member 20 may be measured by using the diagonal incident type detection optical system and by shifting the XY-stage or may be measured by using an electronic microwave or the like while shifting the XY-stage in the manufacturing process.

Although the aforesaid embodiment is arranged in such a manner that the sole focal point detection system 29 for measuring the center of the optical axis of the projection optical system PL is provided, a plurality of focal detection systems may be provided in order to measure a plurality of places in the exposure area. By making a plurality of the focal point detection system 29 to be able to measure the apertures 21a to 21e shown in FIG. 3, the measurement can be performed while preventing an error if the reference member 20 is inclined or if the inclination is being changed. If the reference member 20 can be held horizontally in a precise manner, a plurality of the apertures 21 of the reference member 20 can be used in the calibration of a plurality of the focal point detection system 29.

If a plurality of the apertures 21 cannot be formed on the reference member, only the aperture 21a at the central portion of the reference member is used, the following method may be employed in which locating is so performed that the XY-stage 15 is brought to the positions of the apertures 21b to 21e according to this embodiment when the Z-stage 14 is scanned by using only the central aperture 21a of the reference member, the Z-stage 14 is scanned at each time, and the signal transmitted from the aperture 21a is sampled. However, the effect of the through put becomes disadvantageous as compared with the aforesaid embodiment. Although the five apertures 21 are formed in the reference member 20 in the aforesaid embodiment, they can be decreased to four (to three if the astigmatic or an ideal state involving no eccentricity) if only the inclination of the image surface is measured, resulting in the measurement speed to be further raised. In a case where only the mean focal point position is measured, they can be decreased to two.

A further precise focusing can be enabled by taking the projection and pits of the image surface and those of the wafer W into consideration. For example, the image surface may be intentionally warped to align to the warp of the Wafer W to perform the exposure. The focal point detection system 29 and the horizontal position detection system 30 are not limited to the structures according to this embodiment. For example, the focal detection system may be arranged in such a manner that the height (the Z-directional position) of each point is detected by irradiating four corners of a rectangular shot region on the wafer is irradiated with the image of a slit or a pin hole. In this case, the quantity of the inclination of the surface of the wafer can be obtained from the height of the five positions while eliminating the necessity of providing the horizontal position detection system.

In a case where the image forming characteristics are corrected in accordance with the result of the measurement (the curvature of field, the inclination of the image surface and the astigmatism), the halving glass of the focal point detection system 29 may be driven by the aforesaid estimation control to previously find the subject focal point position. In this case, the scanning range of the Z-stage 14 can be narrowed and the Z-stage can be scanned by only the output from the focal point detection system 29, causing the time required to perform the scanning to be shortened. Therefore, the through put can be improved. The method of giving the offset at the time of the calibration of the focal point detection system 29 and the horizontal position detection system 30 may be an optical method (in which the halving glass is driven) or an electric method (in which the offset quantity is electrically added to the output value). In the aforesaid embodiment, each aberration is restricted to substantially zero by driving the lens. However, another method may be employed in which the aforesaid correction is not performed but a mean image forming surface of the projection optical system PL is obtained in accordance with the result of the measurement (focal point, curvature of field, inclination of image surface and astigmatism) and the calibration of the focal point detection system 29 and the horizontal position detection system 30 is simply performed in such a manner that the image forming surface becomes the zero referential position. At this time, the mean image forming surface detected as described above is evaluated. If the quantity of the change of the mean image forming surface with respect to the best image-forming surface (designed value) is smaller than a predetermined allowable value (the detectable range of the focal point detection system 29 or the horizontal position detection system 30, that is, a value defined in accordance with the movable range of the levelling stage), only the calibration is performed. If it is larger than the allowable value, the correction may be performed by the aforesaid lens driving method.

As for the aberration which cannot be corrected by the image forming characteristic correction portion IC in the aforesaid embodiment and the aberration left because it cannot be corrected, it may, of course, be removed by performing the calibration of the focal point detection system 29 or by electrically or optically giving an offset.

Although the aforesaid embodiment is so arranged that the means for correcting the image forming characteristics of the projection optical system PL comprises a mechanism for driving a portion of the lens elements which constitute the projection optical system PL, the correction means adaptable to the present invention is not limited to the aforesaid mechanism. For example, any of the following methods may be employed: a method in which the reticle R is driven; a method in which a field lens disposed between the reticle R and the projection optical system PL is two-dimensionally moved or inclined; or a method in which a space held between the two lens elements constituting the projection optical system PL is sealed and the pressure of the sealed space is adjusted. As an alternative to this, they may be combined to each other. The measurement of the image forming characteristics of the projection optical system PL according to the aforesaid embodiment may be performed at every unit time or at every predetermined number of sheets of the wafer to be processed.

<Modification I of Aperture Pattern>

A modification of the aperture 21 will now be described. Although the first and the second embodiments are arranged in such a manner that the pattern of the aperture 21 is formed by combining the patterns of the transmission portion and the light shielding portion as shown in FIGS. 11A and 11B, a pattern equivalent to that shown in FIGS. 2 and 11 can be formed by using a phase lattice pattern for shifting the wavelength of measuring light by ¼ wavelength.

Figure 19A:
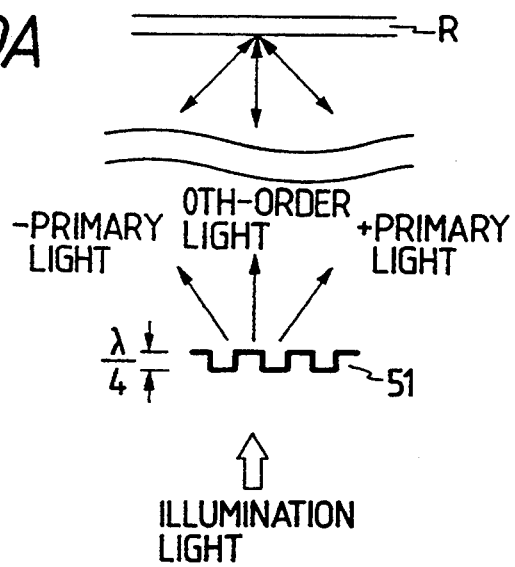
FIGS. 19A and 19B illustrate a phase shift pattern.
Figure 19B:
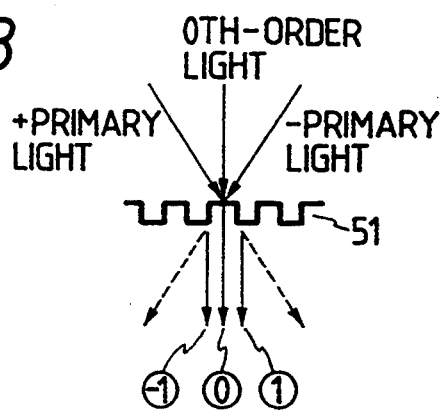

The principle of this will now be briefly described with reference to FIGS. 11A and 11B. When the phase lattice pattern 51 is irradiated with light from a lower portion as shown in FIG. 19A, a diffraction light is generated. At this time, ±primary light is shifted from 0th-order light by ¼ wavelength. The aforesaid beams are reflected by the reverse side (the lower surface) of the reticle R and is again returned to the pattern 51. When the pattern 51 is present on the focal surface of the projection optical system PL, the ±primary light is again diffracted as shown in FIG. 19B and the ±primary light returns through the same optical path for the 0th-order light. The wavelength of the ±primary light is further shifted by ¼ wavelength so that it is shifted from the 0th-order light by ½ wavelength. As a result, the ±primary light acts to delete the 0th-order light. IF the pattern 51 is not present on the focal surface of the projection optical system PL, the phase difference between the ±primary light and 0th-order light does not become ½ wavelength. Therefore, the aforesaid deletion condition is not met. As a result, best focus is obtained when the output from the photoelectric detector 28 becomes minimum. As described above, with the method in which the phase shift pattern is sued, the S/N ratio can be raised as compared with the aforesaid method because all of the light beams pass through the pattern 21. As a result, the best focus point can easily be detected.

Another modification of the aperture pattern according to the second embodiment shown in FIGS. 11A, 11B and 12 will now be described.

<Modification II of Aperture Pattern>

Although the aforesaid embodiment is so arranged that the 10 apertures 21am, 21as to 21em and 21es are formed in the reference member 20, difference regions are observed in a strict means between the Directions M and S in this case. If the aforesaid fact arises a problem, the following aperture may be employed.

Figure 21:
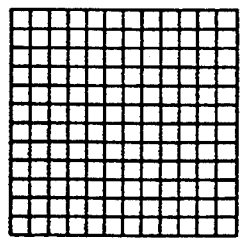
FIG. 21 illustrates a case where the apertures are composed of ECDs.
Figure 22:
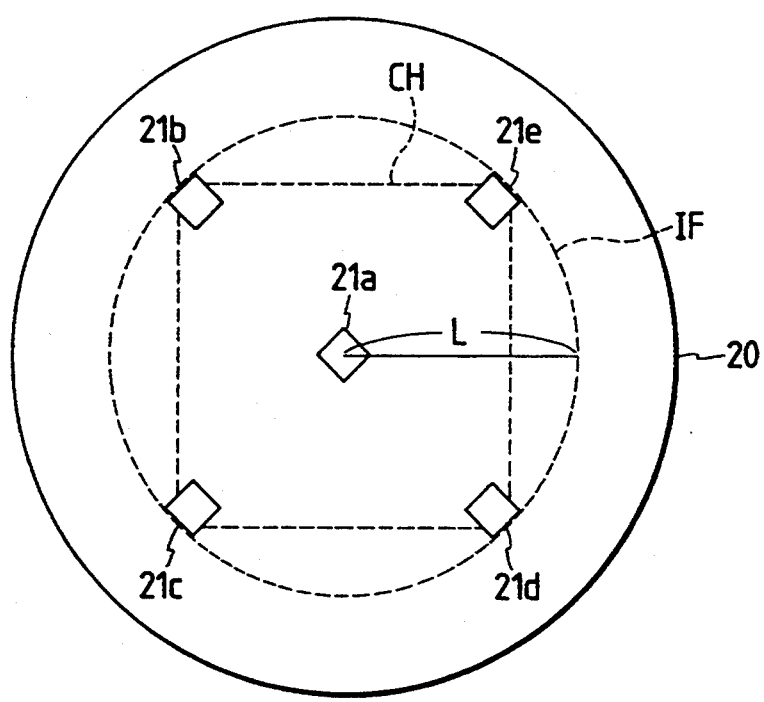
FIG. 22 illustrates the configuration of the apertures in a case where they are composed of ECDs.

As shown in FIG. 21, small-area ECDs (Electro-Chromitic Devices) are disposed to form a matrix and the voltage to be applied to each of the small devices is controlled so that the lattice pattern as shown in FIG. 2A or 2B can be formed. In this case, five apertures 21a to 21e must be formed as shown in FIG. 22. Therefore, an advantage can be obtained in saving the space and reducing the size of the signal processing circuit. The procedure of measuring the curvature of field, the inclination of the image surface and the astigmatism may be similar to that according to the aforesaid case. However, the directions M and S can be simultaneously measured by one time of scanning of the Z-stage 14 in the aforesaid embodiment in which the aperture patterns in the directions M and S are respectively formed, but the Z-stage 14 must be scanned for each of the M-directional lattice pattern and that S-directional lattice pattern.

<Modification III of Aperture Pattern>

In a case where the lattice pattern is formed by using an electric device such as the ECD, all of the points can be measured by the single aperture 21a. That is, the curvature of field, the inclination of the image surface and the astigmatism can be measured by the single aperture 21a by locating the aperture 21a to a position which corresponds to each of the apertures 21b to 21e in the exposure region IF of the projection optical system PL by patterns and by scanning the Z-stage 14 in the direction of the optical axis at each time.

At this time, the lattice pattern may be formed in the light shielding portion made of chrome or the like similarly to the aforesaid embodiment even if the lattice pattern is not made of the electric device such as the ECD. However, the lattice pattern must be made to be rotatable in a horizontal place in this case. However, the aforesaid necessity of forming the two aperture patterns 21am and 21as can be eliminated and an advantage can be obtained in that the number of the aperture patterns can be decreased to only one aperture pattern (21am or 21as).

<Modification IV of Aperture Pattern>

In a case where the aperture pattern shown in FIGS. 11A and 11B or the phase shift type pattern shown in FIGS. 19A and 19B is used, the curvature of field, the inclination of the image surface and the astigmatism can be measured of the five portions (21a to 21e) in the exposure region by a single aperture pattern by arranging the reference member 20 or the stage on which the reference member 20 is formed to be rotatable. That is, for example, the aperture pattern shown in FIG. 2A is rotated by an angular degree of 45° on the optical axis in the exposure region with respect to the X-axis so as to perform the meridional directional measurement, and it is further rotated by an angular degree of 135° with respect to the X-axis so as to perform the sagital directional measurement. The aforesaid operation may be performed for each point.

<Modification V of Aperture Pattern>

The two apertures 21am and 21es may be used. In this case, the similar operation to that according to the modification II of the aperture pattern is performed. However, an advantage can be obtained in that the ECD can be omitted from the structure and the optical system can be simplified.

Then, a method of measuring the eccentricity and spherical aberration of the projection optical system PL by using the aperture pattern according to the second embodiment shown in FIGS. 11A, 11B and 12 will now be described. The eccentricity or the spherical aberration of the projection optical system PL can be measured so as to be corrected by using the aforesaid projection exposure apparatus.

<Measurement and Removal of Eccentricity>

In a case where all of the optical axes of the lens elements constituting the projection optical system PL align to one another, the astigmatism is not generated in the image (an image formed at the center of the exposure region IF of the PL) on the center of the optical axis. That is, the focused points respectively measured at the apertures 21am and 21as shown in FIG. 21 are not deviated from each other. Therefore, by obtaining the deviations between the measured value at the aperture 21am and that at the aperture 21as, the eccentricity of the projection optical system PL can be measured. Furthermore, when any of the lens elements (40, 41), 43 and 45 is so moved that the measured quantity of the eccentricity is corrected in a vertical plane perpendicular to the optical axis, the eccentricity can be removed.

<Measurement and Removal of Spherical Aberration>

Figure 20:
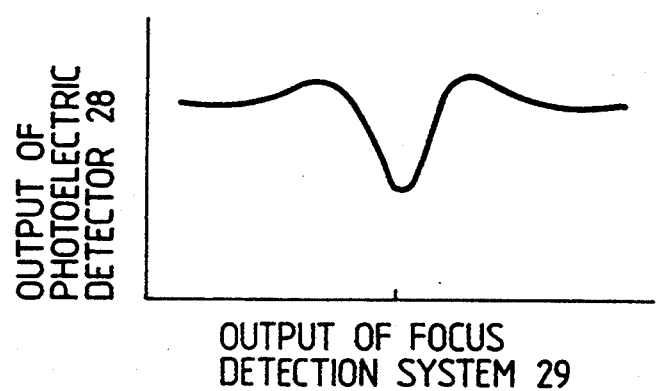
FIG. 20 is a graph which illustrates the relationship from the output from the focal point detection system 29 and that from a photodetector which receives measuring reflected light which has passed through an aperture 21.

In a case there is a spherical aberration, the waveform shown in FIG. 5 or FIG. 20 is distorted, causing the waveform to become asymmetric or causing the contrast to be lowered. Accordingly, the signal distortion taken place in a case where the spherical aberration is generated is previously obtained from a simulation, so that the quantity of the aberration can be measured from the distortion of the detected signal. Then, a parallel and flat glass is inserted between the projection optical system PL and the wafer W, so that the spherical aberration can be removed.

The spherical aberration can be similarly measured from the asymmetry of the graph shown in FIG. 7 if the aperture pattern shown in FIG. 1 is used. The spherical aberration can be obtained by a process of obtaining a graph as shown in FIGS. 5, 7 and 20 and the spherical aberration is obtained from its asymmetry similarly to the aforesaid measuring method. By driving the lens elements similarly to the aforesaid embodiments, the correction can be similarly performed. Furthermore, the spherical aberration can be corrected by changing the thickness of a parallel and flat glass inserted into the projection optical system PL and the wafer. The method of changing the thickness may be a method in which a pair of wedge-like glass plates are slid or a method in which a rotational plate having plural kinds of glass plates the thickness of which are different is rotated.

Since the present invention is so arranged that the images of the aperture patterns on the reference member 20 are projected on the reverse side (the pattern side) of the device reticle, the intensity of light reflected by the reticle can be weakened depending upon the shape of the reticle pattern. In this case, it is preferable that the measuring point in the exposure region IF of the projection optical system PL is shifted and the measurement be performed again.

As for the measuring points (positions corresponding to the aperture patterns 21b to 21e shown in FIG. 3) set in the periphery of the exposure region IF, the positions of the aperture patterns 21b to 21e on the reference member 20 may be so set that the projected image of each of the aperture pattern is deviated from the pattern forming region in the reticle. This embodiment exhibits an advantage that aperture patterns are formed at the four corners (the actual use regions in which each aberration becomes maximum) of the exposure region. As a result, a satisfactory reliability can be realized since the maximum aberration position is measured. If the aperture pattern is deviated from the exposure region, the aberration is allowed to present.

In the aforesaid embodiments, the reticle R forms the mask pattern, the wafer W forms the photosensitive substrate, the aperture patterns 21 form the reference pattern, the photodetector 28 forms the light receiving means, the focus state detecting portion 32A forms the focus state detection means and the image forming characteristics measuring portion 32B forms the image forming characteristic measuring means.

<Modification for Applying Image Forming Characteristics Illumination Light from Reticle Side>

The aforesaid embodiments are arranged in such a manner that the reference member 20 having the aperture patterns 21 is disposed on the Z-stage 14, image forming characteristic illumination light of the projection optical system PL is applied from a portion below the stage and light reflected by the reverse side of the reticle is again received by the photodetector 28 via the projection optical system PL and the apertures 21. However, the aforesaid measuring illumination light may be applied.

A test reticle having aperture patterns is used, the reference reflecting surface on the wafer stage is irradiated with measuring illumination light via the projection optical system PL, and light reflected by the reference reflecting surface is received by a photodetector by the projection optical system PL and the aperture patterns in the reticle. In this case, the photodetector is positioned to hold a substantially conjugated relationship with the reticle. If the test reticle is not used, the image forming characteristics can be similarly obtained by forming a plurality of the aperture patterns shown in FIGS. 2A, 2B, 11A and 11B in the device reticle.

Although the description is made about the contraction type projection exposure apparatus for manufacturing the semiconductor integrated circuits, the present invention may be applied to other projection exposure apparatus, for example, an exposure apparatus for use to manufacture large-size liquid crystal devices.

The apparatus according to the aforesaid embodiments can be applied to a plane position detection apparatus for detecting the plane position of a second substrate with respect to a first substrate.

A projection exposing apparatus according to the third embodiment of the present invention will be described below with reference to the accompanying drawings. In this embodiment, the present invention is applied to a projection exposing apparatus used in the manufacture of a semiconductor integrated circuit.

Figure 23:
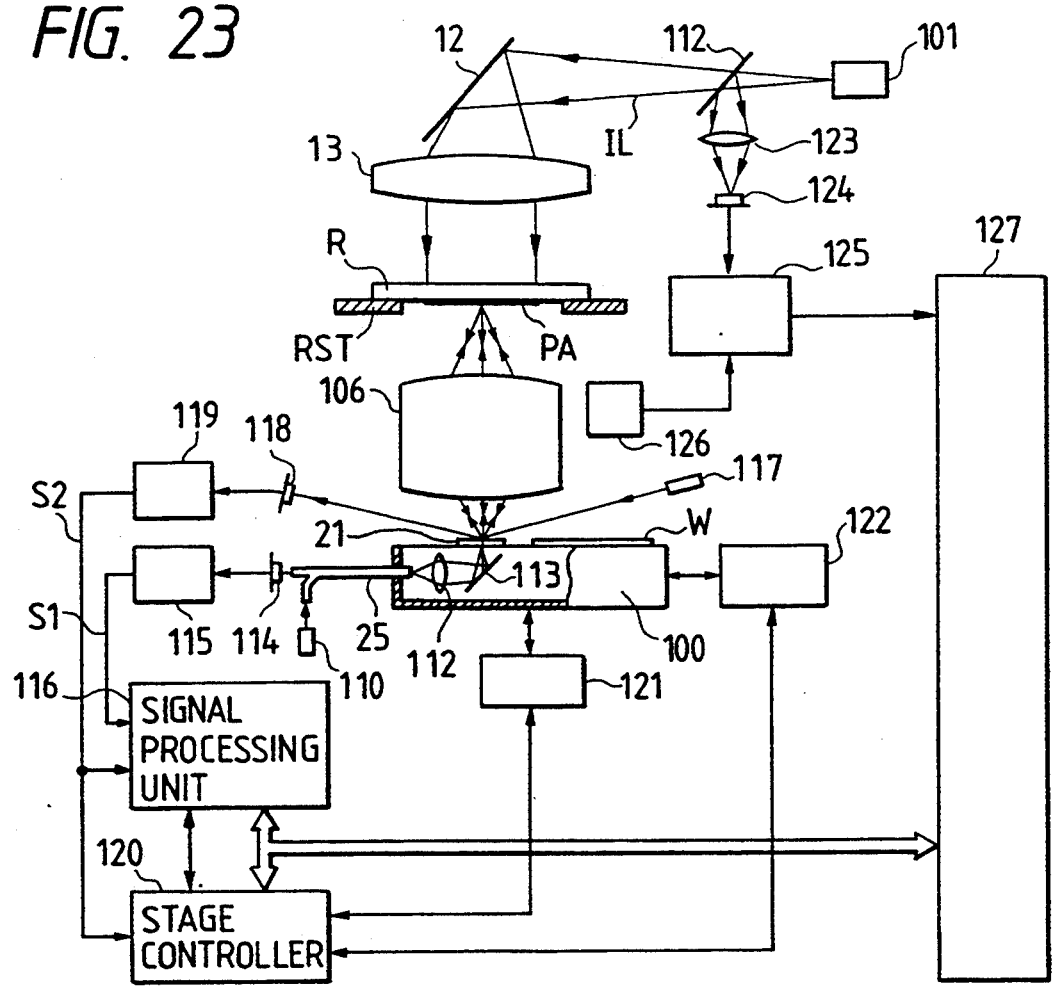
FIG. 23 is a diagram including a partial sectional view showing the arrangement of the overall projection exposing apparatus according to the third embodiment of the present invention.

FIG. 23 shows the arrangement of the entire apparatus of this embodiment, and the same reference numerals in FIG. 23 denote the same parts as in FIG. 1.

In FIG. 23, an illumination optical system 101 is constituted by a light source for generating illumination light such as a g line, an i line, a j line, or ultraviolet pulse light (e.g., KrF excimer laser light) in a wavelength band having photosensitivity with respect to a resist, an optical integrator for uniforming illumination light from the light source, and the like. Most of illumination light IL emerging from the illumination optical system 101 is transmitted through a semi-transmissible mirror 112, and reaches a mirror 12. The illumination light is reflected vertically downward by the mirror 12, and is guided toward a main condenser lens 13. The illumination light IL converted into substantially parallel rays by the condenser lens 13 illuminates a pattern region PA of a mask (synonymous with "reticle") supported on a stage RST with a uniform illuminance.

Figure 24:
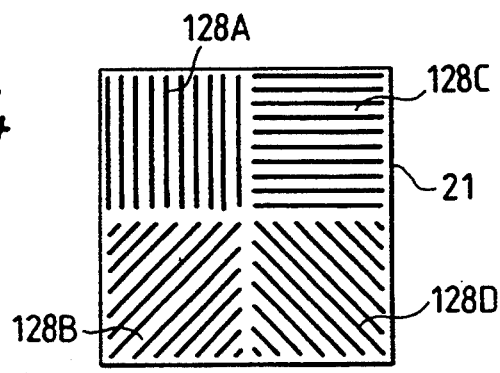
FIG. 24 is a plan view showing a diffraction grating pattern of a reference pattern plate 21 of the third embodiment.

A projection optical system 106 is telecentric on both sides. A reference pattern plate 21 and a wafer W are arranged parallel to each other on the upper surface of a wafer stage 100. As shown in FIG. 24, the upper surface of the reference pattern plate 21 is formed with an amplitude type diffraction grating 128A defined by lines and spaces at predetermined pitches, and diffraction gratings 128B, 128C, and 128D which are defined by gratings obtained by rotating the diffraction grating 128A counterclockwise through 45°, 90°, and 135°, respectively. These four different diffraction gratings 128A to 128D constitute a reference pattern of this embodiment. The reason why the diffraction gratings are formed in various directions is to eliminate the influence of the pattern on the mask M, and to allow measurement of focus positions in sagittal (S) and meridional (M) directions (i.e. of astigmatism) at an arbitrary point in the image field of the projection optical system 106. The diffraction grating formation surface of the reference pattern plate 21 and the exposure surface of the wafer W are set to be flush with each other in the optical axis direction of the projection optical system 106. Note that a pattern formed on the reference pattern plate 21 may be constituted by phase type diffraction gratings.

Although simply illustrated in FIG. 23, the wafer stage 100 is constituted by an XYθ stage, a Z stage, and a leveling stage. The XYθ stage performs rectilinear movement and fine rotation in a two-dimensional plane perpendicular to the optical axis of the projection optical system 106, the Z stage moves the reference pattern plate 21 and the wafer W in the optical axis direction (Z-direction) of the projection optical system 106, and the leveling stage adjusts the inclination of the exposure surface of the wafer W, and the like. In this case, the moving amount of the XYθ stage in the two-dimensional plane is always detected by X- and Y-axis laser interferometers at a resolution of, e.g., about 0.01 μm. On the other hand, the movement of the reference pattern plate 21 and the wafer W in the Z-direction along the optical axis of the projection optical system 106 is measured by a rotary encoder attached to, e.g., a ball screw for Z-axis driving. More specifically, since the pitch of the ball screw is known with high precision, up-down pulses output from the rotary encoder are accumulatively counted by a counter circuit, which is reset at a predetermined machine origin, and the count value is subjected to a predetermined calculation, thereby obtaining the position in the Z-direction.

Note that the moving amount in the Z-direction may be measured by, e.g., a laser interferometer.

An illumination light source 110 for a reference pattern is realized by guiding some light components of illumination light emitted from the light source in the illumination optical system 101 for the mask R via an optical system (not shown). The illumination light from the illumination light source 110 is guided toward the lower surface of the reference pattern plate 21 via a light guide 25, and a focusing lens system 112 and a mirror 113, which are arranged inside the wafer stage 100. Some light components of the illumination light from the lower surface side of the reference pattern plate 21 are diffracted by the grating pattern, and are transmitted through the plate 21 toward the upper surface side. When the reference pattern plate 21 is present within an image circle of the projection optical system 106, the illumination light including diffracted light transmitted through the reference pattern plate 21 toward the upper surface side converges via the projection optical system 106 onto the pattern region PA on the lower surface of the mask R, and is reflected by the pattern region PA. The reflected light returns to the upper surface of the reference pattern plate 21 via the projection optical system 106 again.

Of the returning light, light components transmitted through the reference pattern on the reference pattern plate 21 become incident on a photoelectric sensor 114 via the mirror 113, the focusing lens system 112, and the light guide 25. A detection signal (to be referred to as a "calibration signal") hereinafter) S1 obtained by amplifying a signal output from the photoelectric sensor 114 to an optimal level by an amplifier 115 indicates the intensity of light transmitted through the reference pattern of the reference pattern plate 21, and is supplied to a signal processing unit 116. The calibration signal S1 is maximized when the diffraction grating formation surface of the reference pattern plate 21 is at an in-focus position with respect to the projection optical system 106. For this reason, even when the imaging characteristics of the projection optical system 106 change due to absorption of exposure light, the true in-focus point (best focus position) at an arbitrary point in the image field of the projection optical system 106 can be detected by obtaining the detection signal S1 at a proper time (e.g., even during an exposure operation for a single wafer).

When the gratings formed on the reference pattern plate 21 are phase gratings, the calibration signal S1 is minimized at the in-focus point.

In this case, since the light source of the illumination light source 110 is realized by guiding light emitted from the light source of the illumination optical system 101, the wavelength of light illuminating the reference pattern plate 21 from the below is originally the same as that of light illuminating the mask R from the above. However, since optical systems for guiding these light beams have different arrangements, the wavelength ranges of the two light beams may become slightly different from each other at the time of illumination.

Note that the illumination light source 110 may be arranged independently of the optical system 101. The exit surface of the light guide 25 is substantially conjugate with the pupil plane of the projection optical system, and its illumination conditions (the value of a coherence factor σ, and the like) are preferably set to be equal to those of the mask R by the illumination optical system 101.

A light source 117 emits detection light obliquely with respect to the optical axis of the projection optical system 106. The detection light from the light source 117 converges at the central portion of the image circle of the projection optical system 106 via an oblique input optical system (not shown). In the state illustrated in FIG. 23, since the reference pattern plate 21 is arranged on the image circle, the detection light converges on the reference pattern formation surface of the reference pattern plate 21. The light reflected by the reference pattern formation surface is radiated onto the light-receiving surface of a photoelectric sensor 118 comprising, e.g., a position detection type light-receiving element (PSD) via an oblique output optical system (not shown). When the reference pattern plate 21 moves in the optical axis direction of the projection optical system 106, since the center-of-gravity position of light on the light-receiving surface of the photoelectric sensor 118 changes, the position of the reference pattern plate 21 in the optical axis direction can be detected on the basis of the center-of-gravity position. A detailed arrangement of the oblique input type focus position detection optical system with the above-mentioned arrangement is disclosed in, e.g., U.S. Pat. No. 4,650,983.

Although not shown, a collimator type levelling optical system for measuring an inclination of the reference pattern plate 21 or the wafer W with respect to the imaging plane of the projection optical system 106 is arranged outside a focus position detection optical system including the light source 117 and the photoelectric sensor 118, as disclosed in, e.g., U.S. Pat. No. 4,558,949.

A signal output from the photoelectric sensor 118 is supplied to an analog signal processing circuit 119. The analog signal processing circuit 119 generates a signal (to be referred to as a "focus position detection signal" hereinafter) S2 indicating the position of the projection optical system in the optical axis direction of the center-of-gravity positions of light on the light-receiving surface of the photoelectric sensor 118, and supplies the focus position detection signal S2 to the signal processing unit 116 and a stage controller 120. More specifically, the focus position detection signal S2 indicates the position of the reference pattern plate 21 or the wafer W in the optical axis direction of the projection optical system 106, and indicates a focus position by the indirect method. Therefore, in order to detect an in-focus point using the focus position detection signal S2, the focus state of the reference pattern plate 21 or the wafer W with respect to the projection optical system 106 is checked in advance by the direct method, and the offset is adjusted (calibration of the focus detection optical system (117, 118)), so that the level of the focus position detection signal S2 at the best focus point or a position near it becomes a predetermined level (to be referred to as a "false in-focus level" hereinafter, as will be described later. Thereafter, the movement of the Z stage in the Z-direction need only be controlled, so that the signal S2 has a false in-focus level. As the false in-focus level, for example, "0" is used.

Assuming that the level of the focus position detection signal S2 is "0" when the reference pattern plate 21 or the like is present at the in-focus point of the projection optical system 106, if the reference pattern plate 21 moves upward (or downward), the level of the signal S2 changes in, e.g., the negative (or positive) direction. However, when the moving amount becomes large, the light amount on the light-receiving surface of the photoelectric sensor 118 is decreased, and the level of the signal S2 approaches "0". For this reason, the signal S2 changes in an S-shaped curve pattern in association with the Z position of the reference pattern plate 21, or the like. At the central portion of the S-shaped curve signal, the relationship between the Z-coordinate and the signal S2 can be considered as almost a linear one. The photoelectric sensor 118 may be constituted by a vibration mirror, a slit, a photomultiplier, and the like as in a photoelectric microscope. In this case, when a photoelectric conversion signal output from the photomultiplier is synchronously detected by a signal output from the vibration mirror, a clearer S-shaped curve signal can be obtained.

In order to perform a calibration of the focus position detection optical system (117, 118) by setting a predetermined offset to the level of the focus position detection signal S2 at, e.g., the in-focus point, optical and electrical methods are available. When the offset is to be optically set, the distribution of the light amount on the light-receiving surface of the photoelectric sensor 118 can be changed to that at a predetermined position by the following method in a state wherein the reference pattern plate 21 is located at the predetermined position in the Z-direction.

As a calibration method of the focus position detection optical system (117, 118), a method of finely adjusting the position of the light source 117, or a method of finely adjusting the incident angle of illumination light emitted from the light source 117 by adjusting the oblique input optical system are available. Furthermore, when a plane-parallel glass is arranged in front of the photoelectric sensor 118, and the angle of the plane-parallel glass is changed, since the distribution of the light amount on the light-receiving surface of the photoelectric sensor 118 changes, the calibration can also be performed by this method. Moreover, an offset may be electrically added, so that the value of the signal S2 becomes the in-focus level.

As another method of adjusting the offset, the value of the focus position detection signal S2 at the best focus point or at a predetermined position near it is stored as the false in-focus level, and thereafter, the signal S2 is controlled to have the false in-focus level. This method can also allow offset adjustment.

In this manner, since the focus position detection signal S2 is a signal indicating an in-focus point by the indirect method, when the position of the imaging plane (focal point) of the projection optical system 106 changes due to absorption of exposure light, the in-focus point where the signal S2 has the false in-focus level may deviate from an actual in-focus point. In order to prevent this, according to this embodiment, the offset of the focus position detection signal S2 is set (calibration of the focus position detection optical system (117, 118)) at a proper time using the calibration signal S1.

In FIG. 23, the signal processing unit 116 stores the calibration signal S1 and the focus position detection signal S2 in a memory, and calculates the Z-coordinate of the best focus point or a predetermined position near it. The unit 116 then supplies the Z-coordinate information to the stage controller 120. The stage controller 120 is connected to a Z-axis driving system 121 for controlling the operation of the Z stage in the wafer stage 100, and to an XYθ driving system 122 for controlling the operation of the XYθ stage in the wafer stage 100. In order to calibrate the focus position detection signal S2, the stage controller 120 sets the Z-coordinate of the reference pattern plate 21 to be the coordinate supplied from the signal processing unit 116 via the Z-axis driving system 121, and thereafter, adjusts, e.g., the position of the light source 117, thereby adjusting the offset of the focus position detection signal S2. Similarly, the stage controller 120 adjusts the positions of the reference pattern plate 21 and the wafer W on the wafer stage 100 in the optical axis direction of the projection optical system 106 through the XYθ driving system 122.

Some light components of the illumination light IL are extracted by the semi-transmissible mirror 112, and the extracted light is focused on the light-receiving surface of a radiation amount sensor 124 comprising, e.g., a light-receiving element via a focusing optical system 123. A photoelectric conversion signal output from the radiation amount sensor 124 is supplied to a sensor control unit 125. An environment sensor 126 is arranged near the projection optical system 106. The environment sensor 126 measures an ambient atmospheric pressure, temperature, humidity, and the like around the projection optical system 106, and supplies the measurement result to the sensor control unit 125. A main computer 127 controls the operation of the entire apparatus. The sensor control unit 125 supplies to the main computer 127 radiation amount information obtained by integrating a signal output from the radiation amount sensor 124, and information of the atmospheric pressure, temperature, humidity, and the like around the projection optical system 106. The main computer 127 supplies commands for instructing predetermined operations to the signal processing unit 116 and the stage controller 120, and the signal processing unit 116 and the stage controller 120 supply data such as the signals S1 and S2, and the like to the main computer 127.

The operation of the entire apparatus executed when the focus position detection signal S2 is to be calibrated in the exposing apparatus shown in FIG. 23 will be described below with reference to FIG. 25. In this case, assume that a position having a Z-coordinate $Z_B$ of the Z stage of the wafer stage 100 is set as the in-focus point by, e.g., the previous calibration.

Figure 25:
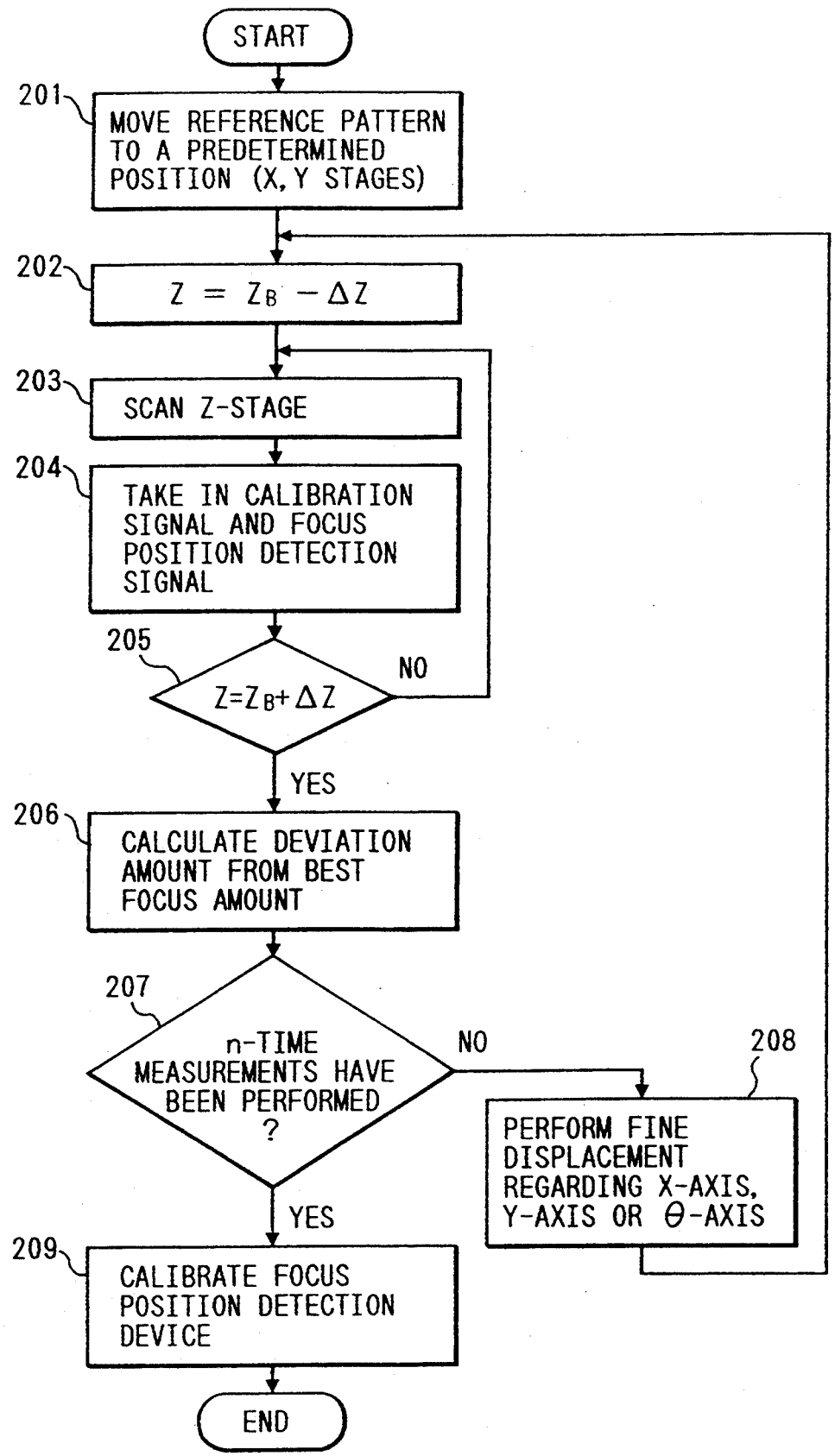
FIG. 25 is a flow chart showing the operation of the overall apparatus executed when a calibration of a focus position detection signal S2 is performed in the third embodiment.

In step 201 in FIG. 25, the main computer 127 operates the XY$\theta$ stage in the wafer stage 100 via the stage controller 120 so as to move the reference pattern plate 21 to a desired measurement point in the image circle of the projection optical system 106. In step 202, the Z-coordinate of the Z stage in the wafer stage 100 is moved downward by $\Delta Z$ from $Z_B$ as the current in-focus point. The interval $\Delta Z$ is selected to satisfy $\Delta Z > Z_{MAX}$ where $Z_{MAX}$ is the absolute value of the estimated maximum variation, in the Z-direction, of the imaging plane of the projection optical system 106.

In step 203, the main computer 127 causes the Z-coordinate of the Z stage to scan upward from $(Z_B - \Delta Z)$ at a substantially constant speed via the stage controller 120 and the Z-axis driving system 121. When this scanning operation is started, the signal processing unit 116 parallelly fetches the calibration signal S1 and the focus position detection signal S2 in synchronism with predetermined sampling pulses, and writes them in the memory in step 204. In step 205, the stage controller 120 checks if the Z-coordinate of the Z stage has reached $(Z_B + \Delta Z)$. If NO in step 205, the flow returns to step 203 to continue scanning in the Z-direction. If it is determined in step 205 that the Z-coordinate has reached $(Z_B + \Delta Z)$, the flow advances to step 206.

In step 206, the signal processing unit 116 calculates a deviation amount $\delta Z$ between the Z-coordinate of the best focus point or a position near it calculated from the calibration signal S1, and the Z-coordinate of the false in-focus point calculated from the focus position detection signal S2. In this case, as shown in steps 207 and 208, when the operations in steps 202 to 206 are repeated n times (n is an integer equal to or larger than 2), the measurement precision of the deviation amount can be increased. Furthermore, in step 208, every time one deviation amount is calculated, the XY$\theta$ stage is driven to finely displace the reference pattern plate 21 within a plane perpendicular to the optical axis of the projection optical system 106. with this displacement, since the projection positions of images of the diffraction gratings on the reference pattern plate 21 onto the pattern region PA of the mask R displace finely, the influence of the pattern on the pattern region can be eliminated, and a decrease in measurement precision can be prevented.

Note that another sequence may be employed. That is, if it is determined in step 207 that the measurement has not been performed n times yet, the flow may immediately return to step 202.

Thereafter, in step 209, the signal processing unit 116 supplies to the stage controller 120 a deviation amount $<\delta Z>$ obtained by averaging the deviation amounts $\delta Z$ each between the Z-coordinate of the best focus point or a position near it and the Z-coordinate of the false in-focus point calculated from the focus position detection signal S2. Thereafter, the stage controller 120 determines as an in-focus point a value $(Z_B + <\delta Z>)$ obtained by adding $<\delta Z>$ to the value $Z_B$ of the Z-coordinate set by the previous calibration, and adjusts the offset, so that the focus position detection signal S2 has the predetermined false in-focus level at this in-focus point.

Prior to the description of the details of step 204 in FIG. 25, the detailed circuit arrangement of the signal processing unit 116 will be described below with reference to FIG. 26.

Figure 26:
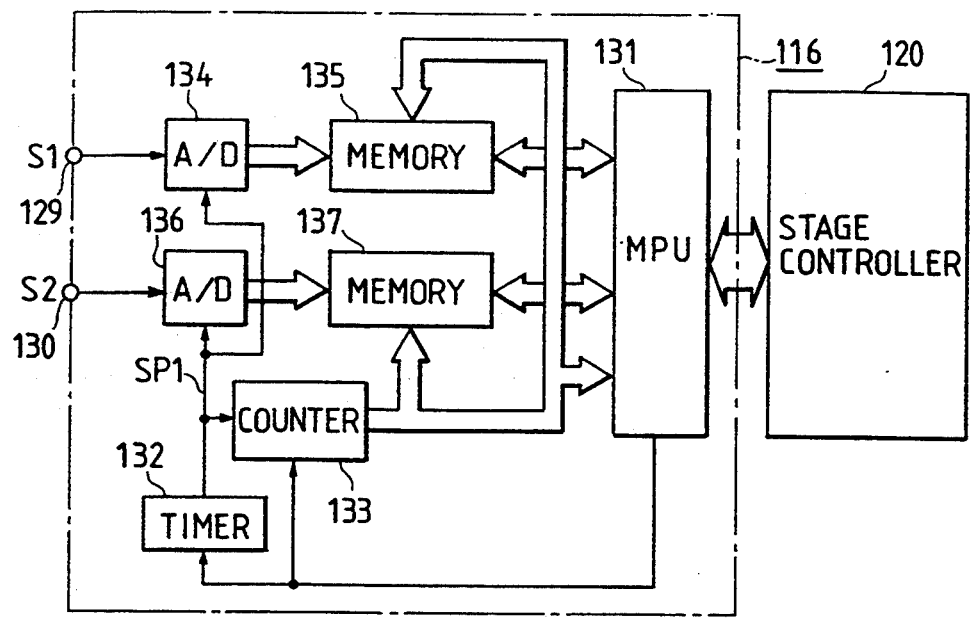
FIG. 26 is a block diagram showing an arrangement of a signal processing unit 116 of the third embodiment.

FIG. 26 shows an arrangement of the signal processing unit 116. Referring to FIG. 26, input terminals 129 and 130 respectively receive the calibration signal S1 and the focus position detection signal S2. The signal processing unit 116 includes a microprocessor (to be abbreviated to as an "MPU" hereinafter) 131, a timer 132, and a counter 133. When the calibration of the signal S2 is started, and the Z stage begins to scan, the MPU 131 resets a count value of the counter 133, and enables the output gate of the timer 132. The timer 132 generates sampling pulses SP1 which go to high level "1" at predetermined time intervals, and supplies the sampling pulses SP1 to a count pulse input terminal of the counter 133, and sampling pulse input terminals of analog/digital (A/D) converters 134 and 136.

Memories 135 and 137 comprise RAMs, and have address input portions, which receive the count value output from the counter 133. As the count value of the counter 133 increases, the calibration signal S1 is sequentially written in an address area of the memory 135, which area is determined by the count value, via the A/D converter 134, and the focus position detection signal S2 is sequentially written in an address area of the memory 137, which area is determined by the count value, via the A/D converter 136. Upon completion of the scanning of the Z stage, the MPU 31 disables the output gate of the timer 132, and inhibits data write accesses to the memories 135 and 137.

Figure 27A:
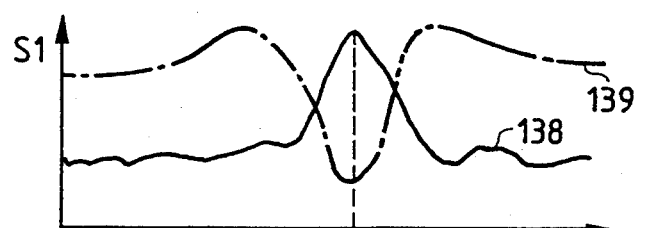
FIGS. 27A and 27B are waveform charts respectively showing a calibration signal S1 and the focus position detection signal S2, which are fetched time-serially.
Figure 27B:
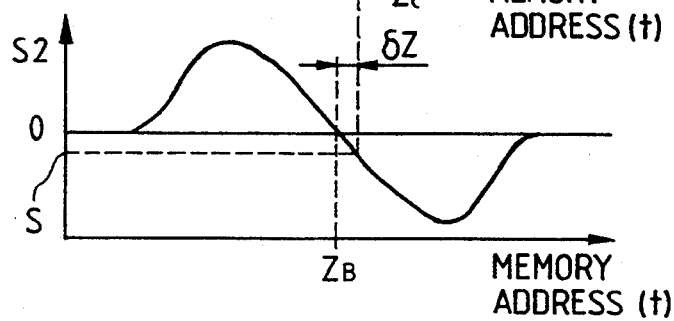

As a result, the calibration signal S1 indicated by a solid curve 138 in FIG. 27A is stored at a series of address areas of the memory 135, and the focus position detection signal S2, which changes in an S pattern to have "0" as the center, as shown in FIG. 27B, is stored in the series of address areas of the memory 137. Although the address is plotted along the abscissa of each of FIGS. 27A and 27B, since the sampling pulses SP1 of this embodiment are a pulse train, which goes to high level "1" at predetermined time intervals, the address can be considered as time t. Furthermore, since the Z stage is moved upward at a substantially constant speed, an approximate value of the Z-coordinate of the Z stage can be calculated by linearly transforming the time t (or the address value).

In the case shown in FIGS. 27A and 27B, the address corresponding to the maximum value of the calibration signal S1 is an address corresponding to a best focus point $Z_C$, and the address corresponding to "0" level of the focus position detection signal S2 in its S-shaped curve characteristics is an address corresponding to the in-focus point $Z_B$ set in the previous calibration. When the gratings formed on the reference pattern plate 21 are phase gratings, the signal S1 has a minimum value at the best focus point $Z_C$, as indicated by an alternate long and short dashed curve 139 in FIG. 27A. Therefore, in either case, the deviation amount $\delta Z$ on the Z-coordinate can be calculated by performing a predetermined linear arithmetic operation of a deviation address amount obtained by subtracting the address of the zero-crossing point of the signal S2 from the address of the convex or concave peak of the signal S1. This deviation amount $\delta Z$ is supplied to the stage controller 120 (FIG. 23) as the current calibration amount. The stage controller 120 adjusts the offset, so that the value of the focus position detection signal S2 becomes "0" at the position having a Z-coordinate of $(Z_B + \delta Z)$.

In the above description, the Z stage is scanned at a substantially constant speed. However, when the Z stage is scanned not at a constant speed, a signal intensity S of the focus position detection signal S2 corresponding to the peak position of the signal S1 in FIG. 27A is obtained. If the relationship between the Z-coordinate and the signal intensity of the focus position detection signal S2 near the previous in-focus point $Z_B$ is obtained in advance, the Z-coordinate of the Z stage can be calculated from the signal intensity S of the signal S2, and the deviation amount $\delta Z$ for the previous in-focus point $Z_B$ can be calculated.

Figure 28A:
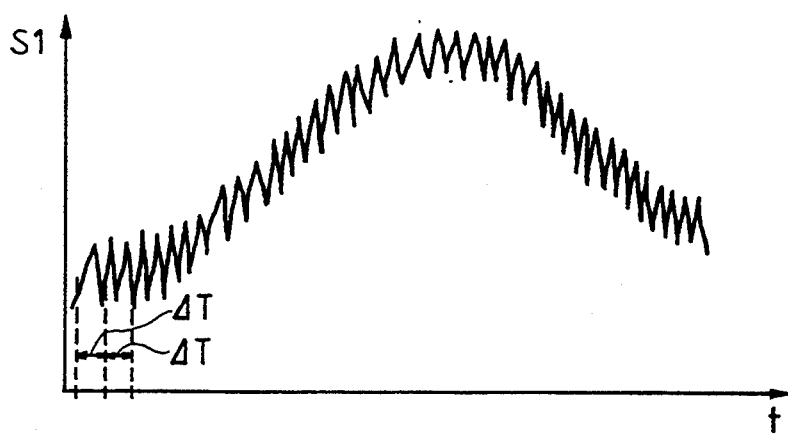
FIGS. 28A to 28C are waveform charts for explaining a case wherein the calibration signal S1 is fetched time-serially.
Figure 28B:
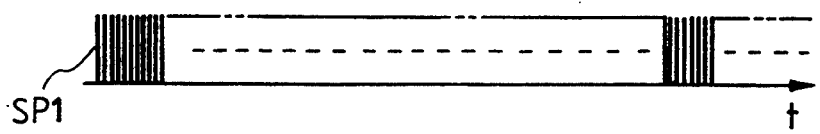
Figure 28C:
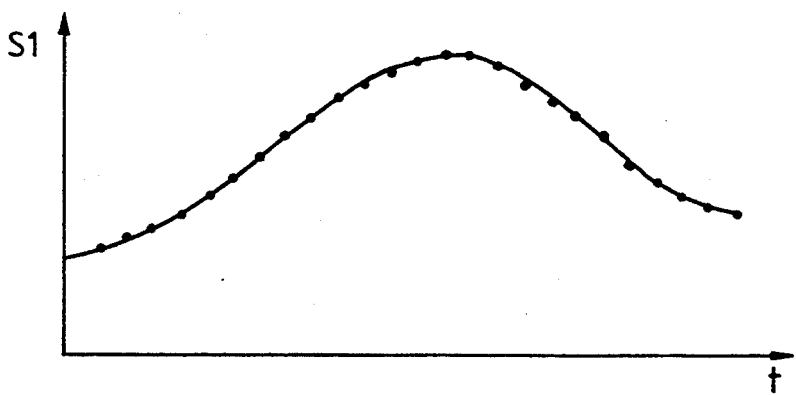

FIGS. 27A and 27B show the results obtained when the Z stage is scanned at a substantially constant speed, and the signals S1 and S2 are stored in the memories 135 and 137 (FIG. 26) by a time base reference method. When the time base reference method is employed, the following advantages are expected. For example, the calibration signal S1 will be exemplified below. As shown in FIG. 28A, a kind of high-frequency noise is superposed on the signal S1 in practice due to electrical noise or instability of the driving mechanism in the Z-direction. In order to digitally remove such high-frequency noise, the frequency of the sampling pulses SP1 (FIG. 28B) of the signal S1 may be increased, and sampled signals S1 may be averaged at every predetermined time interval $\Delta T$. With the time base reference method, the frequency of the sampling pulses SP1 can be very easily increased by only changing the characteristics of the timer 132 (FIG. 26), and a smooth signal S1 can be obtained by averaging, as shown in FIG. 28C.

In contrast to this, in a position reference method for storing the signals S1 and S2 in synchronism with the measurement result of a length measuring device for detecting a displacement in the Z-direction, it is relatively difficult to increase the frequency of the sampling pulses, and the frequency tends to have a lower setting limit.

Figure 29:
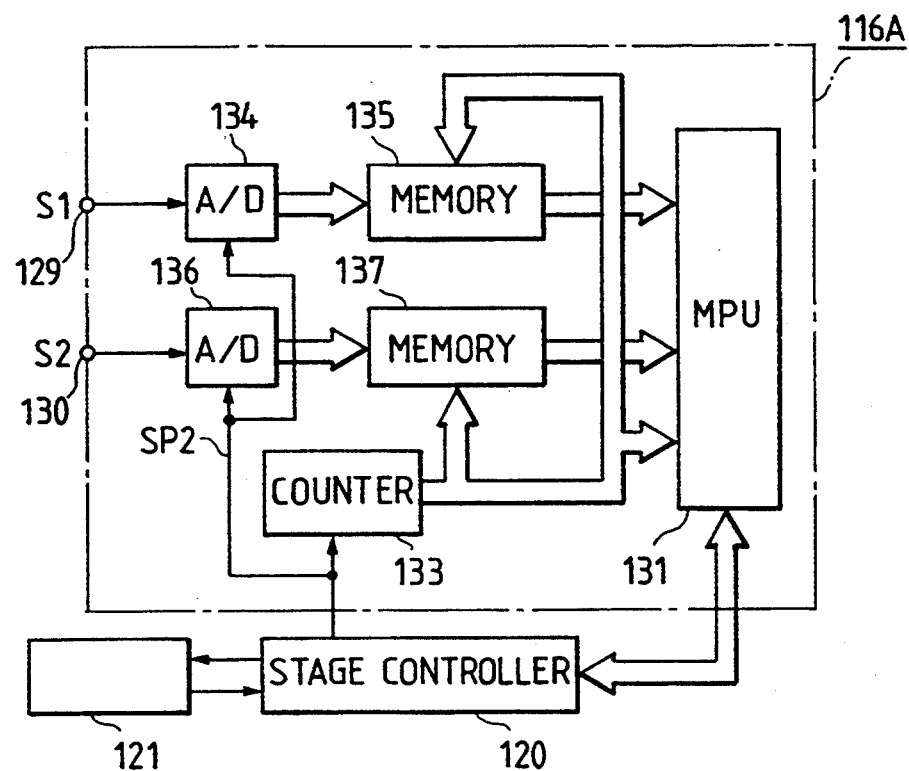
FIG. 29 is a block diagram showing another arrangement of the signal processing unit 116 of the third embodiment.

However, in some cases, since the signals S1 and S2 may be stored by the position reference method in step 204 in FIG. 25, such a case will be described below. The signal processing unit 116 used when the signals S1 and S2 are stored by the position reference method will be referred to as a signal processing unit 116A, and the arrangement of this signal processing unit 116A is shown in FIG. 29. In FIG. 29, the same reference numerals denote the same parts as in FIGS. 23 and 26, and a detailed description thereof will be omitted.

In FIG. 29, the Z-axis driving system 121 incorporates a length measuring sensor for detecting a displacement of the Z stage in the Z-direction. The length measuring sensor outputs up-down, i.e., two-phase position pulses which go to high level "1" to have a 90° phase difference every time the displacement of the Z stage in the Z-direction reaches a predetermined interval, and the two-phase position pulses are supplied to the stage controller 120. The stage controller 120 accumulatively counts the two-phase position pulses to obtain the Z-coordinate of the Z stage, and generates sampling pulses SP2 which go to high level "1" every time the Z-coordinate is incremented by $d_Z$ (where $d_Z$ is the sampling interval on the Z-coordinate). As the sampling interval $d_z$, the minimum unit (e.g., 0.02 μm) of movement on the Z-coordinate is used.

The sampling pulses SP2 are supplied to the count pulse input terminal of the counter 133 and the sampling pulse input terminals of the A/D converters 134 and 136 in the signal processing unit 116A. Other arrangements are the same as those in FIG. 26. That is, the calibration signal S1 and the focus position detection signal S2 are respectively written in the memories 135 and 137 in synchronism with the sampling pulse SP2. According to the circuit shown in FIG. 29, the signals S1 and S2 can be easily stored with reference to the position of the Z stage on the Z-axis. When the length measuring sensor in the Z-direction comprises a length measuring sensor having high resolution and high precision such as a laser interferometer, it is effective to store data by the position reference method.

Referring back to FIG. 23, a method of using the radiation amount sensor 124 and the environment sensor 126 will be exemplified below. In this embodiment, the offset adjustment of the focus position detection signal S2 need only be performed once in a setup operation of the apparatus as long as the imaging characteristics of the projection optical system 106 never change. However, in practice, the position of the imaging plane (best focus point) of the pattern image formed on the mask R by the projection optical system 106 changes in accordance with the radiation amount of illumination light IL, ambient atmospheric pressure, temperature or humidity, and the like, in practice. Thus, the main computer 127 of this embodiment monitors the output signals from the radiation amount sensor 124 and the environment sensor 126 via the sensor control unit 125, and detects the environmental state of the projection optical system 106. In this case, if a change in environmental state does not exceed a predetermined threshold value, the offset value of the focus position signal S2 is changed to some extent under predictive control, thus following a variation of the imaging plane.

However, when one or a plurality of the atmospheric pressure, temperature, humidity, and radiation amount (an energy amount accumulated in the projection optical system 106 due to absorption of exposure light) exceed the corresponding threshold values, there is a fear that the predictive control may be indefinite. For this reason, the reference pattern plate 21 is moved within the image circle of the projection optical system 106, and the offset adjustment of the signal S2 is performed using the signal S1. Thus, a stable focusing operation, can be assured for a long period of time. In addition, since the calibration timing based on offset adjustment can be adequately determined, the throughput can be improved by omitting unnecessary calibrations.

Even during an exposure operation for a single wafer, the focus position detection optical system (17, 18) can be calibrated without replacing a reticle. For this reason, high-precision focus adjustment can always be assured, and a decrease in throughput caused by the calibration can be minimized.

The signal processing unit 116 shown in FIG. 23 selectively uses two different calibration methods according to the exposure conditions of the mask R. The two calibration methods will be described below.

FIG. 30 shows the calibration operation of the signal processing unit 116 shown in FIG. 23. In step 210 in FIG. 30, the main computer 127 calculates a necessary line width as the minimum line width exposed on the wafer W in accordance with information attached to the mask R in the form of, e.g., bar codes. In step 211, the main computer checks if the necessary line width is near the critical resolution of the projection optical system 106.

If it is determined in step 211 that the necessary line width is near the critical resolution, the flow advances to step 212 to give priority to an operation for resolving a pattern of the necessary line width. In step 212, the main computer 127 instructs the signal processing unit 116 to execute a calibration by a peak detection method. On the other hand, if it is determined in step 211 that the necessary line width is large enough as compared to the resolution of the projection optical system, and has a sufficient margin, the flow advances to step 213.

Figure 31A:
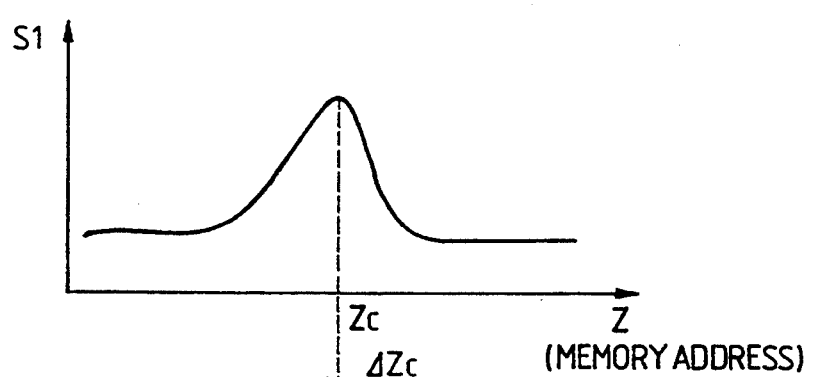
FIG. 31A is a waveform chart for explaining an in-focus point obtained by the peak detection method.

The peak detection method in step 212 will be described below with reference to FIG. 31A. In this case, assume that the memory address corresponding to the calibration signal S1 is converted into a Z-coordinate. In the peak detection method, the Z-coordinate $Z_C$ at which the calibration signal S1 has the maximum value (or the minimum value for the phase gratings) is determined as a target in-focus point (best focus point), and a deviation amount between this best focus point and the zero-crossing point $Z_B$ of the focus position detection signal S2 (FIG. 27B) is calculated. Therefore, the projection optical system 106 is used to have the imaging plane having the highest resolution as the center.

Figure 31B:
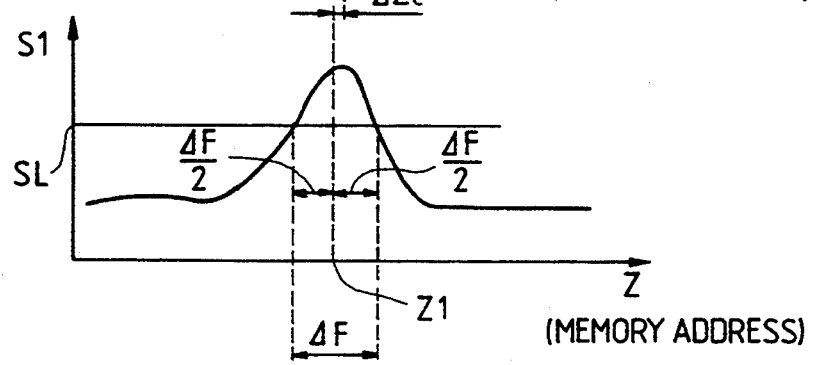
FIG. 31B is a waveform chart for explaining an in-focus point obtained by the siliced mid-point method.

In step 213, the main computer 127 calculates a width (focus margin) $\Delta F$ of the focal depth of the projection optical system 106 corresponding to the necessary line width, and supplies the information of the focus margin $\Delta F$ to the signal processing unit 116. Subsequently, the main computer 127 instructs the signal processing unit 116 to execute a calibration by a sliced mid-point method in step 214. The sliced mid-point method will be described below with reference to FIG. 31B. The signal processing unit 116 plots the sampled calibration signals S1 along the Z-coordinate, calculates two intersecting points between the signal S1 and a straight line indicating a predetermined slice level, and then calculates an interval between these two intersecting points on the Z-axis. Then, the unit 116 calculates a slice level SL when the interval between the two intersecting points coincides with the focus margin $\Delta F$, and determines a Z-coordinate $Z_I$ at the mid-point between two intersecting points between the signal S1 and a straight line indicating the slice level SL as a target in-focus point (best focus point). Thereafter, a deviation amount between this best focus point and the zero-crossing point $Z_B$ of the focus position detection signal S2 (FIG. 27B) is calculated.

If the calibration signal S1 is axial-symmetrical about the peak point on the Z-axis, the best focus point $Z_C$ obtained by the peak detection method coincides with the best focus point $Z_1$ obtained by the sliced mid-point method. However, since the calibration signal S1 is asymmetrical about the peak pint, a deviation $\Delta Z_C$ is present between the best focus points $Z_C$ and $Z_1$. Therefore, the peak detection method is a calibration method that can maximally utilize the resolution of the projection optical system 106 at the cost of the focus margin more or less, while the sliced mid-point method is a calibration method that can widen the focus margin as much as possible at the cost of the resolution of the projection optical system 106 more or less. Since these two different calibration methods are selectively used, this embodiment can cope with masks R under various exposure conditions.

Since the diffraction gratings formed on the reference pattern plate 21 of the above embodiment include gratings in various directions, as shown in FIG. 24, a good calibration signal S1 can be obtained even when a mask pattern on the mask R has a directivity. When phase type diffraction gratings are formed on the reference pattern plate 21, a phase difference between adjacent lines is set to be ¼ the wavelength. In this manner, when the reference pattern plate 21 is illuminated from the below, generated ±1st-order diffracted light has a phase difference of ¼ the wavelength from 0th-order light. When these light components are reflected by the pattern region PA of the mask R, and return to the reference pattern plate 21, another ±1st-order diffracted light of the ±1st-order diffracted light return along the same optical path as the 0th-order light. Since another ±1st-order diffracted light has a phase difference of another ¼ wavelength, the phase is shifted by ½ the wavelength from the 0th-order light as a whole. Therefore, when the diffraction grating formation surface of the reference pattern plate 21 is at an in-focus position with respect to the projection optical system 106, the 0th-order light and the ±1st-order light cancel each other, and the light-receiving intensity is minimized. When the diffraction grating formation surface of the reference pattern plate 21 is shifted from the focal plane of the projection optical system 106, the light-receiving intensity is increased since the phase difference between the 0th-order light and the ±1st-order light is not equal to ½ the wavelength.

The amplitude type diffraction gratings 128A to 128D on the reference pattern plate 21 (FIG. 24) may be constituted by an ECD (electrochromic device) matrix, a liquid crystal element matrix, or the like. When a voltage to be applied to each small element constituting the matrix is controlled, various grating patterns can be formed. For example, a grating pattern may be formed by, e.g., the ECDs to have the same conditions as the fineness (pitches, periodicity) and shape of a pattern to be transferred onto a wafer.

In the above embodiment, the calibration of the focus position detection optical system (117, 118) has been described. Alternatively, the calibration may be performed as follows. That is, in-focus points (best focus positions) at a plurality of points in the image field of the projection optical system 106 are measured using the reference pattern plate 21 and focus state detection means (110 to 115), and the best imaging plane of the projection optical system 106 is calculated based on these measurement values. Thereafter, an offset is optically or electrically added to a detection signal from the levelling optical system for detecting the inclination of the wafer surface, so that the calculated best imaging plane serves as a zero-point reference. Thus, the best imaging plane of the projection optical system 106 can always precisely coincide with the wafer (shot region) surface. As another calibration method, an optical method for inclining a plane-parallel arranged in an optical path of the optical system so as to focus light reflected by the wafer on the center of a four-split light-receiving element used as a photoelectric sensor is also available. An inclination detection region on the wafer surface by the levelling optical system is determined to have the same size and shape as those of one shot region on the wafer by means of a variable field stop or the like arranged in the optical system.

The levelling optical system is not limited to the collimator type. For example, an optical system (to be referred to as a surface position detection optical system hereinafter) which can detect the position of the wafer in the optical axis direction (Z-direction) of the projection optical system 106 at each of a plurality of predetermined points in the image field of the projection optical system, may be used. When this optical system is adopted, it can have both the functions of the focus position detection optical system and the levelling optical system in the above embodiment. The surface position detection optical system may be realized by a method of arranging a plurality of focus position detection optical systems (117, 118), a method of forming one or a plurality of elongated slits on the wafer surface (within the range of the image field of the projection optical system 106), and receiving split slit images by, e.g., a one- or two-dimensional image sensor (the detection principle is the same as that of the focus position detection optical system (117, 118)), or the like. When the surface position detection optical system is adopted, it is desirable that a plurality of measurement points of the optical system in the image field of the projection optical system 106 are caused to coincide with a plurality of detection points of in-focus points by the focus state detection means (110 to 115). When a plurality of reference patterns 21 are formed in a region corresponding to the image field of the projection optical system 106 in correspondence with the plurality of detection points of the surface position detection optical system, the XYθ stage need not be moved upon detection of the in-focus points (best focus positions) at the plurality of points, and the measurement time can be shortened. At this time, at least a plurality of photoelectric sensors 114 of the focus state detection means (110 to 115) need be arranged.

Figure 32:
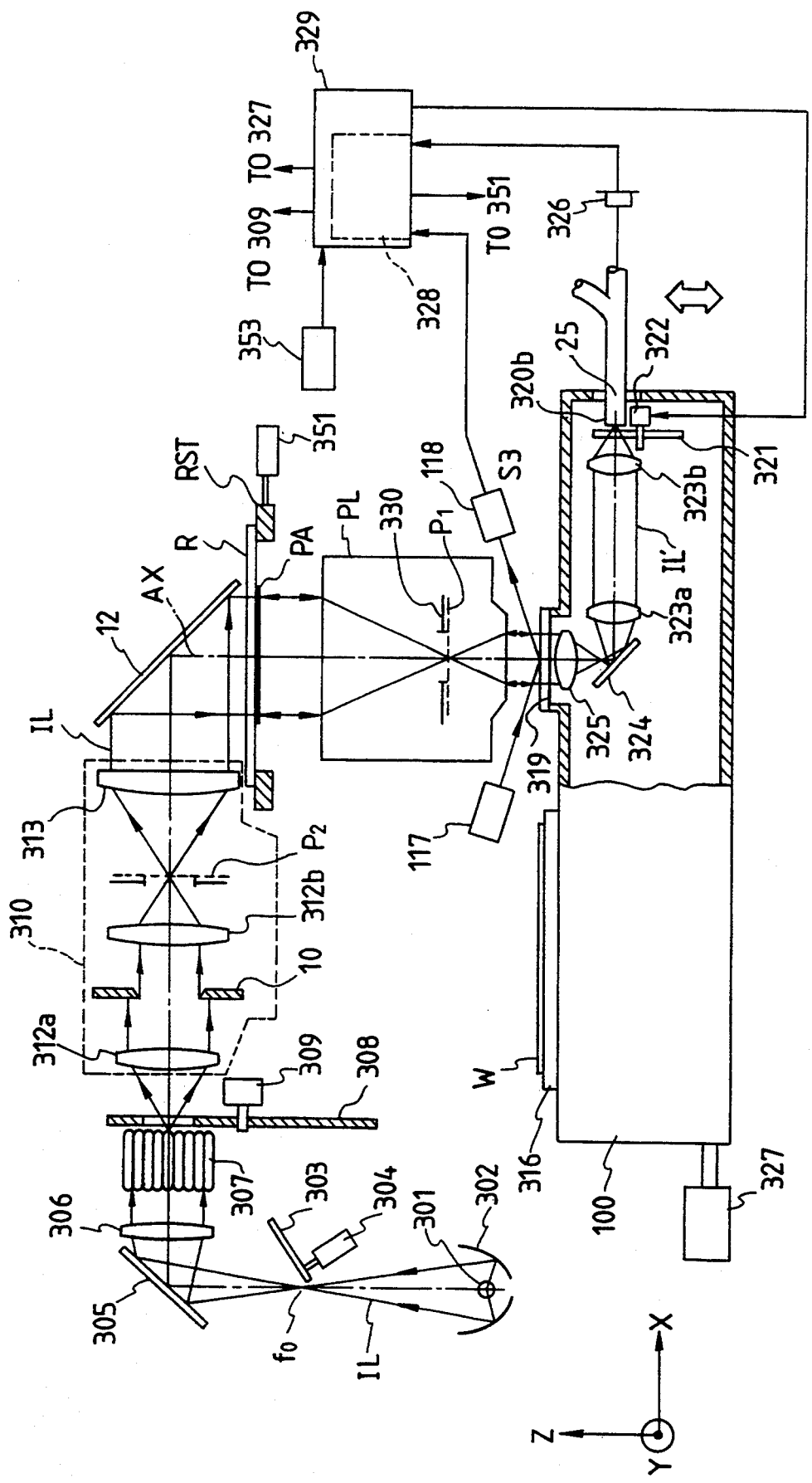
FIG. 32 is a schematic view showing a fourth embodiment of the projection exposing apparatus according to the present invention.

FIG. 32 is a plan view which illustrates the schematic structure of a fourth embodiment of the projection exposing apparatus. Referring to FIG. 32, the same elements as those shown in FIG. 23 are given the same reference numerals. Referring to FIG. 32, a light source 301, such as a very-high-pressure mercury lamp, emits illumination light (i beam) IL having a wavelength region which sensitizes a resist layer. As the exposing power source, any one of the following sources may be employed: bright lines of a mercury lamp or the like; KrF or ArF eximer laser beams; higher harmonic waves such as metal vapor laser or YAG laser. The illumination light IL is reflected by an elliptical mirror 302 to be converged to a second focal point $f_0$ of the elliptical mirror 302. Then, the light IL is incident on a mirror 305, a collimator lens 306 and a fly-eye lens 307. The fly-eye lens 307 has, on the emission side thereof, a variable diaphragm 8 so that the illumination conditions can be varied depending upon the type of the reticle and the periodicity of the pattern. The variation of the illumination conditions can be realized by operating the variable diaphragm 308 by rotating a motor 309.

Further, a shutter (for example, a four-blade rotary shutter) 303 is disposed adjacent to the second focal point $f_0$, the shutter 303 being capable of opening/closing an optical path. The illumination light IL, which has passed through the variable diaphragm 308, is incident on an optical system 310 including relay lenses 312a and 312b, a variable blind 10 for limiting the illumination region on the reticle R and a condenser lens 313, the illumination light IL being transmitted to a mirror 12 to be substantially downwards perpendicularly reflected. Thus, a pattern region PA of the reticle R is irradiated with a substantially uniform illuminance. The reticle R is mounted on a reticle stage RST. The reticle stage RST is able to move slightly the reticle R in directions X and Y. The reticle stage RST is also capable of slightly moving the reticle R in direction Z (in the direction of the optical axis) by a drive portion 351 so that the distance from the reticle R and the projection optical system PL can be changed. Further, the reticle R can be inclined with respect to a plane perpendicular to the optical axis AX. The illumination light IL passed through the pattern region PA is incident on the projection optical system PL which is a both-side telecentric, the projection optical system PL forming a projection image of a circuit pattern of the reticle R on a wafer W. The wafer W has a resist layer formed on the surface thereof, the wafer W being so held on a wafer stage 100 that the surface of the wafer W substantially coincides with the best image-forming surface. The circuit pattern is imaged and projected to be superposed on one shot region on the wafer W (in order to easily make the explanation, the circuit pattern is not imaged on the wafer W in the structure shown in FIG. 32). The wafer W is attracted to a wafer holder 316 by means of vacuum pressure, the wafer W being held on the wafer stage 100 while interposing the holder 316. The wafer stage 100 is able to be inclined in an arbitrary direction with respect to the best image-forming plane of the projection optical system PL and as well as able to be slightly moved in the direction of the optical axis (in the direction Z). The wafer stage 100 can also be moved in two-dimensional direction (in the directions X and Y) in a step-and-repeat method. After transference and exposure of the reticle R onto one shot region on the wafer have been completed, the wafer stage 100 is moved in a stepped manner to the next shot position.

FIG. 32 illustrates an inclined-incidental type focusing system (a wafer-position detection system) composed of: an illumination optical system (the light source) 117 for supplying, toward the best imaging surface of the projection optical system PL, imaging light beams for forming a pinhole or a slit image from an inclined direction with respect to the optical axis AX; and a light receiving optical system (the photoelectric sensor) 118 for receiving reflected light beams of the imaging light beams from the surface of the wafer W. The structure and so forth of the focusing system has been disclosed in, for example, U.S. Pat. No. 4,650,983. In this embodiment, the designed best image forming plane is made to be the zero standard by previously adjusting the angle of parallel and flat glass plates (plain-parallel) (omitted from illustration) disposed in the light receiving optical system 188. As a result, calibration of the focusing system is performed.

Then, an aberration detection system will now be described. The wafer stage 100 has a pattern plate 319 disposed thereon, the pattern plate 319 having, drawn thereon, a predetermined aperture pattern for detecting the aberration as shown in FIG. 33. The pattern plate 319 is so disposed that the surface of the pattern plate 319 is on substantially the same plane on which the surface of the wafer W is placed. Light beams IL' in substantially the same wavelength region of the illumination light IL passes through a branched fiber 25, a variable diaphragm 321, relay lenses 323a and 323b, a mirror 324 and a condenser lens 325 so that the pattern plate 319 is irradiated with the light beams IL' from a position adjacent to the wafer stage 100 (from a beneath position). The illumination light beams IL' may be obtained by branching the illumination light beams IL emitted by the light source 301 or may be obtained from an individually-provided light source for emitting light beams having the same wavelength as that of the illumination light beams IL. Light beams emitted from the pattern aperture portion of the pattern plate 319 are imaged on the pattern surface PA of the reticle R after it has passed through the projection optical system PL. The light beams, which have reached the pattern plate 319, again pass through the aperture portion of the pattern of the pattern plate 319. Then, the light beams pass through the condenser lens 325, the mirror 324, the relay lenses 323a and 323b, the variable diaphragm 321 and the branched fiber 251. Then, the light beams reach the photoelectric conversion device 326. A main control system 329 controls a motor 327 to move the wafer stage 100 in the direction Z. Simultaneously, an aberration detection system 328 in the main control system 329 receive signal S3 supplied from the photoelectric conversion device 326 in synchronization with a signal supplied from the light receiving optical system 118. As a result, the aberration detection system 328 receives an output from the photoelectric conversion device 326 about the Z-directional position of the wafer stage 100. The main control system 329 also controls a motor 309 for driving the variable diaphragm 308 and a motor 322 for driving the variable diaphragm 321. The aberration detection system 328 can be used to detect the focal-point position of a TTL (Through-The-Lens) method, the aberration detection system 328 being able to detect simultaneously the focal-point position and the aberration. The main control system 329 collectively controls the apparatus as well as controls the drive portion 351. The aperture pattern is formed by combining multiple-directional patterns as shown in FIG. 33.

Since the principle for obtaining the focal-point position by the aberration detection system 328 is similar to that described with reference to FIG. 5, and therefore its description will be made briefly here. FIG. 34A is a graph showing a light quantity distribution of an image of the aperture pattern 319 reflected by the mask R, in a state where the reticle R and the pattern plate 319 are slightly deviated from a conjugate position, and again imaged via the projection optical System PL. FIG. 34B is a graph showing a light quantity distribution of an image of the aperture pattern 319 reflected by the mask R, in a state where the reticle R and the pattern plate 319 are at conjugate positions, and again imaged via the projection optical system PL. FIG. 34C is a graph showing an example of the standard pattern plate 319. Referring to FIG. 34C, the standard pattern plate 319 has a light shielding portion 319 made of a chrome evaporation film or the like.

When the standard pattern 319 and the pattern surface of the reticle R are at the conjugate positions, the intensity distribution of the standard pattern plate 319 substantially coincides with the distribution of the light and dark portions of the standard pattern plate 319 as designated by distribution Ca shown in FIG. 34B. In this case, a major portion of the light beams are returned to the wafer stage 100 by way of the transmissive portion of the standard pattern plate 319. If the standard pattern plate 319 is slightly deviated from the conjugate plane with the pattern surface of the reticle R, the contrast of the image of the standard pattern plate 319 again imaged by the light beams reflected from the reticle R is, as designated by distribution Cb shown in FIG. 34A, lowered. In this case, the hatching section in the distribution Cb shown in FIG. 34A superposes on the light transmissive portion (non-transmissive portion) 319a of the standard pattern plate 319. As a result, the light beams cannot pass through the standard pattern plate 319, causing the quantity of light, which is able to reach the photoelectric conversion device 326, to be reduced.

FIG. 35 is a graph, the axis of ordinate of which stands for the output values of detection signal S3 from the photoelectric conversion device 326, and the axis of abscissa of which stands for the coordinate Z of the pattern plate 319 to show the output values from the photoelectric conversion device 326 when the aperture pattern of the pattern plate 319 is moved in the direction Z. The Z-directional position of the pattern plate 319 can be obtained from the output from the light receiving optical system 118 of the focal-point detection system.

Z-coordinate Za when the output value S3 from the photoelectric conversion device 326 is the largest value (a peak value) is attained in the case where the reticle R and the pattern plate 319 are positioned at substantially the conjugate positions. The foregoing case corresponds to the case shown in FIG. 34B. Z-coordinate Zb when the output value from the photoelectric conversion device 326 is lowered from the peak value shows a case where the reticle R and the pattern plate 319 are slightly deviated from the conjugate positions, the foregoing case corresponding to the case shown in FIG. 34A.

As described above, when the standard pattern plate 319 is at the focal-point position of the projection optical system PL, the detection signal S3 transmitted from the photoelectric conversion device 326 is made maximum. The waveform of the detection signal S3 falls at the two sides of the peak while forming concaves, as shown in FIG. 35 for example, due to the interference phenomenon of the light beams.

Figure 36:
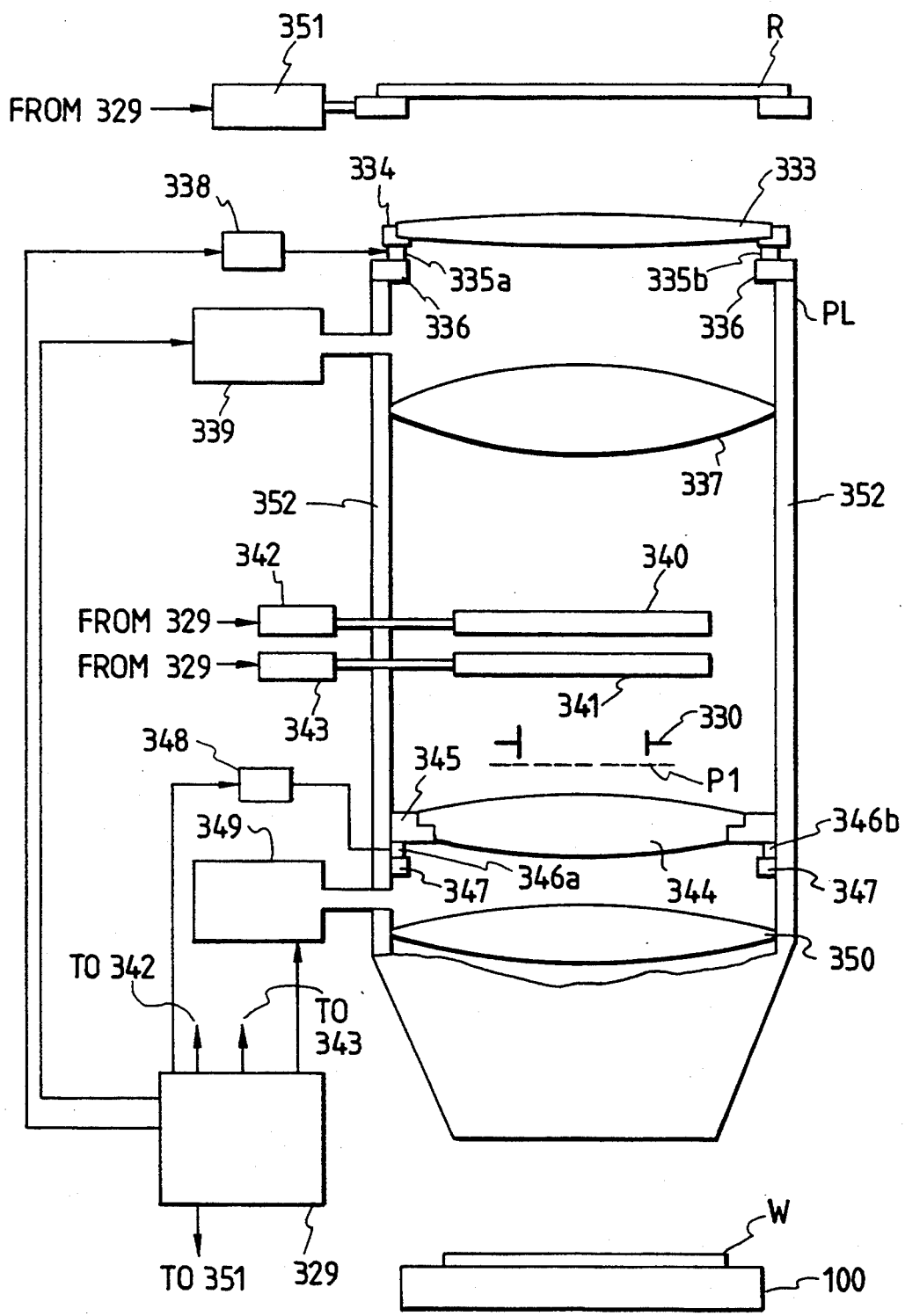
FIG. 36 is a partial view showing aberration correction means of the apparatus shown in FIG. 32.

The structure of correction means for correcting the image formation state will now be described. This embodiment is arranged in such a manner that the lens elements of the projection optical system PL and/or the pressure among the lens elements is changed to correct the image forming characteristics (the spherical aberration, the comatic aberration, the astigmatism, and the curvature of field). Therefore, a portion of the optical elements of the projection optical system PL are made movable. Further, the pressure among the optical elements of the projection optical system PL can be varied. FIG. 36 is a partial view showing the apparatus shown in FIG. 32, in which a portion for driving the reticle R, a portion for driving the optical elements of the projection optical system PL and the pressure among the optical elements can be variety. A lens element 333 positioned most adjacently to the reticle R is fixed by a support member 334 and disposed on a support member 336 while interposing a drive device 335. The support member 336 is fixed to a lens mount 352 of the projection optical system PL. The drive device 335 is composed of drive devices 335a, 335b and 335c (FIG. 36 shows only 335a and 335b) equally placed at angular intervals of 120° similarly to the drive device 48 and the like described with reference to FIG. 1. The respective drive devices can be independently controlled by a drive-device control portion 338. Although FIG. 36 shows the lens element 333 formed into a single lens, the element 333 is a lens element composed of three (or two) lens groups, the lens groups for forming the lens element 333 being arranged in such a manner that the lens groups can be independently slightly moved by a drive device (omitted from illustration).

A lens element 344 adjacent to pupil surface P1 of the projection optical system PL is fixed by a support member 345 and disposed on a support member 347 while interposing a drive device 346, the support member 347 being fixed to the lens mount 352 of the projection optical system PL. The drive device 346 is composed of drive devices 346a, 346b and 346c (FIG. 36 shows only 346a and 346b) equally placed at angular intervals of 120°. The respective drive devices can be independently controlled by a drive-device control portion 348. As the drive devices 335 and 346, electrostrictive devices or magnetostrictive devices may be used while previously obtaining the displacement of the drive device corresponding to the voltage or the magnetic field to be applied to the drive device. While considering the hysteresis characteristics, position detection units (omitted from illustration), such as capacity-type displacement sensors and differential transformers, are disposed adjacent to the drive devices. As a result, the positions of the drive devices corresponding to the voltage or the magnetic field to be applied to the drive devices can be monitored, causing a precise drive to be performed. The slight movements of the lens elements 333 and 344 are so performed that the intervals among the lens elements are varied, the lens elements are inclined with respect to a plane perpendicular to the optical axis AX and/or the lens elements are moved within a plane perpendicular to the optical axis AX. The structure and the operation for driving the optical elements as described above have been disclosed in detail in U.S. Pat. No. 5,117,255.

This embodiment is arranged in such a manner that the drive-device control portion 338 controls the foregoing drive device 335 to enable the lens element 333 adjacent to the reticle R to be moved. The lens element 333 is so selected that its influence upon the image-forming characteristics, such as the comatic aberration and the curvature of field, are considerable as compared with another lens element and therefore control can easily be performed. Since the movable lens element 333 is formed into three groups, the movable range can be enlarged by moving the lens elements while restricting the variations of the other aberrations. Further, the drive-device control portion 358 controls the foregoing drive device 346 so that the lens element 344 adjacent to the pupil surface P1 can be moved. The lens element 344 is so selected that the influence upon the spherical aberration is large as compared with other lens elements and therefore control can easily be performed.

The lens elements 337 and 350 are fixed to the lens mount 352. An atmosphere adjustment apparatus 339 adjusts the pressure of air in the lens chamber between the lens element 333 and the lens elements 337, while an atmosphere adjustment apparatus 349 adjusts the pressure of air in the lens chamber between the lens element 344 and the lens elements 350. The structure has been disclosed in U.S. Pat. No. 4,666,273 which varies the pressure in the air portion between the lens elements as described above to change the image forming characteristics of the projection optical system and to correct the aberrations and so forth.

Two cylindrical lenses 340 and 341 are disposed adjacent to the pupil surface P1, the two cylindrical lenses 340 and 341 being rotated relatively by drive portions 342 and 343 or the intervals between the two cylindrical lenses 340 and 341 being varied to control the astigmatism. The cylindrical lenses 340 and 341 are disposed perpendicularly to each other. By relatively rotating the cylindrical lenses 340 and 341, the index of refraction in the directions X and Y is varied. By relatively rotating the foregoing lenses to cause the X and Y components to cancel each other, the astigmatism component generated in the other lens element can be eliminated. The main control system 329 controls the drive device control portions 338 and 348, the drive portions 342 and 343 and the atmosphere adjustment apparatuses 339 and 349.

Figure 37:
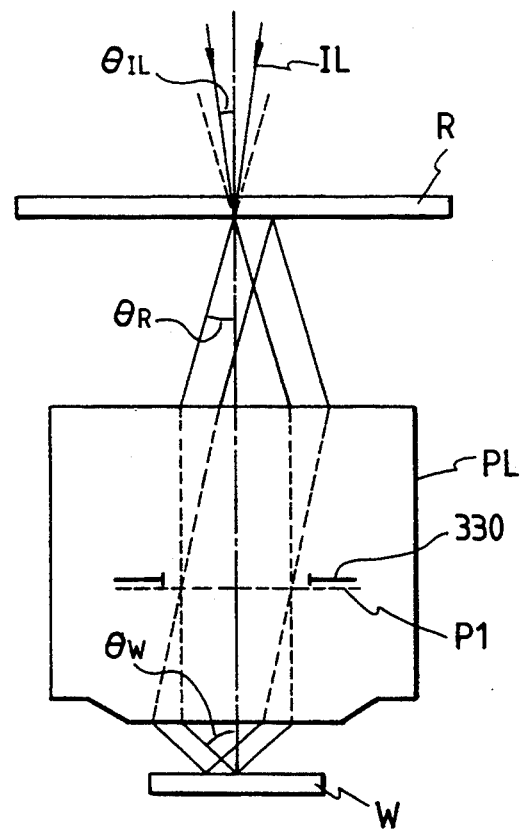
FIG. 37 illustrates a fact that the aberration quantity varies depending upon the illumination conditions.

The variable diaphragm 308 and the variable diaphragm 330, which is disposed in the projection optical system PL, will now be described briefly. As the numerical value showing the characteristics of an illumination system, numerical aperture NA of the projection optical system and $\sigma$-value showing the coherency of illumination light are usually employed. With reference to FIG. 37, the numerical aperture NA and the $\sigma$-value will now be described. Since the pupil surface P1 of the projection optical system PL, that is, the Fourier transformation surface of the mask pattern PA, has the aperture diaphragm 330, maximum angle $\theta_R$ at which the light beams travelling in a direction from the reticle R is able to pass through and maximum angle $\theta_W$ of the light beam which is incident on the wafer W (the pattern 319) from the projection optical system PL are respectively limited to predetermined values. The numerical aperture PL of the projection optical system PL is $\sin \theta_W$, and a relationship $\sin\theta_R = \sin\theta_W/m$ is held when the projection magnification is multiplied by 1/m. Therefore, $\sigma_{IL}$ is expressed as follows:

$$\sigma_{IL} = \sin \theta_{IL}/\sin \theta_R = m \cdot \sin \theta_{IL}/\sin \theta_W$$

Although, the resolution is usually improved in proportion to the numerical aperture NA, the depth of focus is decreased. Since the coherency of the exposure light IL is improved in inverse proportion to the $\sigma$-value, the edges of the pattern is highlighted when the $\sigma$-value is small. If the $\sigma$-value is large, the edges of the pattern is out of focus but finer patterns can be resolved. Therefore, the change of the $\sigma$-value changes the illuminance distribution on the pupil surface P1 of the projection optical system PL.

Figure 38:
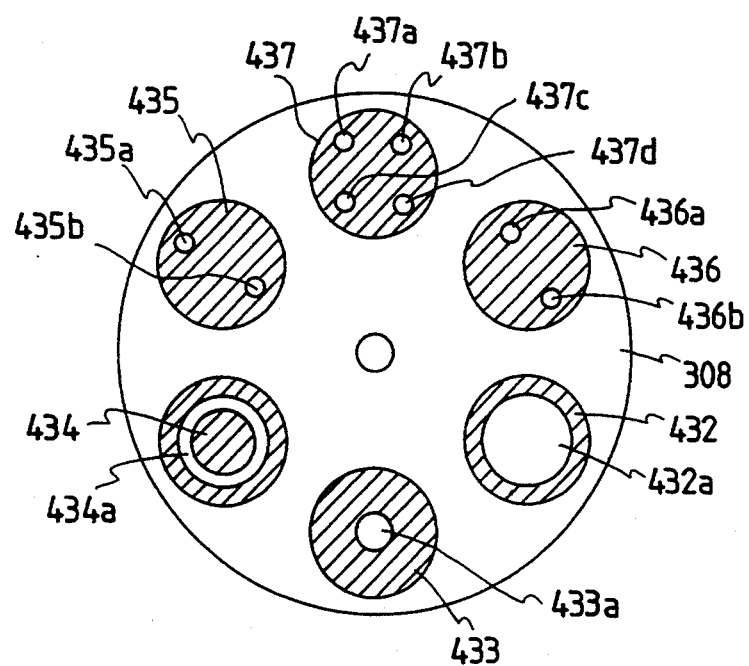
FIG. 38 is a view showing an aperture diaphragm for changing the illumination conditions.

The foregoing fact means that the illuminating conditions changes the temperature distribution in the projection optical system PL, and the aberration generated due to the rise of the temperature varies. Specifically, a rotative plate 308 has, for example, six types of aperture diaphragms 432 to 437 spaced at equal angular intervals as shown in FIG. 38. The circular aperture diaphragms 432 and 433 among the foregoing aperture diaphragms respectively have aperture portions 432a and 433a having different diameters and formed into ordinary circular shapes. The circular aperture diaphragm 434 has an annular aperture portion 434a. Aperture diaphragms 435 and 436 for the plural and inclined illumination respectively have a pair consisting of small aperture portions 435a and 435b and a pair consisting of those 436a and 436b. Aperture diaphragm 437 for the plural and inclined illumination has four small aperture portions 437a to 437d equally spaced with respect to the optical axis.

It is preferable that the diaphragms 435, 436 and 437 of the rotative plate 308 be used in such a manner that σ-value of the illumination light beam from each aperture is about 0.1 to 0.3. Further, it is preferable to arrange the structure in such a manner that the positions of the aperture portions of the diaphragms 435 to 437 can be precisely adjusted in accordance with the degree of precision (the pitch or the like) of the reticle pattern. If the diaphragms 433 to 437 are used, the uniformity of the illuminance on the reticle or the wafer sometimes deteriorates. Therefore, it is preferable to fine (reduce the cross sectional area) each element of the fly eye lens 7. As an alternative to this, a two-stage integrator structure may be employed which is formed by adding another integrator (a fly eye type or rod type integrator).

Since a great optical quantity loss occurs when the diaphragms 435 to 437 are used, it is preferable to employ a structure in which a light separator, such as an optical fiber or a polyhedral prism, is used to introduce the exposing light to each aperture portion on the diaphragm. The aperture diaphragms in the rotative plate 308 are selected, for example, in such a manner that the aperture diaphragms 435, 436 and 437 (the foregoing three aperture diaphragms may be selected in accordance with the periodicity of the reticle pattern) are used when adapted to a fine pattern. If the line width is not strictly desired, the aperture diaphragm 432 is used. The aperture diaphragm 433 is used to be adapted to a phase-shift reticle. The aperture diaphragm 435 can be effectively used when a periodic pattern disposed in, for example, the direction X is formed. The aperture diaphragm 436 can be effectively used to form a periodic pattern disposed in the direction Y, while the aperture diaphragm 437 can be effectively used when a two-dimensional pattern is formed.

The optimum positions of the aperture portions of the aperture diaphragms 435, 436 and 437 have been disclosed in U.S. Ser. No. 791,138. For example, the aperture diaphragm 437 is an effective aperture diaphragm to form a two-dimensional and periodic pattern. As for the aperture diaphragm 437, the position of its aperture portion 437a is determined as follows: while paying attention to one aperture portion 437a, either of ±1-order diffracted light due to the X-directional pattern, either of ±1-order diffracted light due to the Y-directional pattern and 0-order diffracted light are positioned at the same distance from the optical axis on the pupil surface P1 of the projection optical system PL. Also the other aperture portions 437b to 437d are located under similar conditions. As a result, the respective aperture portions 437a to 437d are positioned at the same distance from the optical axis.

When the aberration is obtained from the waveform of a signal supplied from the photoelectric conversion device 326, the light quantity distribution of the illumination light IL emitted by the illumination optical system 310 and that of the illumination light IL' which has passed through the pattern plate 319 must be made the same when the two light beams pass through the projection optical system PL. In order to achieve this, the illuminance distribution on the pupil surface P1 of the projection optical system PL due to the illumination light supplied through the fiber 25 must be made the same as the illuminance distribution on the pupil surface P1 of the projection optical system PL due to the illumination light emitted from the fly eye lens 307. Accordingly, a rotative plate 321 is disposed adjacent to a joint end 320b of the fiber bundle; and the aperture diaphragm to be formed in the rotative plate 321 is formed into six types of aperture diaphragms similar to the aperture diaphragms 432 to 437 shown in FIG. 38 to select the aperture diaphragm in the rotative plate 321 to be adaptable to the aperture diaphragm in the rotative plate 308.

A method of obtaining the aberration from the waveform of a signal supplied from the photoelectric conversion device 326 will now be described. The principle capable of obtaining each aberration from the waveform of the signal supplied from the photoelectric conversion device is as follows:

If the NA of an illumination light source is made small (in a case of a partial coherent) in order to improve the resolution of the line width of a specific pattern, the light beams are deviated (gathered) to the central portion of the lens of the projection optical system. Although diffracted light reaches the periphery of the lens if a mask pattern is present, the intensity of diffracted light except the 0-order light is weaker than that of the 0-order diffracted light. Therefore, the trend that the light beams deviates to the central portion of the lens is maintained.

Figure 39A:
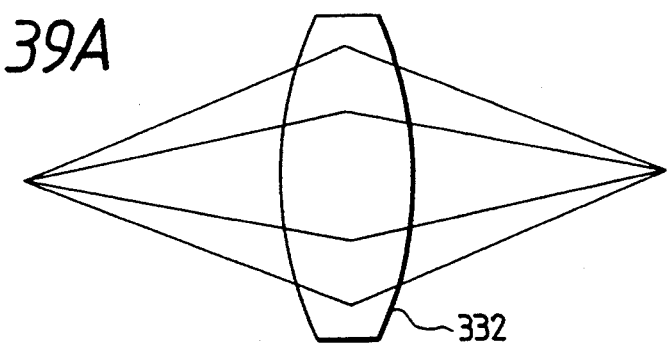
FIG. 39A and FIG. 39B illustrate a state where a spherical aberration is generated.
Figure 39B:
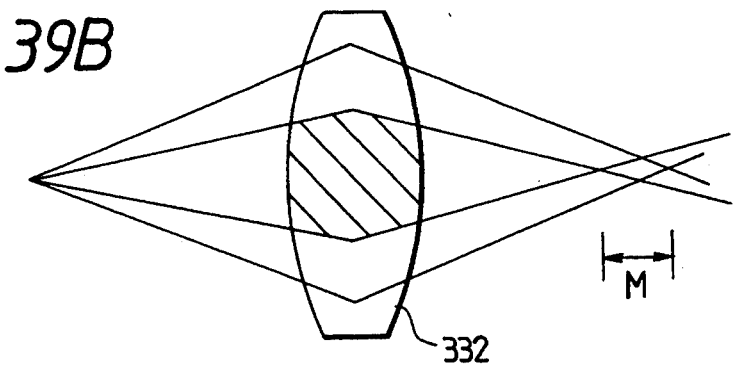

If a slight heat absorption occurs in the lens forming the projection optical system, heat generation takes place in accordance with the quantity of light transmitting through the lens when the projection optical system is irradiated with light. If the lens is heated, expansion and the index of refraction usually rises (however, it can be lowered due to the heat generation). That is, the heat generation causes a convex lens having positive power (refractive power) to have power stronger in the central portion thereof than that in the periphery due to effects of the deformation of the central portion of the lens and the distribution diffraction index lens. FIGS. 39A and 39B show the foregoing state, in which FIG. 39A shows a state where no spherical aberration is present and FIG. 39B shows a state in which the spherical aberration is corrected excessively (a state where the spherical aberration is generated). In the case where the spherical aberration has been corrected in the initial stage as shown in FIG. 39A, power at the central portion of the lens 332 is strengthened as designated by diagonal lines shown in FIG. 39B after the light has been applied, resulting in a state to be realized that the spherical aberration has been corrected excessively by degree M. Therefore, the focal-point position is displaced (a state of out of focus).

Figure 40A:
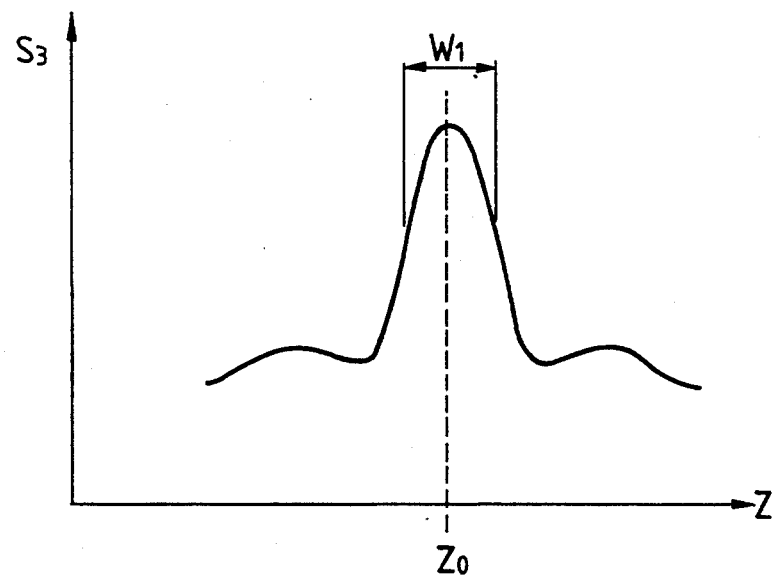
FIG. 40A is a graph showing the waveform of a signal supplied from the photoelectric conversion device 326 in a state where no aberration is generated.
Figure 40B:
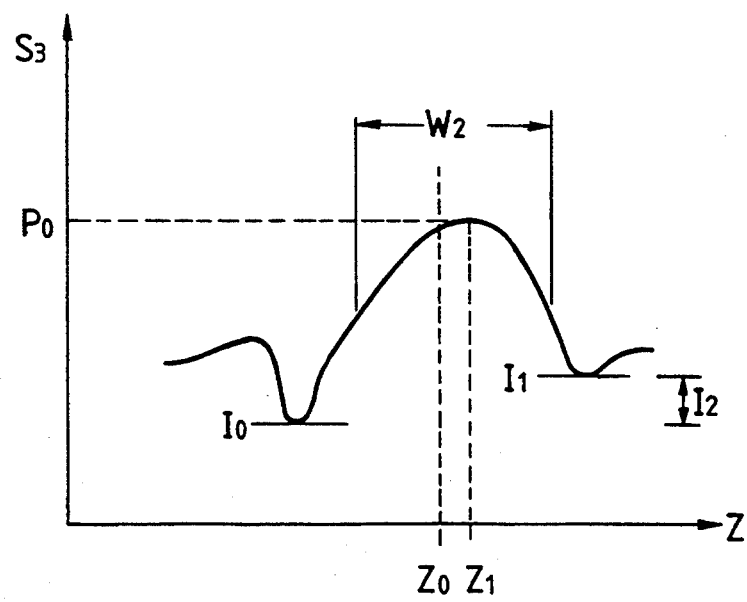
FIG. 40B is a graph showing the waveform of a signal supplied from the photoelectric conversion device 326 in a state where a spherical aberration is generated.

FIGS. 40A and 40B are graphs showing the output signal S3 emitted from the photoelectric detector 326, the axis of ordinate of which stands for the intensity of the signal S3, and the axis of abscissa of which stands for the Z-directional position of the pattern plate 319 similarly to FIG. 35. FIG. 40A shows the output signal S3 supplied when no spherical aberration is present, while FIG. 40B shows the output signal S3 supplied when the spherical aberration has been generated. If a signal detection is performed in the foregoing state by a focus detection apparatus, a signal widening in the direction of the optical axis is obtained as shown in FIG. 40B. In a state where no spherical aberration is present, the diameter of the light beam has a diameter symmetric with respect to the optical axis. The half width of the signal waveform shown in FIG. 40A is $W_1$, and the center of the half width $W_1$ coincides with the Z-position $Z_0$ at the peak value. That is, the signal waveform shown in FIG. 40A is symmetrical with respect to the peak value.

In a state shown in FIG. 40B, the diameter of the light beam in front of and in the rear of a standard, which is the position ($Z_1$ shown in FIG. 40B) of a minimum blur circle, is asymmetrical along the optical axis due to the excessive correction of the spherical aberration. Therefore, the distribution of the light quantity of the signal is made asymmetrical with respect to $Z_1$ as shown in FIG. 40B. The foregoing process results in that the lens is, due to light application, deformed asymmetrically, the distribution of the index of diffraction is realized asymmetrically, and the focus detection signal is deformed. Although the "lens" includes a concave lens, the explanation made above is employed qualitatively because the overall shape is formed into a convex lens. Since the half width $W_2$ of a signal larger than the half width $W_1$ in accordance with the quantity of the generated (due to the excessive correction) spherical aberration, the quantity of the spherical aberration can be measured by measuring the half width $W_2$. Since the asymmetry of the signal also increases in accordance with the quantity of the spherical aberration, the quantity of the spherical aberration can be measured from the asymmetry of the signal. Specifically, by measuring output difference $I_2$ between bottom value $I_0$ at the left of the signal waveform and bottom value $I_1$ at the right while interposing peak value $P_0$ of the signal waveform is measured, the spherical aberration can be measured. In addition to the bottom values $I_0$ and $I_1$, a plurality of bottom values appear as high-order components at the right and the left while interposing the peak value $P_0$. By subjecting the right and left bottom values of a plurality of pairs to comparisons, the quantity of the spherical aberration can precisely be measured. It should be noted that the relationship between the change of the half width W of the signal and the quantity of the generated spherical aberration or the relationship between the difference in the bottom value and the quantity of the generated spherical aberration has been previously obtained by experimental printing. The foregoing relationship must be, by input means 353, supplied to the main control system 329 and stored in a memory in the main control system 329. The curvature of field can also be obtained by measuring the focus position in the field by using a multi-directional aperture pattern 319a.

The description has been made about the case where the light beam is, symmetrically with respect to the axis, incident on the projection lens. However, if the mask has a one-directional pattern, the diffracted light is generated asymmetrically in place of the symmetric generation with respect to the axis. Therefore, a case can be expected in which the deformation of the lens occurring due to the irradiation takes place asymmetrically with respect to the axis. That is, the irradiation causes an astigmatism (an astigmatic difference) to be generated. In the foregoing case, the patterns 319a of the projection pattern plate 319 are aligned in the same direction and focus position of the foregoing direction is measured in at least two different directions (a radial direction while making the optical axis of the projection optical system and a direction perpendicular to the radial direction). If the astigmatic difference is present, the values of the peak value $Z_0$ shown in FIGS. 40A and 40B are different depending upon the direction. By measuring the foregoing difference, the astigmatic difference can be measured.

Figure 41:
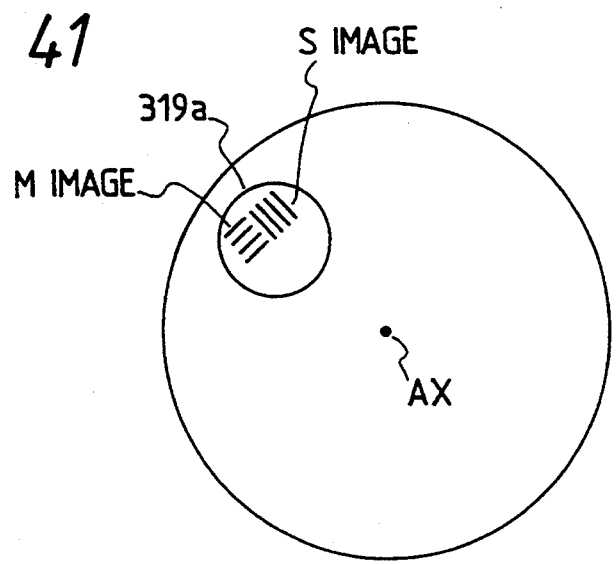
FIG. 41 shows an aperture pattern for use to measure a comatic aberration.
Figure 42A:
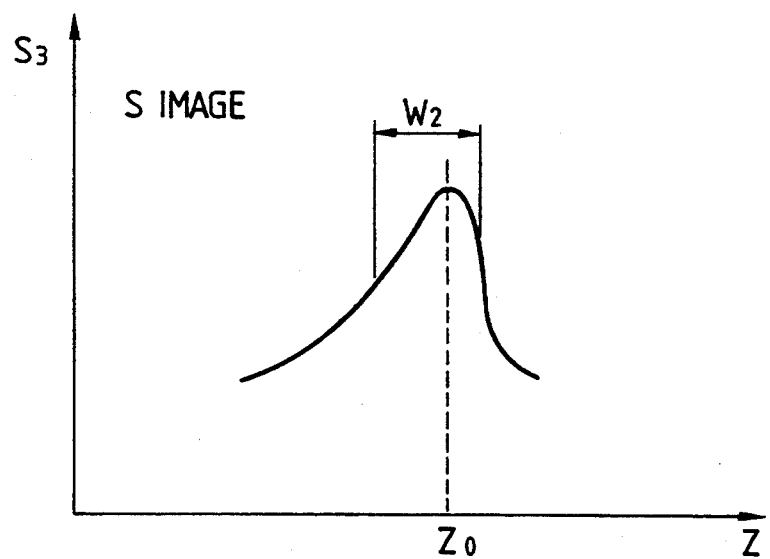
FIG. 42A is a graph showing the waveform of a signal supplied from the photoelectric conversion device 326 in a state where a comatic aberration is generated.
Figure 42B:
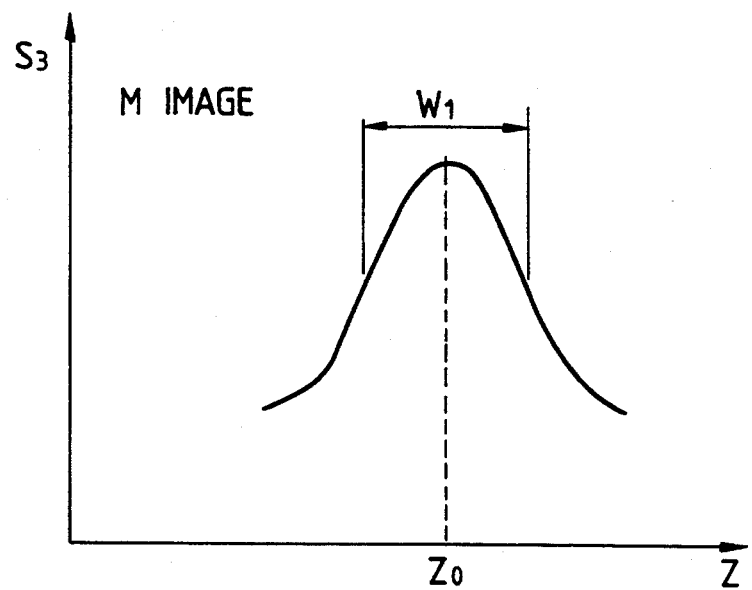
FIG. 42B is a graph showing the waveform of a signal supplied from the photoelectric conversion device 326 in a state where no comatic aberration is generated.

Although the description has been made about the spherical aberration, the curvature of field and the astigmatism, the other aberrations, such as the comatic aberration, can be detected by an aberration detection system. That is, it is necessary to detect a fact that the comatic aberration causes the optical-directional focus position and the detection signal to be widened. Specifically, the aperture pattern 319a is, as shown in FIG. 41, formed into a pattern having two directions consisting of a radial pattern (S image) extending from the optical axis AX of the projection optical axis PL and a pattern (M image) perpendicular to the radial pattern. By subjecting the asymmetrical components of the signals obtained from the two patterns to a comparison, the comatic aberration can be measured. FIGS. 42A and 42B show the waveforms of a signal obtainable from the pattern shown in FIG. 41, in which FIG. 42A shows a signal obtainable from the pattern (S image) formed in the radial direction, and FIG. 42B shows a signal obtainable from a pattern (M image) formed in a direction perpendicular to the radial direction. FIG. 42 shows a case where the radial directional component (S image) is made asymmetrical due to the comatic aberration. The aberration detection system 328 subjects the asymmetrical components of the two signals to a comparison to measure the quantity of the comatic aberration. The asymmetry may be detected by making use of the half value W to subject the half widths $W_1$ and $W_2$ of the two signals to a comparison or to subject the two bottom values while interposing the peak value to a comparison similarly to the detection of the spherical aberration described with reference to FIGS. 40A and 40B. The relationship between the difference in the asymmetrical component and the quantity of the comatic aberration has been previously obtained by performing experimental printing. The foregoing relationship is supplied to the main control system 329 by the input means 353 and stored in the memory in the main control system 329.

The two-directional measurement of the pattern 319a to measure the spherical aberration or the comatic aberration may be performed by using a plurality of focus measurement systems arranged as shown in FIG. 32 or by employing a method in which different directional marks are formed on the pattern 319a to be selected by switching by means of a diaphragm.

A method of measuring the image forming characteristics, such as the spherical aberration and the comatic aberration, of the projection optical system PL will now be described. In order to bring the center of the aperture 319a on the standard member 319 onto the optical axis AX of the projection optical system, the wafer stage 100 is moved by the motor 327. Simultaneously, the motor 327 is rotated to lower or to raise the wafer stage 100 from a position which is considered to be the designed best focusing position (best image forming plane) of the projection optical system PL by a degree which is several times the estimated quantity (the quantity of the change of the image forming characteristics) of the change of the focal point. The wafer stage 100 may be lowered or raised by about two times (2·DOF) of the focal point depth (±DOF). Simultaneously, the reverse side (pattern formation side) of the reticle R is irradiated with light via the aperture of the pattern plate 319 and the projection optical system PL.

The irradiation light reflected from the reticle R again passes through the projection optical system PL and the aperture formed in the pattern plate 319. Then, the irradiation light passes through the lens 325, the mirror 324, the lens 323 and the optical fiber 25, and then it is incident on the photoelectric converter 326. Then, the wafer stage 100 is, in the foregoing state, upwardly (or downwards) scanned by about two times the estimate quantity of the change of the focal point. At this time, the aberration detection portion 328 simultaneously samples the output from the photoelectric converter 326 and that from the light receiving optical system 118 of the focusing system for each unit movement quantity (for example, 0.02 μm) of the wafer stage 100 to A/D convert the result of sampling. As a result, the relationship shown in FIG. 35 is obtained. Then, the aberration is, as described above, measured from the symmetrically and the like in accordance with the waveform of the signal supplied from the photoelectric conversion device 326.

A method of correcting the aberration of the projection optical system PL according to this embodiment will now be described.

In the case where the quantity of the aberration is detected as described above, the aberration can be corrected by, for example, adjusting the projection lens.

Correction of Spherical Aberration

A method of correcting the spherical aberration will now be described. The correction of the spherical aberration is performed by changing the interval between the lens elements 344 and 350 (FIG. 36) adjacent to the pupil PL of the projection optical system PL. The aberration correction may be performed by changing the pressure of air in the lens chamber between the lens elements 344 and 350 by making use of the atmosphere adjustment apparatus 349.

Correction of Comatic Aberration and Curvature of Field

The comatic aberration and the curvature of field are corrected by changing the interval between the lenses positioned away from the pupil P2. In this embodiment, the lens element 333 is moved and inclined to correct the aberration. The correction of the comatic aberration may be performed by changing the pressure of air in the lens chamber between the lens elements 333 and 337 by making use of the atmosphere adjustment apparatus 339.

Correction of Astigmatism

The astigmatism is corrected by relatively rotating the two cylindrical lenses 340 and 341 disposed in the lens. It may be performed by changing the interval between the two cylindrical lenses.

The foregoing corrections of the aberrations are performed by selecting a lens element which does not considerably affect the other aberrations. Further, the measurement of the aberrations must be performed in synchronization with the change of the illumination conditions.

If a plurality of the projection lens are used or the projection lens is made achromatic by a certain wavelength band, a plurality of wavelengths are enabled to be irradiated from the focusing system (the irradiation optical system 117) shown in FIG. 32, measurements using the plural wavelengths are independently performed and the foregoing aberrations can be measured in response to the signal supplied from the photoelectric conversion device 326. In this case, a band pass filter is inserted into the light source portion to be exchanged to make the plural wavelengths to be transmitted.

Although it can be expected that the drive of the lens elements 333 and 344 causes the image surface to be vertically moved, the output value from the light receiving optical system 118 of the focusing system is made offset in accordance with the quantity of the change to set always the wafer to the best image surface.

Then, an exposing sequence for interrupting the exposure in accordance with the result obtained from the aberration detection system 328 will now be described.

If the half width $w_2$ of the signal supplied from the photoelectric conversion device 326 is made larger than a certain width, the image formation state deteriorates. It might therefore be feasible to employ a structure in which the upper limit of $w_2$ is previously determined to interrupt the exposure operation if the width $w_2$ is larger than the upper limit.

As described above, the absorption of the irradiation light of the projection optical system PL deteriorates the aberration conditions. Accordingly, the aberration is checked by the aberration measurement means during the exposing operation, for example, at the time of changing the wafer to discriminate whether or not the measured value is larger than an allowable value which has been previously obtained from an experiment or a simulation. It is, of course, preferable that the calibration of the focal point position is performed simultaneously. If the measured value is larger than the allowable value, the aberration detection system 328 issues an alarm toward the main control system 329, and the main control system 329 stops the exposing operation. The aberration is periodically (for example, every 30 sec.) measured in the foregoing state to discriminate whether or not the measured value is larger than the allowable value. The interruption of the exposing operation causes the heating value accumulated in the projection optical system PL to be discharged to outside. The aberration detection system 328 transmits the exposure permission signal to the main control system in the sequential order of lowering to a value smaller than the allowable value. Thus, the main controller again commences the exposing operation. Since the foregoing allowable value varies depending upon the line width of the reticle pattern to be exposed and upon the type of the pattern, it might be feasible to employ a structure in which the conditions are previously supplied to the main control system by the input means 353 to make the allowable condition to be variable. The intervals for measuring the aberration is not limited to constant intervals. The measuring interval is lengthened immediately after the illumination light IL has been applied, and the measuring interval is shortened in inverse proportion to the time in which the irradiation is performed. The pattern plate 319 may be made interchangeable to make coincide with the actual exposing pattern.

A method of correcting the calibration of the focal-point position which can be obtained by the aberration detection system will now be described.

As described above, the focal point position can be measured by making use of the standard pattern plate 319. Although the pattern of the pattern plate 319 is usually made coincide with the line width to be actually exposed, the coincidence is not always made because the patterns to be exposed varies considerably. If a spherical aberration is generated due to the absorption of the irradiation light in the fogoing case, there arises a problem in that the focal point position varies depending upon the line width and the focal point position of the actual exposure pattern does not coincide with the result of the measurement of the focal point position. However, if the exposure line width and the quantity of the spherical aberration are known, the correction can be performed. As for the line width, a method in which input is made by using a keyboard or a method in which a reticle bar code or the like is used to write and read may be employed. As for the spherical aberration and the quantity of the deviation of the focal point position, the quantities may be previously measured or the relationship may be obtained from the result of a simulation to store the relationship in the form of a table or an expression. Another method may be employed in which an allowable value, with which the influence of the quantity of the spherical aberration upon the detection of the focal point can be sufficiently ignored, is determined, the measurement of the focal point position is not performed if the value is larger than the allowable value in such a manner that, for example, the exposing operation is interrupted to wait for the fact that the projection optical system is sufficiently cooled.

Since the aberration of the projection optical system PL can be actually measured in accordance with the waveform of the signal supplied from the photoelectric conversion device 326 as described above, a labor of exposing the pattern by making use of a special mask can be omitted. Therefore, the quantity of the aberration can easily be detected at the time of actually using the apparatus. In accordance with the measured aberration, interruption of the exposing operation at the time of the generation of the aberration, the correction of the error occurring in the focal point detection system due to the quantity of the aberration and the real time correction of the aberration can be performed.

Although the foregoing embodiment comprises the mechanisms 339 and 349 for changing the pressure of the air chamber among the lens elements and the mechanisms 338, 348, 342 and 343 for changing the interval among the lens elements as described with reference to FIG. 36, all aberration correction mechanisms do not need to be used. For example, either the mechanisms 339 and 349 for changing the pressure or the mechanisms 338, 348, 342 and 343 for changing the interval among the elements may be provided. In order to correct a specific aberration, only a portion of the foregoing mechanisms may be effectively employed.

Further, the signal processing method for receiving the focal point detection signal on the basis of the time according to the third embodiment may be adapted to the signal processing method according to the fourth embodiment in which the signal S3 shown in FIG. 40 is received.

Note that the present invention is not limited to the above embodiments, and various arrangements may be adopted without departing from the scope of the invention.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A projection exposing apparatus for projecting and exposing a pattern formed on a pattern surface of a mask to the surface of photosensitive substrate through a projection optical system, said projection exposing apparatus comprising:

first illumination means for irradiating said mask with exposing light;

stage means for holding said photosensitive substrate and capable of moving said photosensitive substrate in a direction of the optical axis of said projection optical system and in a direction perpendicular to said direction of said optical axis of said projection optical axis;

a reference member disposed on said stage means and adapted to be arranged on the basis of a position conjugate to the surface of said mask pattern with respect to said projection optical system;

two or more light transmissible patterns formed on the surface of said reference member;

second illumination means for irradiating said light transmissible pattern from said stage means side with said exposing light or light having a wavelength substantially same as that of said exposing light and causing light transmitted through a plurality of said light transmissible patterns to be incident on said mask through said projection optical system;

photoelectric detection means for receiving light emitted from said second illumination means, reflected by said mask, and again transmitted through said two or more light transmissible patterns through said projection optical system so as to transmit a photoelectric signal which corresponds to each quantity of received light;

focus state detection means for detecting a focus state at each position of said two or more light transmissible pattern in response to said photoelectric signal transmitted from said photoelectric detection means when said stage means is moved in said direction of said optical axis of said projection optical system; and image forming characteristic measuring means for measuring image forming characteristics of said projection optical system in accordance with each result of the detections of the focus state detected by said focus state detection means.

2. A projection exposing apparatus according to claim 1 further comprising image forming characteristic correction means for correcting the image forming characteristics of said projection optical system in accordance with the measured value obtained by said image forming characteristic measuring means by driving at least any one of a portion of optical elements of said projection optical system and said mask and said stage means or by changing the pressure of sealed space defined by said optical elements of said projection optical system.

3. A projection exposing apparatus according to claim 2, wherein said stage means has an inclination mechanism for inclining said substrate with respect to a place perpendicular to said optical axis of said projection optical system and a stage body portion capable of moving in said direction of said optical axis and said direction perpendicular to said optical axis and said stage means is so driven that at least either of said inclination mechanism or said stage body is driven.

4. A projection exposing apparatus according to claim 1, wherein said image forming characteristic measuring means measures an inclination of an image surface in accordance with the results of the detections of said focus state at said three or more positions in said exposure region of said projection optical system.

5. A projection exposing apparatus according to claim 1, wherein said image forming characteristic measuring means measures the curvature of filed from the results of measurements of said focus state at a central position and three or more pheripheral positions of said exposure region of said projection optical system.

6. A projection exposing apparatus according to claim 1, wherein said light transmissible pattern has a plurality of parallel light-shielding patterns and a plurality of parallel light-transmissible patterns.

7. A projection exposing apparatus according to claim 1, wherein said light transmissible pattern is a checker pattern composed of light transmissible pattern and a light shielding pattern.

8. A projection exposing apparatus according to claim 1, wherein said photoelectric detection means individually processes reflected light passing through said two or more light transmissive patterns in terms of time.

9. A projection exposing apparatus according to claim 8, wherein said photoelectric means has a drive-type stop for individually passing said reflected light to said light transmissible patterns in terms of time.

10. A projection exposing apparatus according to claim 1, wherein said light transmissible pattern is a phase shift type pattern.

11. A projection exposing apparatus according to claim 1 further comprising:
   estimation means for estimating time sequential change in said image forming characteristics; and
   control means for controlling periodical measuring timing of said image forming characteristics in accordance with an estimated value obtained by said es timation means.

12. A projection exposing apparatus for projecting and exposing a pattern formed on a pattern surface of a mask to the surface of a photosensitive substrate through a projection optical system, said projection exposing apparatus comprising:
   first illumination means for irradiating said mask with exposing light;
   stage means for holding said photosensitive substrate and capable of moving said photosensitive substrate in a direction of the optical axis of said projection optical system and in a direction perpendicular to said direction of said optical axis of said projection optical system;
   a reference member disposed on said stage means and adapted to be arranged on the basis of a position conjugate to the surface of said mask pattern with respect to said projection optical system;
   a light transmissible pattern formed on the surface of said reference member and having a first lattice pattern having a periodicity in a sagittal direction and a second lattice pattern having a periodicity in a meridional direction in an exposure region of said projection optical system;
   second illumination means for irradiating said light transmissible pattern from said stage means side and causing light transmitted through said light transmissible pattern to be incident on said mask through said projection optical system;
   photoelectric detection means for receiving light emitted from said second illumination means and reflected by said mask through said projection optical system and said light transmissible pattern;

focus state detection means for detecting a focus state in response to a photoelectric signal transmitted from said photoelectric detection means when said stage means is moved in said direction of said optical axis of said projection optical system; and
   image forming characteristic measuring means for detecting said focus state by said focus state detection means in accordance with illumination light which passes through said first lattice pattern and detects said focus state by said focus state detection means in accordance with illumination light which passes through said second lattice pattern so as to measure image forming characteristics of said projection optical system in accordance with results of detections of said two focus states.

13. A projection exposing apparatus according to claim 12, wherein said image forming characteristic measuring means detects said focus state by said focus state detection means at four or more peripheral positions of said exposure region of said projection optical system for each of transmitted light beams of said first and said second patterns so as to measure an astigmatism from eight results of the detection of the focus state obtained at said four or more positions.

14. A projection exposing apparatus according to claim 12, wherein said image forming characteristic measuring means measures the eccentricity of said projection optical system from the relationship between the quantity of deviation of a predetermined measured focus state and an eccentricity for a first and a second patterns.

15. A projection exposing apparatus according to claim 14, wherein said eccentricity is removed by driving a portion of optical elements of said projection optical system in accordance with the quantity of said eccentricity measured by said image forming characteristic measuring means.

16. A projection exposing apparatus according to claim 12, wherein said image forming characteristics measuring means measures spherical aberration of said projection optical system from a relationship between a previously measured quantity of deviation of said focus state and spherical aberration for said first and second patterns.

17. A projection exposing apparatus for projecting and exposing a pattern formed on a pattern surface of a mask to the surface of a photosensitive substrate through a projection optical system, said projection exposing apparatus comprising:
   first illumination means for irradiating said mask with exposing light;
   stage means for holding said photosensitive substrate and capable of moving said photosensitive substrate in a direction of the optical axis of said projection optical system and in a direction perpendicular to said direction of said optical axis;
   a reference member disposed on said stage means and adapted to be arranged on the basis of a position conjugate to the surface of said mask pattern with respect to said projection optical system;
   a light transmissible pattern formed on the surface of said reference member;
   second illumination means for irradiating said light transmissible pattern from said stage means side and causing light transmitted through said light transmissible pattern to be incident on said mask through said projection optical system;

photoelectric detection means for receiving light emitted from said second illumination means and reflected by said mask through said projection optical system and said light transmissible pattern;

focus state detection means for detecting a focus state in response to a photoelectric signal transmitted from said photoelectric detection means when said stage means is moved in said direction of said optical axis of said projection optical system; and image forming characteristic measuring means for detecting said focus state by said focus state detection means at two or more positions in an exposure region of said projection optical system so as to measure the curvature of field of said projection optical system in accordance with the results of the detections of the focus state at said two or more positions.

18. A projection exposing apparatus for projecting and exposing a pattern formed on a mask to the surface of a photosensitive substrate with exposing light through a projection optical system, said projection exposing apparatus comprising:

stage means for holding said photosensitive substrate and capable of moving said photosensitive substrate in a direction of the optical axis of said projection optical system and in a direction perpendicular to said direction of said optical axis;

a reference member disposed on said stage means and adapted on the basis of a position conjugate to the surface of said mask pattern with respect to said projection optical system;

a light transmissible pattern formed on the surface of said reference member;

illumination means for irradiating said light transmissible pattern from said stage means side and causing light transmitted through said light transmissible pattern to be incident on said mask through said projection optical system;

photoelectric detection means for receiving light emitted from said illumination means and reflected by said mask through said projection optical system and said light transmissible pattern;

focus state detection means for detecting a focus state in response to a first detection signal transmitted from said photoelectric detection means when said stage means is moved in said direction of said optical axis of said projection optical system;

focal point detection means for detecting a focal point in response to a second detection signal for changing in according to a position of said photosensitive substrate in said direction of said optical axis of said projection optical system;

focusing means for positioning said stage means in said direction of said optical axis of said projection optical system so that said second detection signal has a predetermined false in-focus level; and calibration means for adjusting an offset of said second detection signal or the false in-focus level on the basis of said first detection signal obtained when said stage means is moved in said direction of said optical axis of said projection optical system.

19. An apparatus according to claim 18, wherein said calibration means stores said first and second detection signals in storage means in synchronism with sampling pulses generated at predetermined time intervals when said stage means is moving in said direction of said optical axis of said projection optical system.

20. An apparatus according to claim 18, wherein said calibration means stores said first and second detection signals in storage means in synchronism with sampling pulses formed every time a moving amount of said stage means reaches a predetermined interval when said stage means is moving in said direction of said optical axis of said projection optical system.

21. An apparatus according to claim 18, wherein said calibration means fetches said first detection signal a plurality of number of times by moving said stage means in said direction of said optical axis of said projection optical system by displacing said stage means by a small amount in a plane perpendicular to said optical axis of said projection optical system, and adjusts the offset of said second detection signal on the basis of a signal obtained by averaging the plurality of said first detection signals.

22. An apparatus according to claim 18, further comprising:

environmental state measurement means for measuring at least one of an atmospheric pressure, a temperature, or a humidity around said projection optical system; and control means for, when an environmental state measured by said environmental state measurement means causes a predetermined change, operating said calibration means to re-adjust the offset of said second detection signal or the false in-focus level.

23. An apparatus according to claim 18, wherein said calibration means includes:

first calibration means for determining a position where a maximum or minimum value of said first detection signal is obtained as a focal point; and second calibration means for slicing said first detection signal at a predetermined level, and determining a central position between positions where two level of said first detection signal obtained by slicing are obtained as a focal point, and said apparatus further comprises:

selection means for selecting one of said first and second calibration means according to an exposure condition of said photosensitive substrate.

24. An apparatus according to claim 19, wherein said calibration means includes:

first calibration means for determining a position where a maximum or minimum value of said first detection signal is obtained as a focal point; and second calibration means for slicing said first detection signal at a predetermined level, and determining a central position between positions where two levels of said first detection signal obtained by slicing are obtained as a focal point, and said apparatus further comprises:

selection means for selecting one of said first and second calibration means according to an exposure condition of said photosensitive substrate.

25. An apparatus according to claim 20, wherein said calibration means includes:

first calibration means for determining a position where a maximum or minimum value of said first detection signal is obtained as a focal point; and second calibration means for slicing said first detection signal at a predetermined level, and determining a central position between positions where two levels of said first detection signal obtained by slicing are obtained as a focal point, and said apparatus further comprises:

selection means for selecting one of said first and second calibration means according to an exposure condition of said photosensitive substrate.

26. A projection exposing apparatus for projecting and exposing a pattern formed on a mask to the surface of a photosensitive substrate with exposing light through a projection optical system, said projection exposing apparatus comprising: stage means for holding said photosensitive substrate and capable of moving said photosensitive substrate in a direction of the optical axis of said projection optical system and in a direction perpendicular to said direction of said optical axis; a reference member disposed on said stage means and adapted on the basis of a position conjugate to the surface of said mask pattern with respect to said projection optical system;

a light transmissible pattern formed on the surface of said reference member;

illumination means for irradiating said light transmissible pattern from said stage means side and causing light transmitted through said light transmissible pattern to be incident on said mask through said projection optical system;

photoelectric detection means for receiving light emitted from said illumination means and reflected by said mask through said projection optical system and said light transmissible pattern, and outputting photoelectric signal according to the position of said stage in said direction of said optical axis; and aberration quantity detection means for obtaining the aberration quantity of said projection optical system in accordance with information about the waveform of said photoelectric signal.

27. A projection exposing apparatus according to claim 26 further comprising aberration correction means for correcting the aberration of said projection optical system in accordance with information obtained from said aberration quantity detection means.

28. A projection exposing apparatus according to claim 26 further comprising exposing operation control means for interrupting the exposing operation in accordance with information obtained from said aberration quantity detection means.

29. A projection exposing apparatus according to claim 26 further comprising stage position correction means for correcting the position of said photosensitive substrate in the direction of said optical axis in accordance with information obtained from said aberration quantity detection means.

30. A projection exposing apparatus according to claim 26, wherein said illumination means has illumination condition changing means for making substantially coincide the illumination condition thereof with the illumination condition when said pattern formed on said mask is exposed on to said photosensitive substrate.

31. A projection exposing apparatus according to claim 26, wherein said aberration quantity is at least any one of spherical aberration, a curvature field and astigmatism.

32. A projection exposing apparatus according to claim 27, wherein said aberration correction means is means for driving a portion of lens elements of said projection optical system.

* * * * *